United States Patent
Peng et al.

(10) Patent No.: US 12,094,777 B2
(45) Date of Patent: Sep. 17, 2024

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventors: Shih-Wei Peng, Hsinchu (TW); Wei-Cheng Lin, Taichung (TW); Jiann-Tyng Tzeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/730,801

(22) Filed: Apr. 27, 2022

(65) Prior Publication Data
US 2022/0254688 A1   Aug. 11, 2022

Related U.S. Application Data

(62) Division of application No. 16/800,834, filed on Feb. 25, 2020, now Pat. No. 11,328,957.

(51) Int. Cl.
*H01L 21/8234* (2006.01)
*H01L 29/10* (2006.01)
*H01L 29/66* (2006.01)
*H01L 29/78* (2006.01)

(52) U.S. Cl.
CPC .. *H01L 21/823412* (2013.01); *H01L 29/1079* (2013.01); *H01L 29/66537* (2013.01); *H01L 29/7836* (2013.01)

(58) Field of Classification Search
None
See application file for complete search history.

(56) References Cited

U.S. PATENT DOCUMENTS

| | | | |
|---|---|---|---|
| 9,876,015 B1 | 1/2018 | Balakrishnan et al. | |
| 2002/0020878 A1 | 2/2002 | Kawanaka | |
| 2007/0105334 A1* | 5/2007 | Jang | H01L 27/105 257/E21.628 |
| 2008/0265330 A1 | 10/2008 | Gerhardt | |
| 2009/0283834 A1 | 11/2009 | Nokuma | |
| 2010/0193871 A1 | 8/2010 | Park | |
| 2016/0013141 A1 | 1/2016 | Chen | |
| 2016/0293608 A1* | 10/2016 | Yoon | H10B 10/12 |
| 2016/0351566 A1* | 12/2016 | Niimi | H01L 21/823418 |

(Continued)

FOREIGN PATENT DOCUMENTS

| CN | 105097470 A | 11/2015 |
|---|---|---|
| CN | 106887463 A | 6/2017 |

(Continued)

*Primary Examiner* — Khaja Ahmad
(74) *Attorney, Agent, or Firm* — Maschoff Brennan

(57) ABSTRACT

A method includes forming a first transistor and a second transistor over a substrate, wherein the first transistor comprises a first source/drain, a second source/drain, and a first gate between the first and second source/drains, and the second transistor comprises a third source/drain, a fourth source/drain, and a second gate between the third and fourth source/drains; forming an isolation layer to cover the second source/drain of the first transistor; and forming a first source/drain contact on and in contact the fourth source/drain of the second transistor and the isolation layer.

20 Claims, 56 Drawing Sheets

(56) References Cited

U.S. PATENT DOCUMENTS

| | | | |
|---|---|---|---|
| 2017/0358497 A1* | 12/2017 | Cheng | H01L 29/0649 |
| 2018/0151560 A1 | 5/2018 | Hsu et al. | |
| 2018/0151567 A1 | 5/2018 | Lin | |
| 2018/0248039 A1* | 8/2018 | Hafez | H01L 29/7835 |
| 2019/0067417 A1 | 2/2019 | Ching et al. | |
| 2019/0164971 A1 | 5/2019 | Liaw | |
| 2020/0052108 A1 | 2/2020 | Kim et al. | |
| 2020/0134124 A1 | 4/2020 | Sue et al. | |

FOREIGN PATENT DOCUMENTS

| | | | |
|---|---|---|---|
| CN | 108122979 A | 6/2018 | |
| CN | 108183107 A | 6/2018 | |
| CN | 108932965 A | 12/2018 | |
| CN | 110556374 A | 12/2019 | |
| TW | 201830578 A | 8/2018 | |
| TW | 201913819 A | 4/2019 | |
| TW | 201926700 A | 7/2019 | |

* cited by examiner

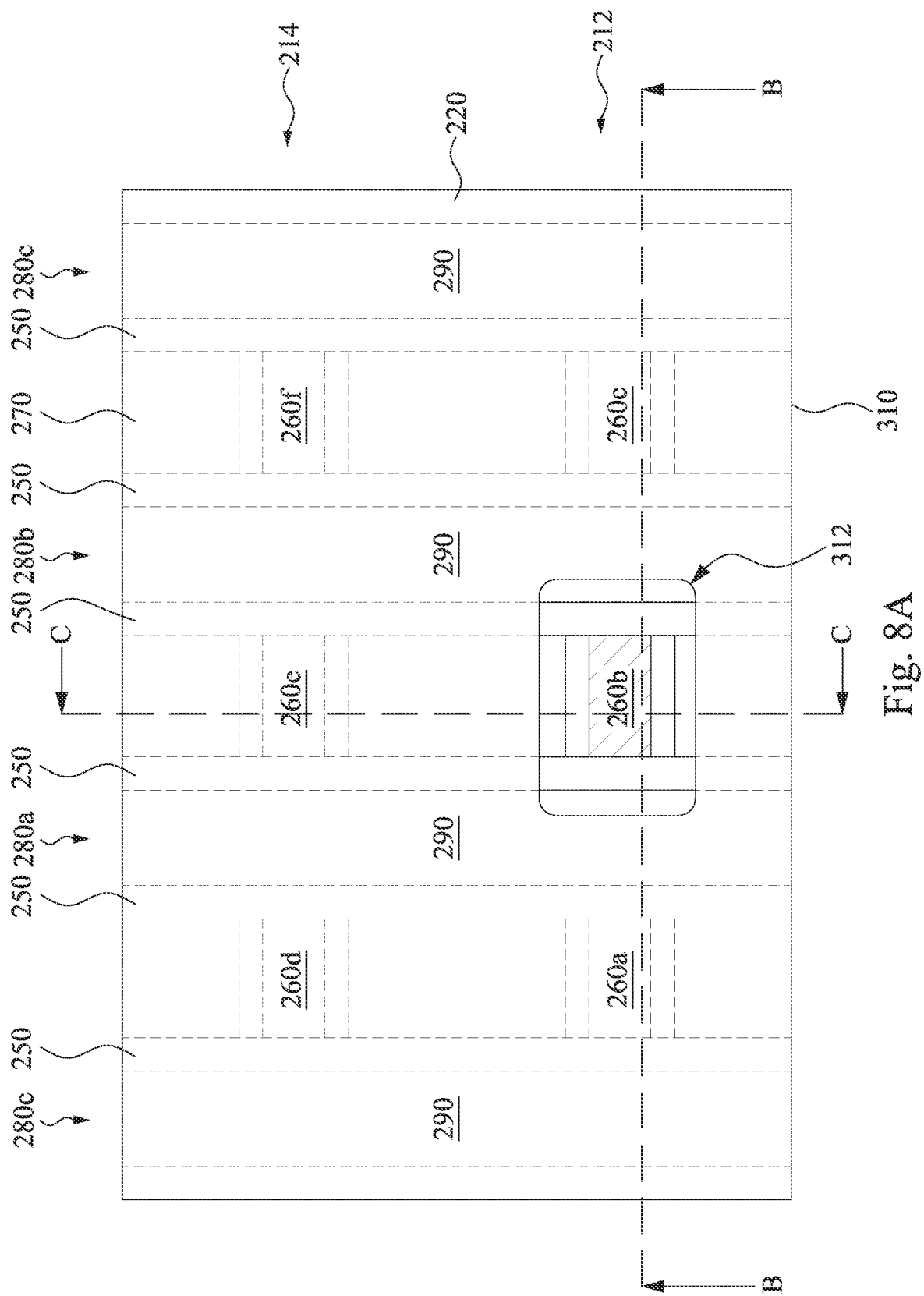

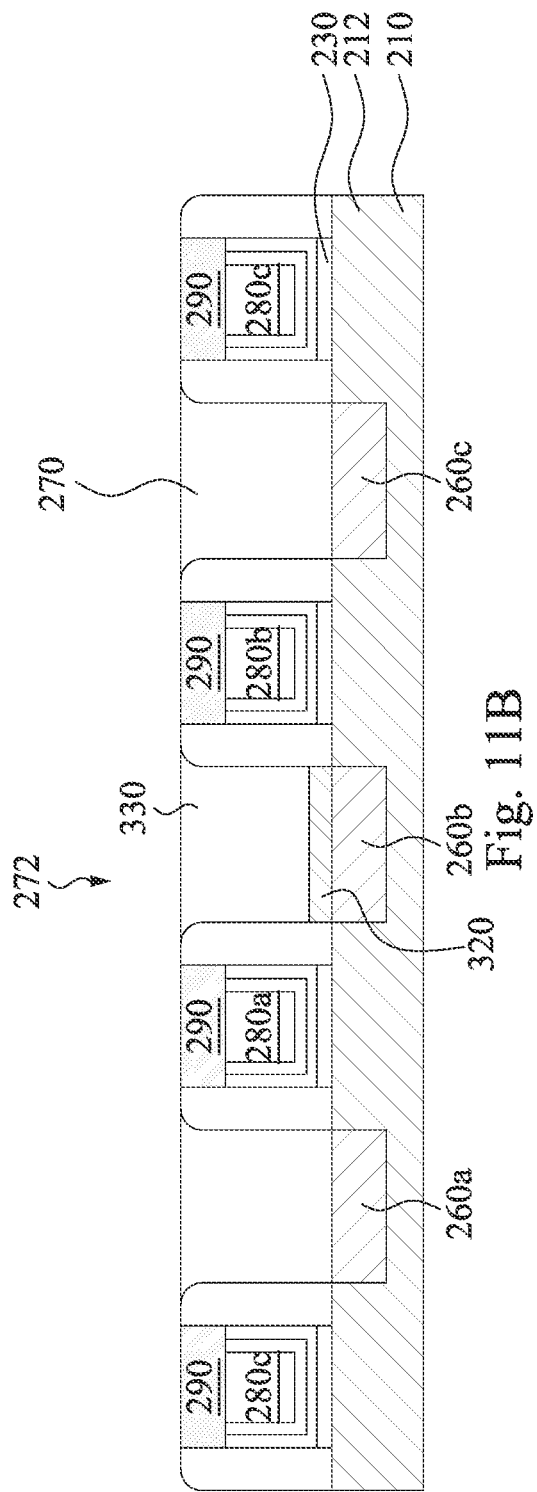
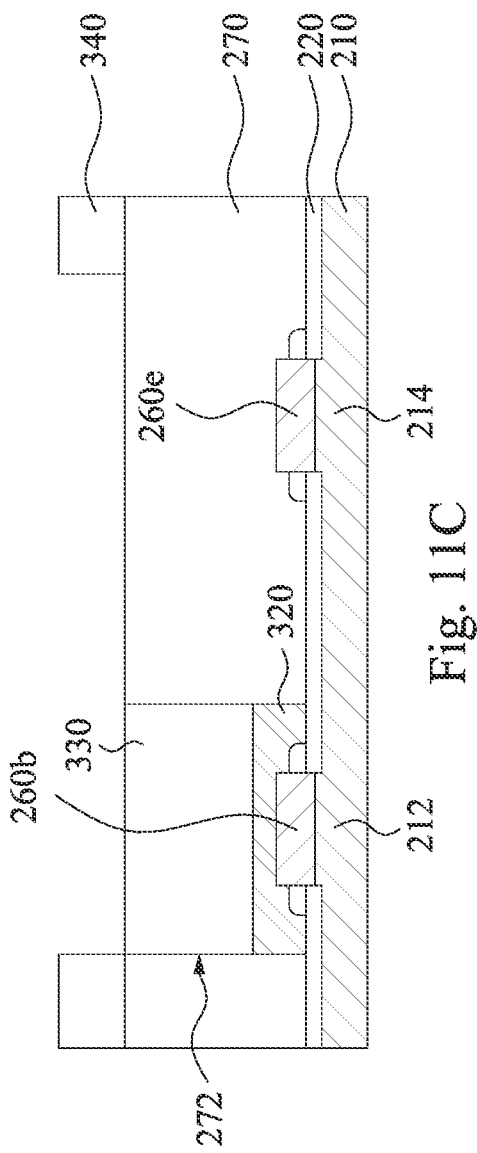

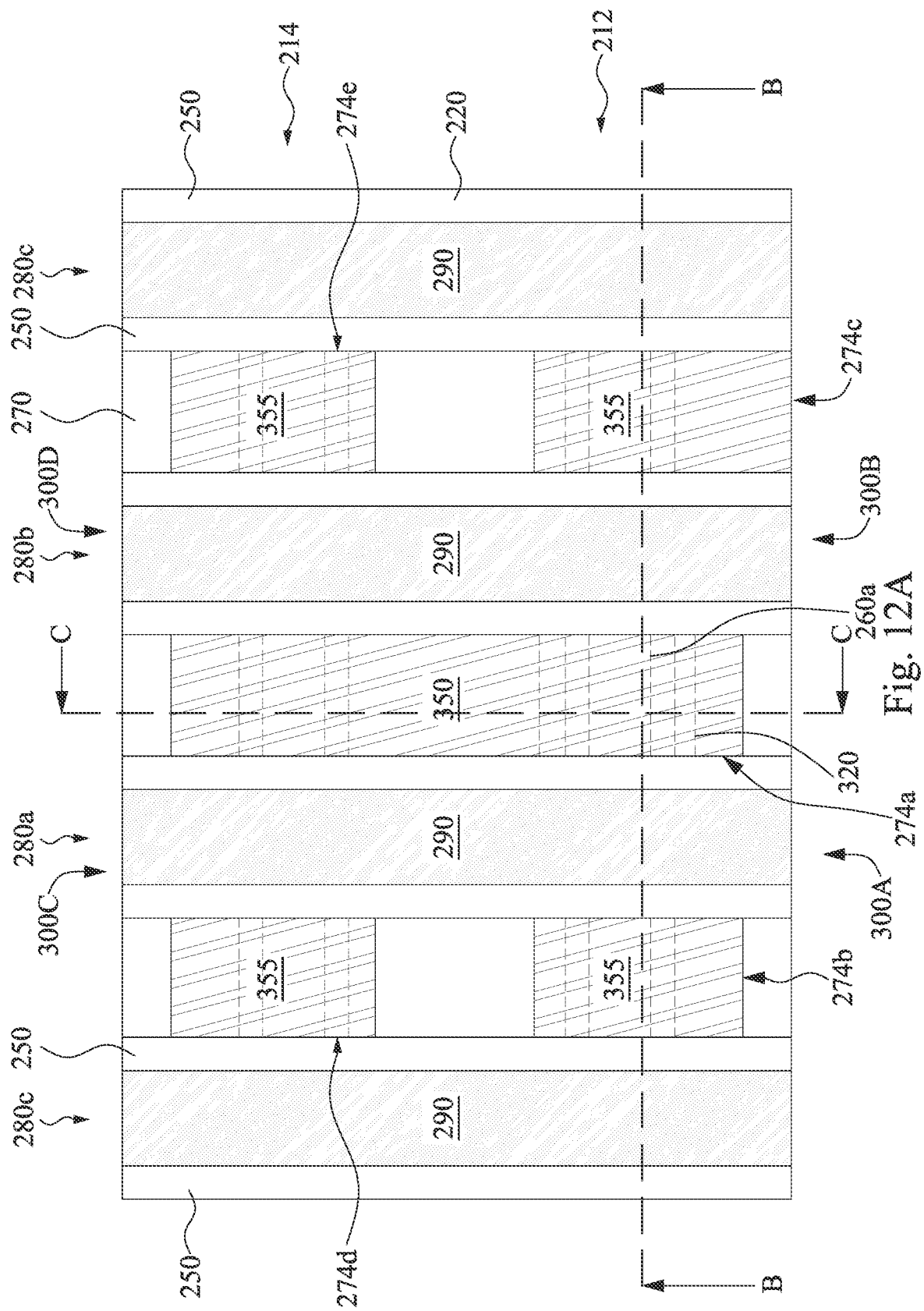

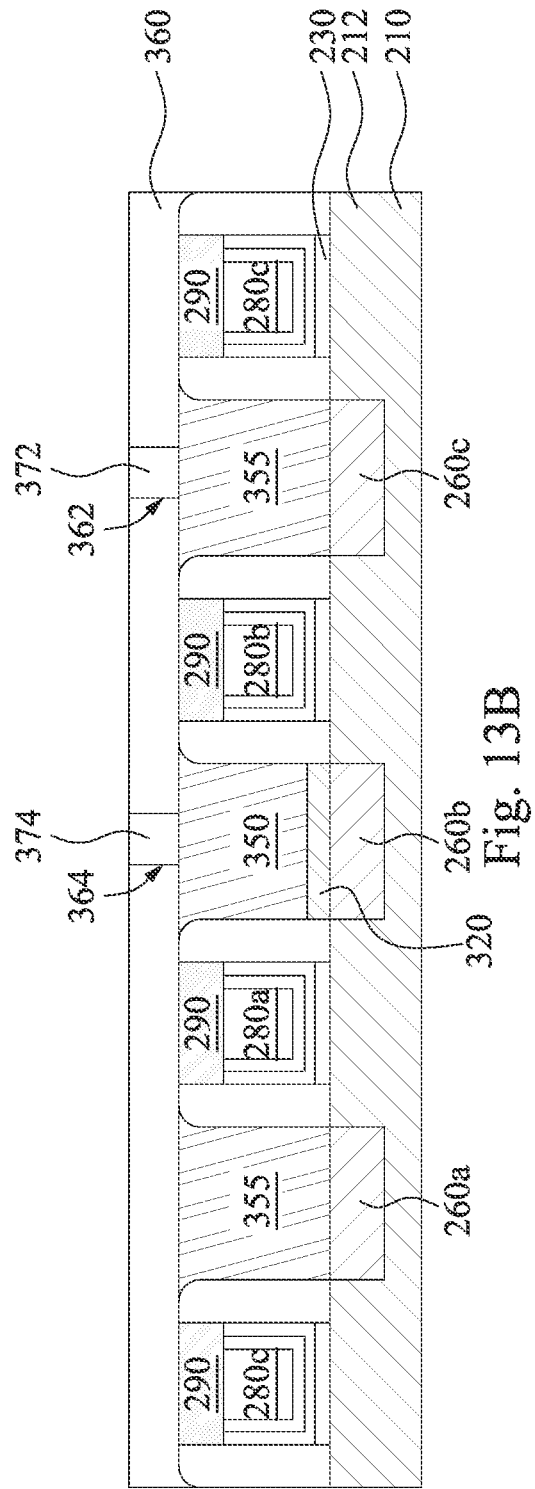
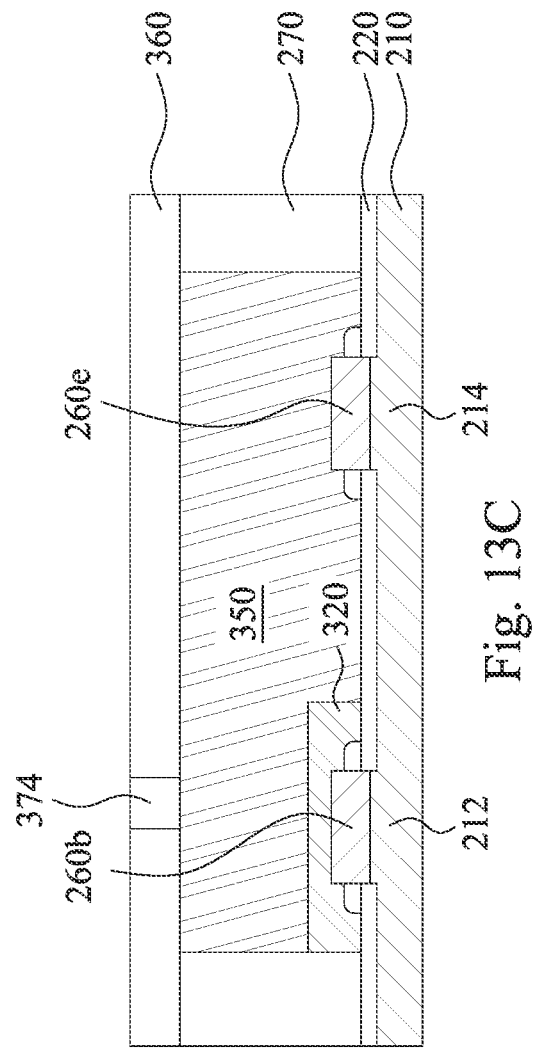
Fig. 13B
Fig. 13C

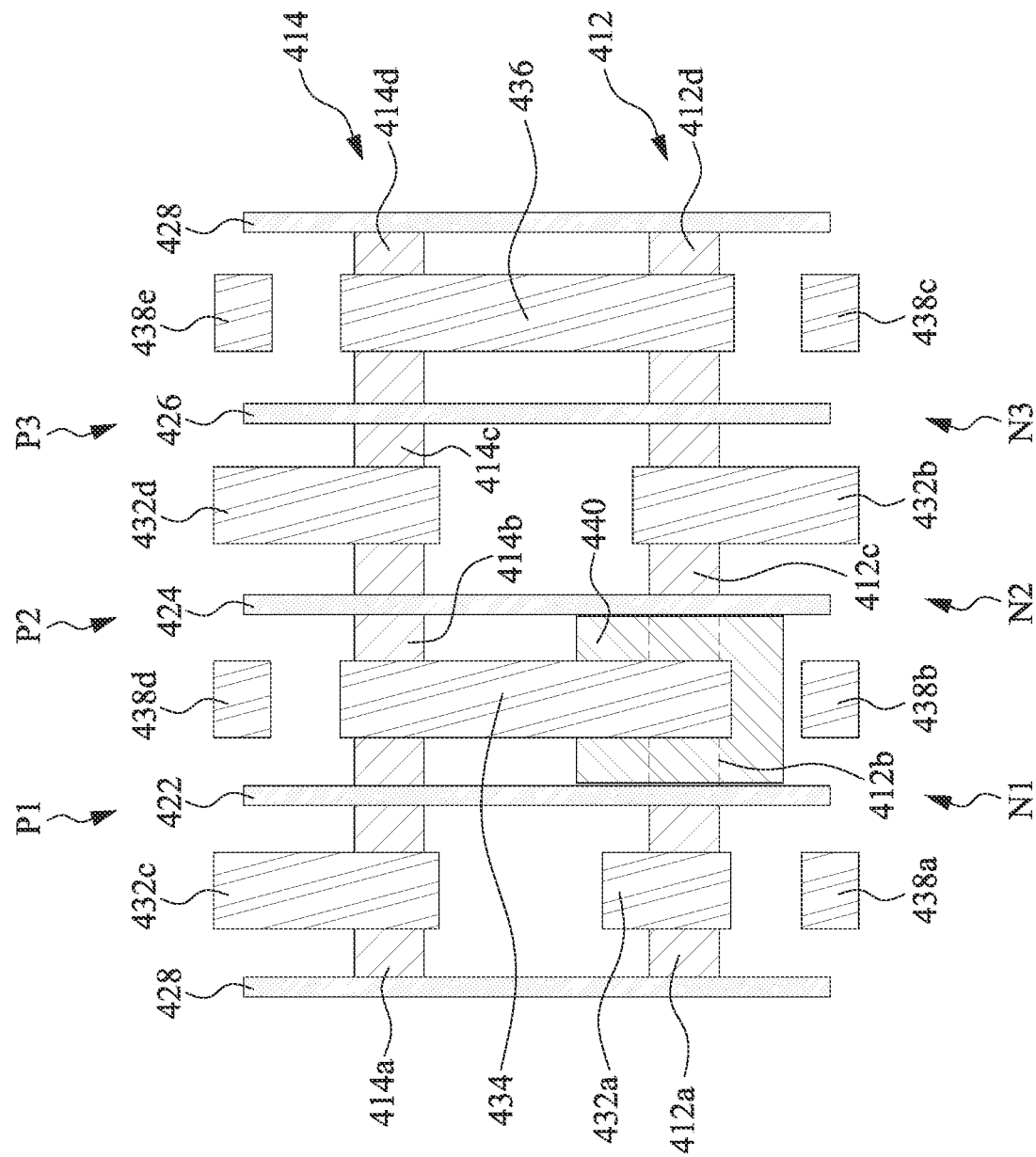

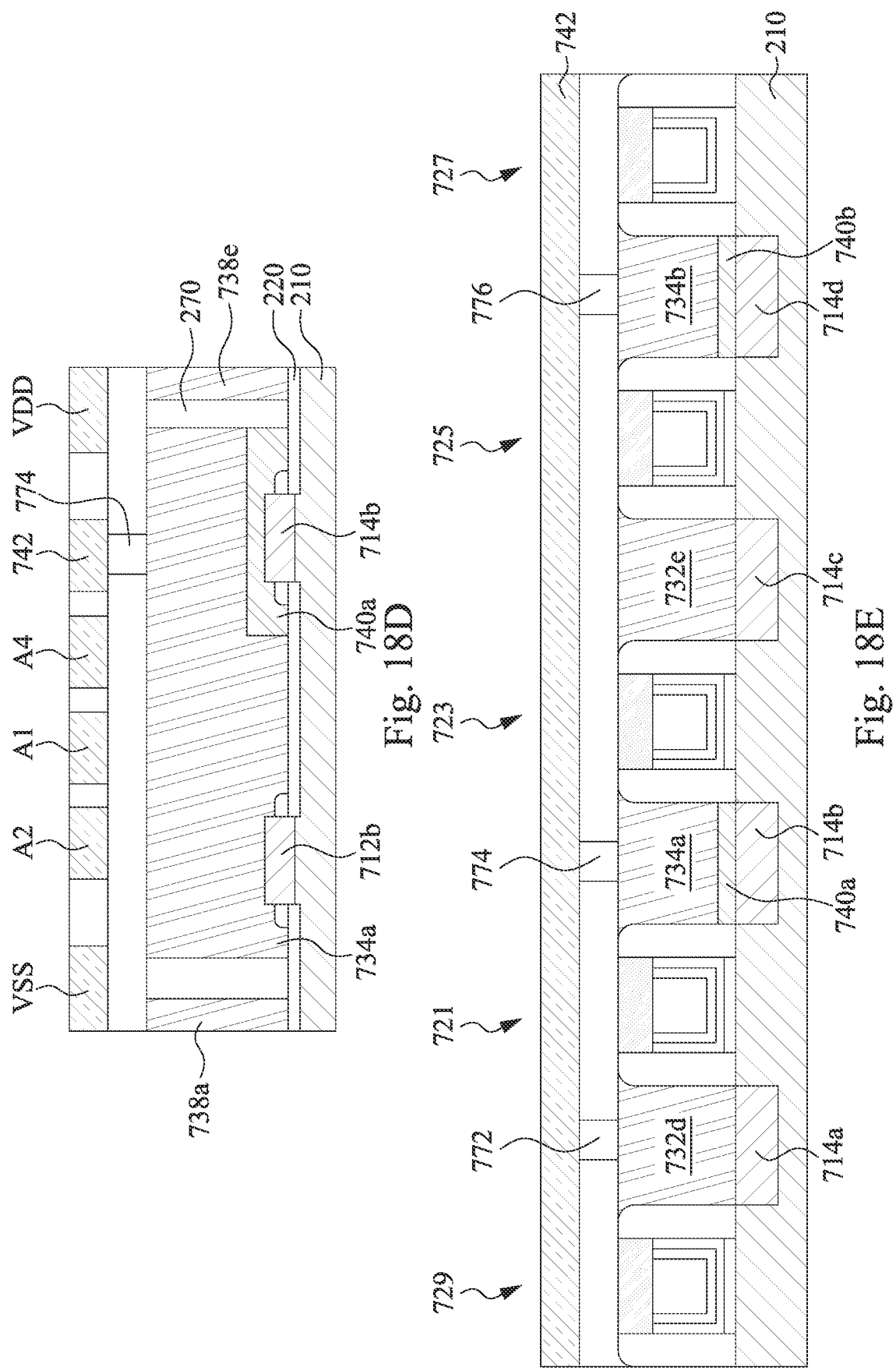

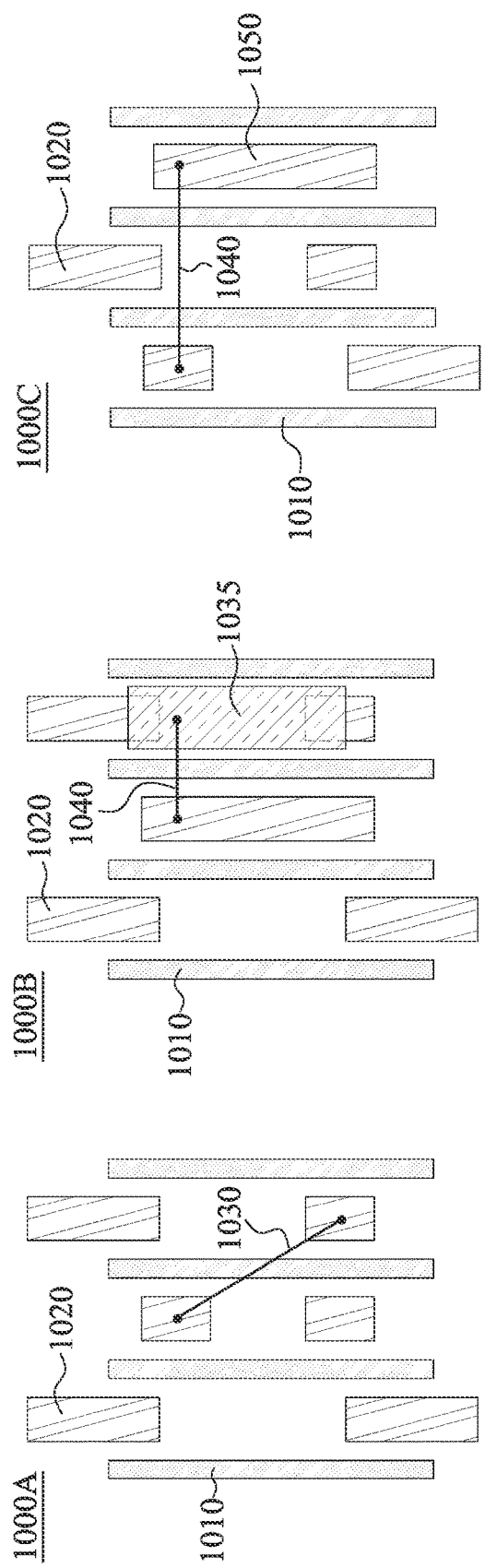
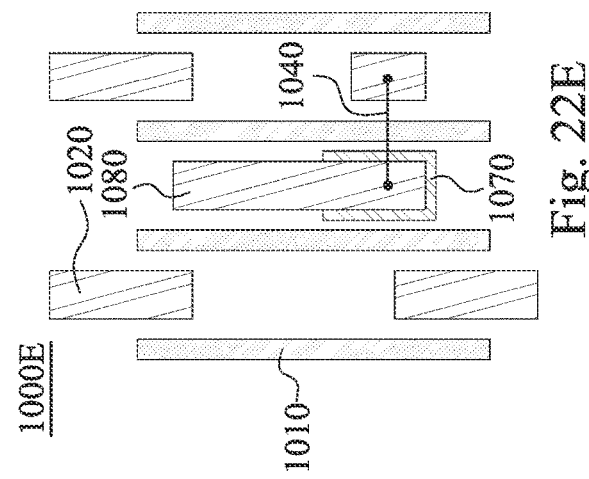
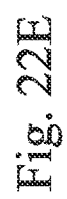
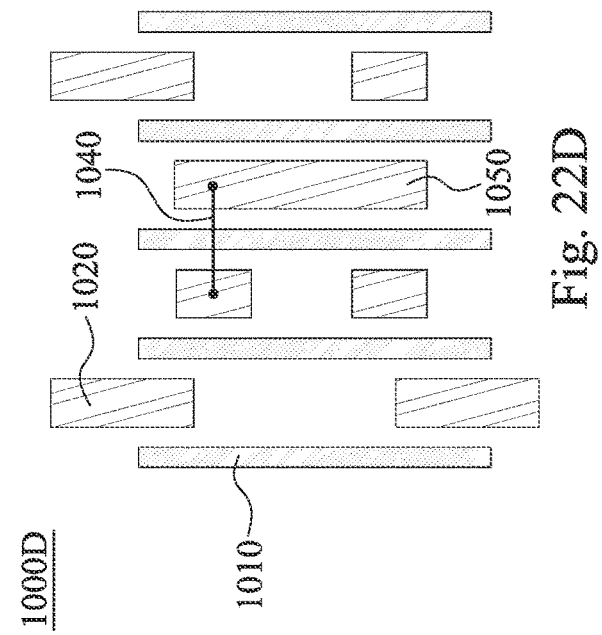
Fig. 22A  Fig. 22B  Fig. 22C  Fig. 22D  Fig. 22E

METHOD FOR MANUFACTURING SEMICONDUCTOR DEVICE

PRIORITY CLAIM AND CROSS-REFERENCE

This application is a divisional application of U.S. patent application Ser. No. 16/800,834, filed Feb. 25, 2022, now U.S. Pat. No. 11,328,957, issued on May 10, 2022, which is herein incorporated by reference in its entirety.

BACKGROUND

Integrated circuits (ICs) are often designed to implement various devices, including, for example, transistors, resistors, capacitors, or the like. These devices are often designed using connections of conductive traces to form circuits. Increasingly dense ICs result in benefits in terms of speed, functionality and cost, but cause increasingly difficult design and fabrication issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A to 14C illustrate a method in various stages of manufacturing a semiconductor device in FIG. 2A in accordance with some embodiments of the present disclosure.

FIG. 15C is a top view of the layout diagram in FIG. 15A without the conductive traces, in accordance with some embodiments of the present disclosure.

FIG. 18D is a cross-sectional view taking along line D-D in FIG. 18B.

FIG. 18E is a cross-sectional view taking along line E-E in FIG. 18B.

FIGS. 22A-22E illustrate top views of different IC layout structures of the standard cell mentioned in method.

DETAILED DESCRIPTION

Figure 1:
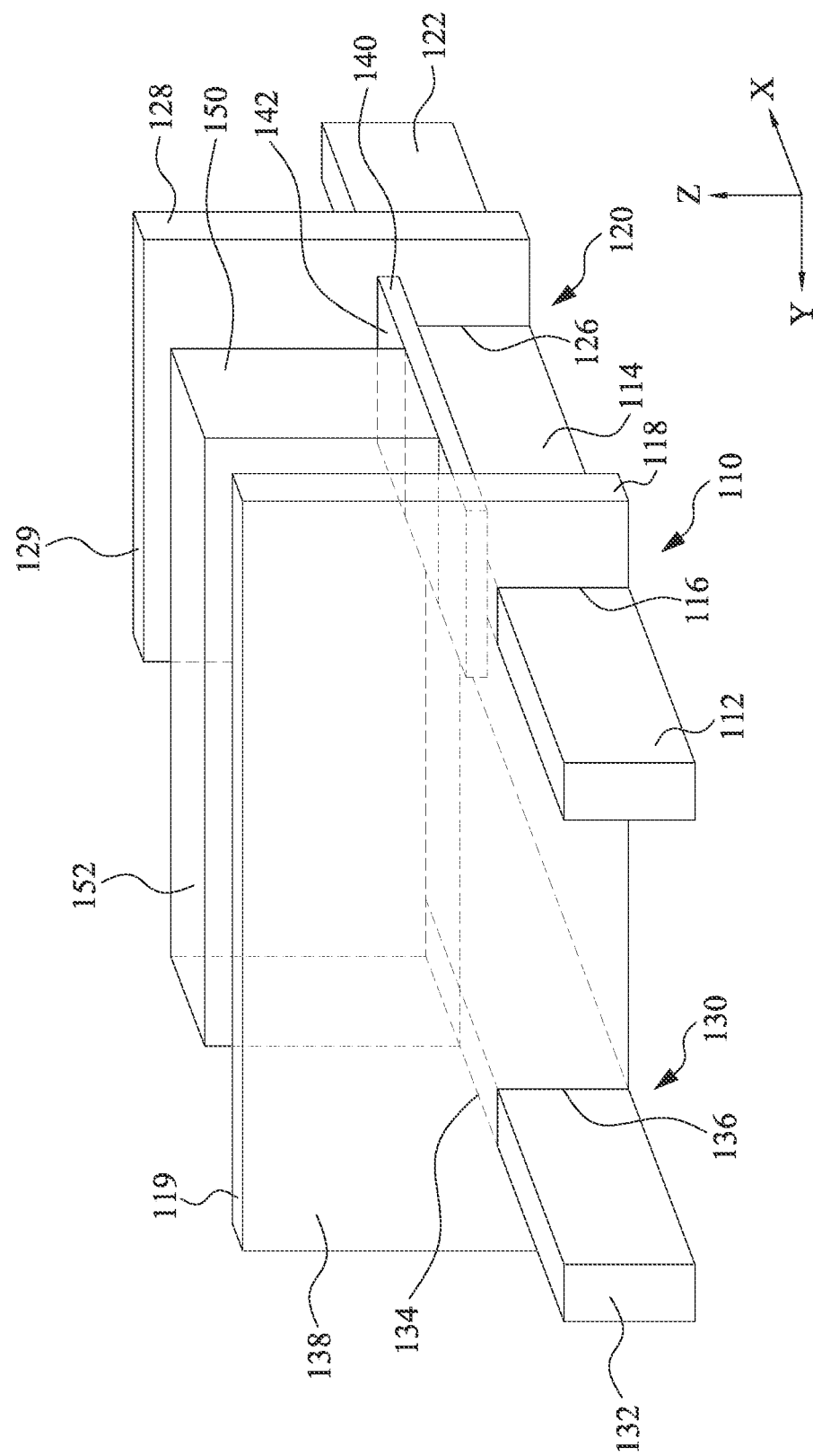
FIG. 1 is a schematic diagram of a perspective view of a layout structure corresponding to a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Over time, increasingly dense ICs are manufactured with progressively smaller physical dimensions, which results in difficulties of IC design and fabrication. The IC fabrication process is often considered to include a front-end-of-line (FEOL) portion, a middle-end-of-line (MEOL) portion, also referred to as a middle-of-the-line (MOL) portion, and a back-end-of-line (BEOL) portion. A FEOL process is a first portion of the IC fabrication process, in which individual active devices are patterned on a semiconductor wafer. FEOL processes include, for example, selecting a type of semiconductor wafer to be used, chemical-mechanical planarization and cleaning of the wafer, shallow trench isolation (STI) formation, well formation, gate module formation, and source and drain creation. MEOL processes are performed after FEOL processes and include, for example, gate contact formation, under bump metallization (UBM) processes, or the like.

A BEOL process is the final portion of the IC fabrication process in which the individual devices, such as transistors, capacitors, resistors, or the like, are interconnected with vias and conductive traces including, for example, metal lines. The BEOL process generally begins when the first layer of metal is deposited and includes, for example, contacts, insulating layers (or dielectric layers), and bonding sites for chip-to-package connections. In some embodiments, several metal layers are added during the BEOL process.

In some embodiments, improved IC design and fabrication include a system and method of layout design for ICs, which increase packing efficiency of conductive traces, including, for example, metal lines in metal layers created during the BEOL processes. In some embodiments, all metal lines are routed in one direction on each one of the metal layers, which enables greater packing density of the device through a more efficient packing of the conductive traces compared to approaches in which metal lines are routed in more than one direction. Routing all metal lines in one direction on each one of the metal layers also enables relaxation of pitch requirements between the conductive traces, as set forth by one or more design rules, because metal structures having metal lines routed in one direction have a regular pattern that reduces the risk of manufacturing or process errors.

In the various embodiments of the present disclosure, an interconnection structure with an isolation layer over stacking transistors having an internal common source/drain is provided. The internal common source/drain means that the common source/drain is isolated from the external signal, i.e., there is no external connector electrically connected to the common source/drain. The isolation layer and the interconnection structure are formed on the internal common source/drain. The stacking transistors including the interconnection structure and the isolation layer allow the reduction or cancellation of M1 pins (connectors, traces) of a circuit layout, thereby increasing routing flexibility, as illustrated by the non-limiting examples provided below.

Devices including FETs and cell structures therein are provided in accordance with various embodiments hereinafter. Some variations of some embodiments are discussed. Throughout various views and illustrative embodiments, like elements are designated with like reference numbers for ease of understanding.

FIG. 1 is a schematic diagram of a perspective view of a layout structure corresponding to a semiconductor device 100, in accordance with some embodiments of the present disclosure. In addition to the semiconductor device 100, FIG. 1 depicts X-axis, Y-axis, and Z-axis directions. FIG. 1 depicts a simplified version of the semiconductor device 100 for the purpose of illustrating the general spatial relationships between the various features; the specific spatial relationships of the various embodiments are discussed below with respect to FIGS. 2A-2C.

The semiconductor device 100 may be a portion of a standard cell. As illustratively shown in FIG. 1, the semiconductor device 100 includes a first transistor 110, a second transistor 120, a third transistor 130, an isolation layer 140, and an MD contact (MDC) 150, where MD means "metal layer over oxide-definition areas". The first transistor 110 and the second transistor 120 share the same source/drain 114. The isolation layer 140 is over the shared source/drain 114. In some embodiments, the MDC 150 is connected to the third transistor 130 and extends to a position above the isolation layer 140.

In some embodiments, the first transistor 110 and second transistor 120 have the same conductivity type, and the first transistor 110 and third transistor 130 have different conductivity types. For example, the first transistor 110 and second transistor 120 are n-type transistors and the third transistor 130 is a p-type transistor, or vice versa. Further, the first transistor 110 and second transistor 120 share the same source/drain 114, which is electrically isolated with external connectors. That is, there is no source/drain contact connected to the shared source/drain. The first transistor 110 and second transistor 120 form a stacking gate configuration. The substrate underlying the semiconductor device 100 is any substrate suitable for epitaxial growth and/or is formed of any suitable crystalline material including, for example, silicon, silicon-germanium (SiGe), or the like.

In some embodiments, the term "p-type transistor" as discussed above is referred to as a transistor including a p-type dopant, e.g., boron, in, for example, doped source and drain regions of the p-type transistor, and the term "n-type transistor" as discussed above is referred to as a transistor including an n-type dopant, e.g., phosphorous or arsenic, in, for example, doped source and drain regions of the n-type transistor. Furthermore, when two transistors are P-type FET and N-type FET, a CMOS device including the p-type FET and the N-type FET is able to be designed and manufactured. Moreover, a standard cell represents the CMOS device, used to be implemented in an integrated circuit (IC or chip) design. For example, an inverter, an NAND gate, an AND-OR-invert (AOI) logic gate, a flip-flop, or other suitable circuits. The standard cell design may include a single height cell that occupies an area from a positive power supply line ("VDD") to a negative power supply line ("VSS"). Two single smaller height cells may be stacked together to form a dual height cell in cases where larger transistors are used, and in order to increase performance. Further, multi-row standard cell structures are intermixed with both the single, smaller height cells and the dual height cells to accommodate both high gate density applications and higher-drive current applications.

In various embodiments, the MDC 150 is an MD segment including a portion of at least one metal layer, e.g., one or more of copper (Cu), silver (Ag), tungsten (W), titanium (Ti), nickel (Ni), tin (Sn), aluminum (Al) or another metal or material suitable for providing a low resistance electrical connection between IC structure elements, i.e., a resistance level below a predetermined threshold corresponding to one or more tolerance levels of a resistance-based effect on circuit performance.

In FIG. 1, the first transistor 110 includes a first source/drain 112, a gate 118, and a second source/drain 114 that are arranged along a horizontal direction (e.g., along the X-axis direction). The gate 118 is arranged between the first source/drain 112 and the second source/drain 114 of the first transistor 110 and extends in a predetermined direction. The gate 118 is configured to control a channel 116 between the first source/drain 112 and the second source/drain 114 of the first transistor 110. The channel 116 as well as the first source/drain 112 and the second source/drain 114 are implemented by an active area formed with dopants in some embodiments.

The second transistor 120 includes a first source/drain 122, a gate 128, and a second source/drain 114 (i.e., the second source/drain of the first transistor 110) that are arranged along the horizontal direction (e.g., along the X-axis direction). Alternatively stated, the second source/drain 114 is arranged as a common source/drain corresponding to the first transistor 110 and the second transistor 120, and the first transistor 110 and the second transistor 120 share the source/drain 114. The gate 128 is arranged between the first source/drain 122 and the second source/drain 114 of the second transistor 120. The gate 128 is configured to control a channel 126 between the first source/drain 122 and the second source/drain 114 of the second transistor 120. The channel 126 as well as the first source/drain 122 and the second source/drain 114 are implemented by an active area formed with dopants in some embodiments.

The third transistor 130 includes a first source/drain 132, a gate 138, and a second source/drain 134 that are arranged along the horizontal direction (e.g., along the X-axis direction). The gate 138 is arranged between the first source/drain 132 and the second source/drain 134 of the third transistor 130 and extends in a predetermined direction. The gate 138 is configured to control a channel 136 between the first source/drain 132 and the second source/drain 134 of the third transistor 130. The channel 136 as well as the first source/drain 132 and the second source/drain 134 are implemented by an active area formed with dopants in some embodiments. In FIG. 1, the first transistor 110 and the third transistor 130 share the same gate. That is, the gates 118 and 138 are integrally formed. In some embodiments, however, the gate 138 of the third transistor 130 is spaced apart from the gates 118 and 128 of the transistors 110 and 120. In some embodiments, the second transistor 120 and the third transistor 130 share the same gate. That is, the gates 128 and 138 are integrally formed.

In some embodiments, the term "source/drain" is referred to as a region that may be a source region or a drain region. Accordingly, for illustration in FIG. 1, when the first source/drain 112 of the first transistor 110 is a source region, the second source/drain 114 of the first transistor 110 is a drain region, and vice versa. Correspondingly, when the first source/drain 122 of the second transistor 120 is a source region, the second source/drain 124 of the second transistor 120 is a drain region, and vice versa. When the first source/drain 132 of the third transistor 130 is a source region, the second source/drain 134 of the third transistor 130 is a drain region, and vice versa.

In FIG. 1, the isolation layer 140 covers or is formed over the shared source/drain 114. In some embodiments, the isolation layer 140 is in contact with the shared source/drain 114. The isolation layer 140 may be made of dielectric materials such as $SiO_2$, SiCN, SiSN, combinations thereof, or the like. In some embodiments, a top surface 142 of the isolation layer 140 is lower than a top surface 119 of the gate 118 and/or a top surface 129 of the gate 128.

The MDC 150 is formed over the source/drain 134 and the shared source/drain 114. The MDC 150 is electrically connected to the source/drain 134 of the third transistor 130 but electrically isolated from the shared source/drain 114 of the first and second transistors 110 and 120. In some embodiments, the MDC 150 is in contact with the source/drain 134 and the isolation layer 140. A top surface 152 of the MDC 150 is substantially coplanar to the top surfaces 119 and/or 129 of the gates 118 and/or 128.

With the structures of the semiconductor device 100 as discussed above, electrical contacts to the source/drain 134 of the third transistor 130 are able to be formed using the MDC 150 and the isolation layer 140 shown in FIG. 1. This simplifies access to the semiconductor device 100. Moreover, a standard cell which implements the semiconductor device 100 is able to be scaled down because of the interconnection structure shown in FIG. 1. In some embodiments, the same standard cell decreases about 3% of the layout area when the MDC 150 and the isolation layer 140 are applied to the standard cell.

The structures of the semiconductor device 100 as discussed above are given for illustrative purposes. Various structures of the semiconductor device 100 are within the contemplated scope of the present disclosure. For example, in various embodiments, the structures of the semiconductor device 100 are extended to include additional MDCs that are in parallel, in series, or in parallel and series combination, to the MDC 150 as discussed above.

Figure 2A:
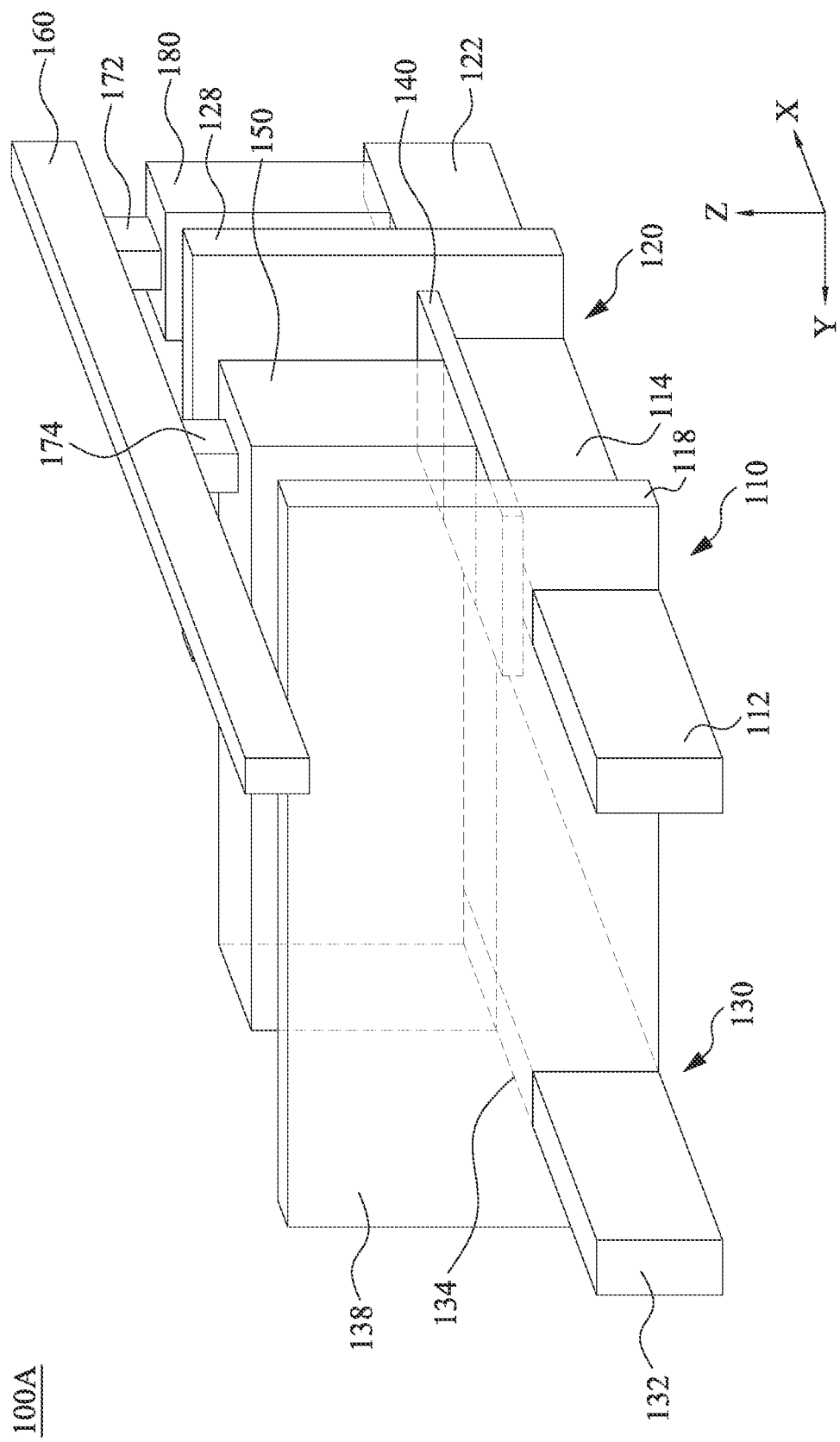
FIGS. 2A, 2B, and 2C are schematic diagrams of various perspective views of layout structures for the semiconductor device in FIG. 1, in accordance with various embodiments of the present disclosure.
Figure 2B:
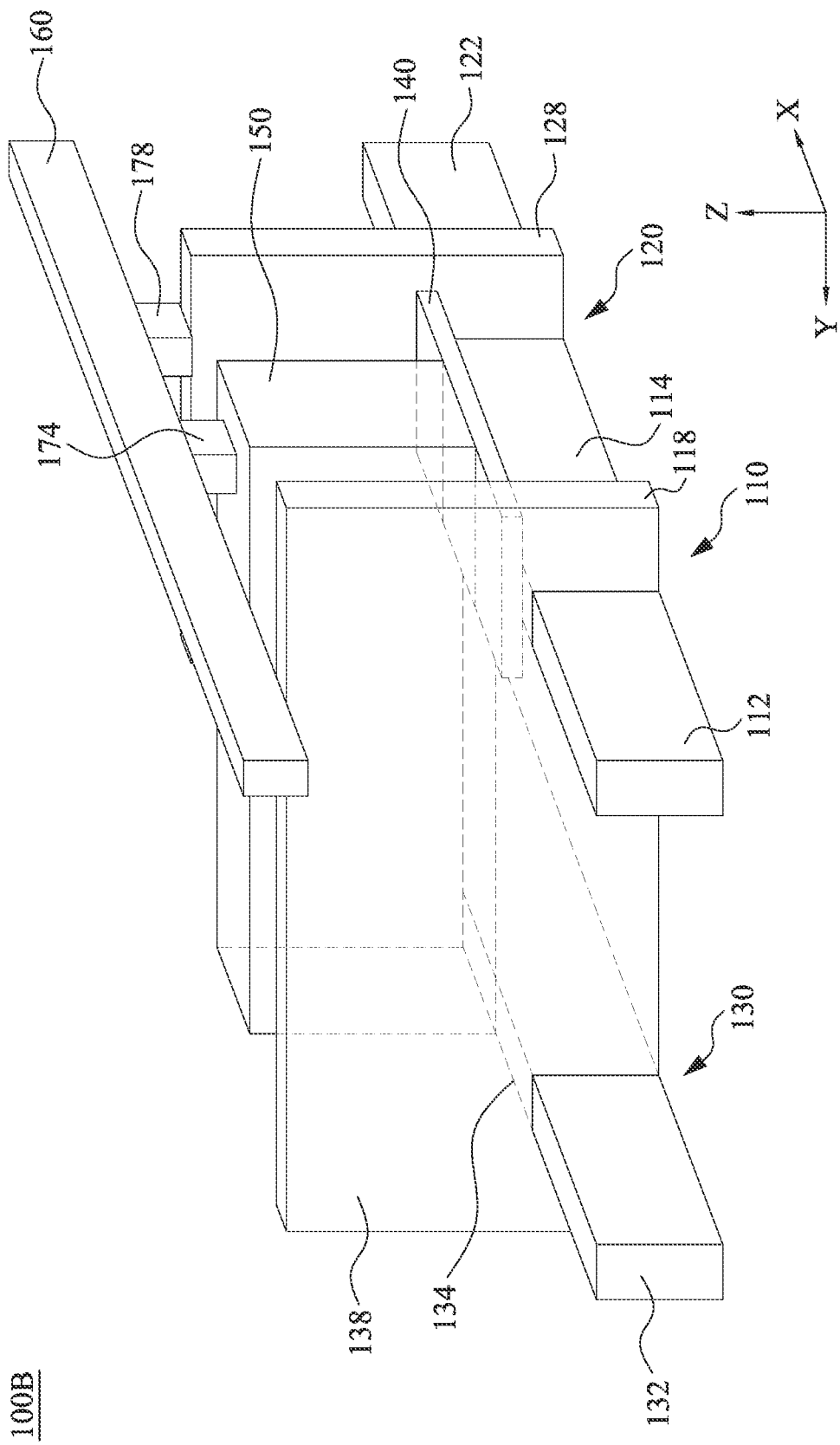
Figure 2C:
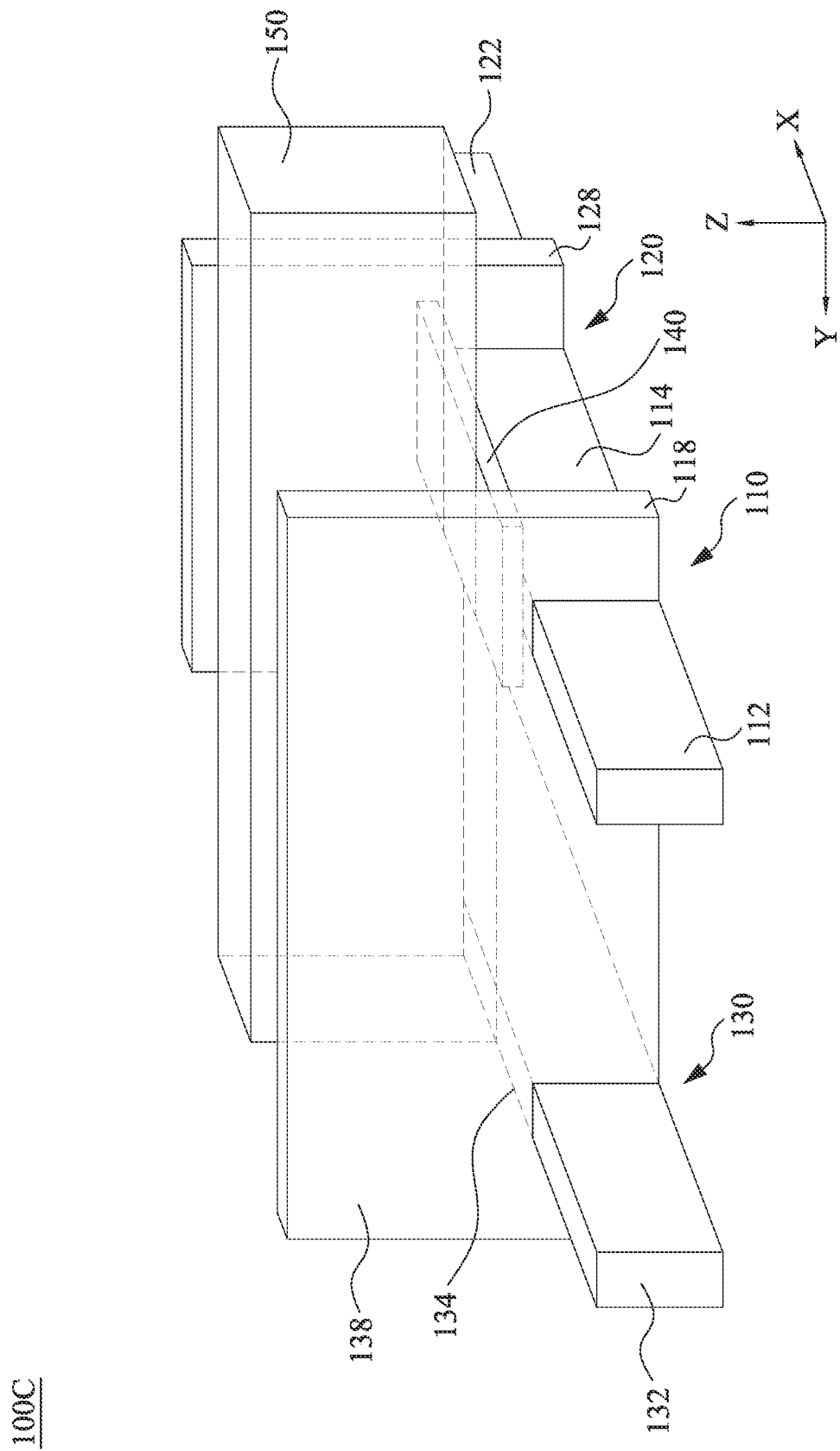

FIGS. 2A, 2B, and 2C are schematic diagrams of various perspective views of layout structures for the semiconductor device 100 in FIG. 1, in accordance with various embodiments of the present disclosure. According to the various embodiments of FIGS. 2A-2C, the different routings may be formed on the semiconductor device 100 in FIG. 1. In the various embodiments, the MDC 150 and a conductive trace formed above interconnect the source/drain 134 of the third transistor 130 and the source/drain 112 of the first transistor 110, interconnects the source/drain 134 of the third transistor 130 and the gate 118 of the first transistor 110, or the MDC 150 just crosses over the shard source/drain 114.

In FIG. 2A, the semiconductor device 100A further includes a conductive trace 160. The conductive trace 160 is arranged above the first and second transistors 110 and 120. The conductive trace 160 extends along a predetermined direction (e.g., along the X-axis direction) that is, for illustration, perpendicular to another predetermined direction (e.g., along the Y-axis direction) along which the gates 118, 128, and 138 extends. The semiconductor device 100A further includes vias 172 and 174, positioned to couple the conductive trace 160 to the corresponding source/drains, gates, and/or the MDC 150. For illustration, the conductive trace 160 is coupled through the via 172 to a source/drain contact 180 connected to the first source/drain 122 of the second transistor 120, and is coupled through the via 174 to the MDC 150, such that the first source/drain 122 of the second transistor 120 is electrically connected to the source/drain 134 of the third transistor 130 through the MDC 150 and the conductive trace 160.

In FIG. 2B, the semiconductor device 100B further includes a conductive trace 160. The conductive trace 160 is arranged above the first and second transistors 110 and 120. The conductive trace 160 extends along a predetermined direction (e.g., along the X-axis direction) that is, for illustration, perpendicular to another predetermined direction (e.g., along the Y-axis direction) along which the gates 118, 128, and 138 extends. The semiconductor device 100B further includes vias 178 and 174, positioned to couple the conductive trace 160 to the corresponding source/drains, gates, and/or the MDC 150. For illustration, the conductive trace 160 is coupled through the via 178 to the gate 128 of the second transistor 120, and is coupled through the via 174 to the MDC 150, such that the gate 128 of the second transistor 120 is electrically connected to the source/drain 134 of the third transistor 130 through the MDC 150 and the conductive trace 160.

In FIG. 2C, the MDC 150 crosses over the shared source/drain 114 of the first and second transistor 110 and 120. Since the shared source/drain 114 is electrically isolated with the external connectors, the MDC 150 can extend and cross over the shared source/drain 114, such that the third transistor 130 can be electrically connected to other conductive trace far away from the third transistor 130 using the MDC 150 in some embodiments.

The numbers of the conductive trace, the vias, and the MDC, as discussed above, are given for illustrative purposes. Various numbers of the conductive trace, the vias, and the MDC are within the contemplated scope of the present disclosure. For example, in various embodiments, the number of the conductive trace 160 shown in FIGS. 2A and/or 2B is increased to be three or increased to be four or five.

Figure 3A:
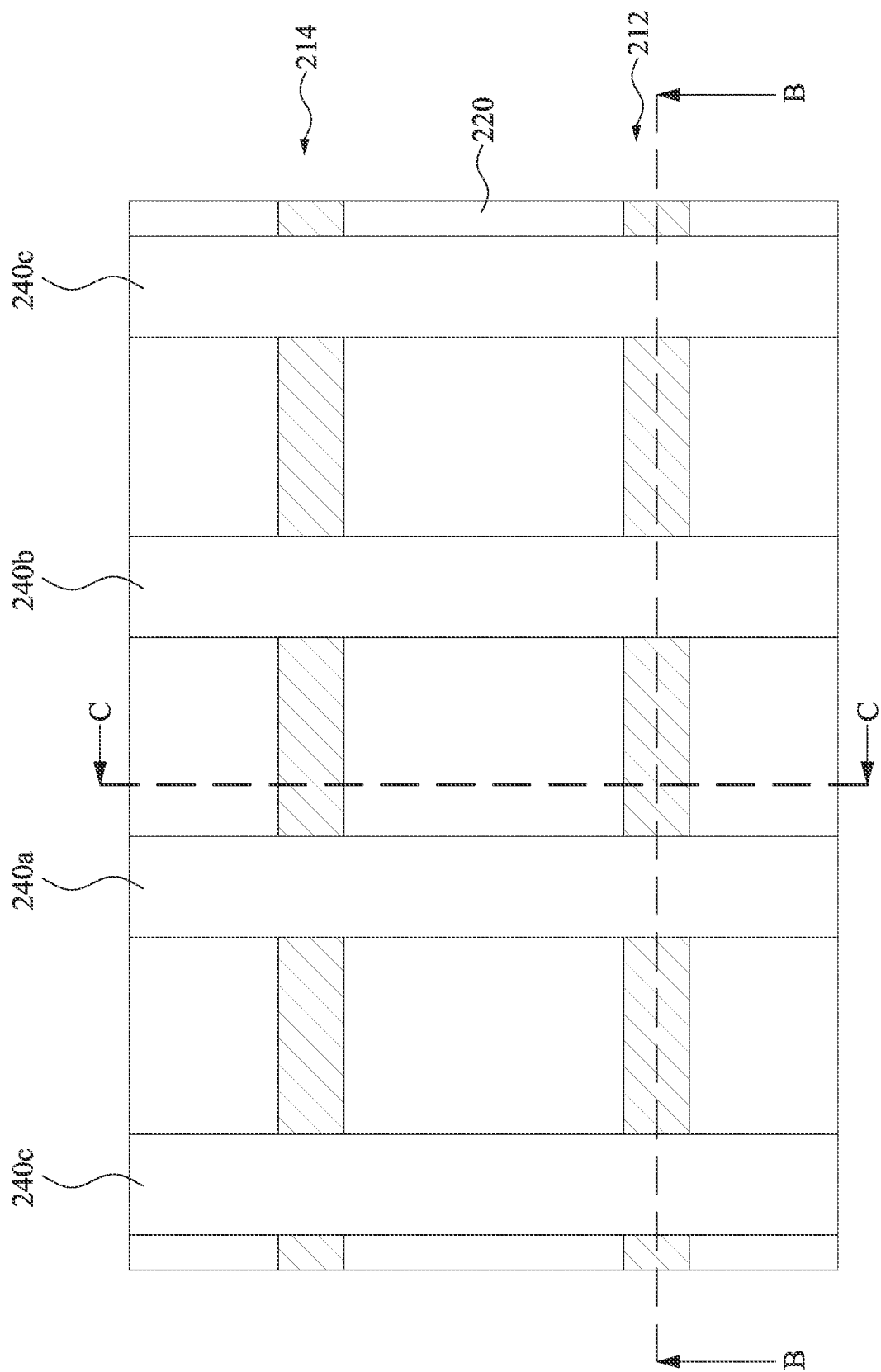
FIGS. 3A to 12C illustrate a method in various stages of manufacturing a semiconductor device in FIG. 1 in accordance with some embodiments of the present disclosure.

FIGS. 3A to 12C illustrate a method in various stages of manufacturing a semiconductor device 100 in FIG. 1 in accordance with some embodiments of the present disclosure. Throughout the various views and illustrative embodiments, like reference numbers are used to designate like elements. FIG. 3A is a top view of a method for manufacturing the semiconductor device 100 in FIG. 1 in various stages according to some embodiments, FIG. 3B is a cross-sectional view taking along line B-B of FIG. 3A, and FIG. 3C is a cross-sectional view taking along line C-C of FIG. 3A. Reference is made to FIGS. 3A-3C. A substrate 210 is provided. The substrate 210 includes first semiconductor fins 212 and second semiconductor fins 214 protruded from a top surface of the substrate 210. In some embodiments, the first semiconductor fins 212 and the second semiconductor fins 214 include silicon. It is note that the numbers of the first semiconductor fins 212 and the second semiconductor fins 214 in FIGS. 3A and 3B are illustrative, and should not limit the claimed scope of the present disclosure.

In some embodiments, the substrate 210 may be a semiconductor material and may include a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer.

The first semiconductor fins 212 and the second semiconductor fins 214 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the first semiconductor fins 212 and the second semiconductor fins 214 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the first semiconductor fins 212 and the second semiconductor fins 214 may be epitaxially grown. For example, exposed portions of an underlying material, such as an exposed portion of the substrate 210, may be used in an epitaxial process to form the first semiconductor fins 212 and the second semiconductor fins 214. A mask may be used to control the shape of the first semiconductor fins 212 and the second semiconductor fins 214 during the epitaxial growth process.

A plurality of isolation structures 220, such as shallow trench isolation (STI), are formed in the substrate 210 to separate various devices. The formation of the isolation structures 220 may include etching a trench in the substrate 210 and filling the trench by an insulator material such as silicon oxide, silicon nitride, or silicon oxynitride. The filled trench may have a multi-layer structure such as a thermal oxide liner layer with silicon nitride filling the trench. In some embodiments, the isolation structures 220 may be created using a process sequence such as: growing a pad oxide, forming a low pressure chemical vapor deposition (LPCVD) nitride layer, patterning an STI opening using photoresist and masking, etching a trench in the substrate 210 (to form the semiconductor fins 212 and 214), optionally growing a thermal oxide trench liner to improve the trench interface, filling the trench with oxide, using chemical mechanical planarization (CMP) to remove the excessive oxide, and recessing the thermal oxide trench liner and the oxide to form the isolation structures 220 such that top portions of the semiconductor fins 212 and 214 protrude from top surfaces of the isolation structures 220.

Figure 3B:
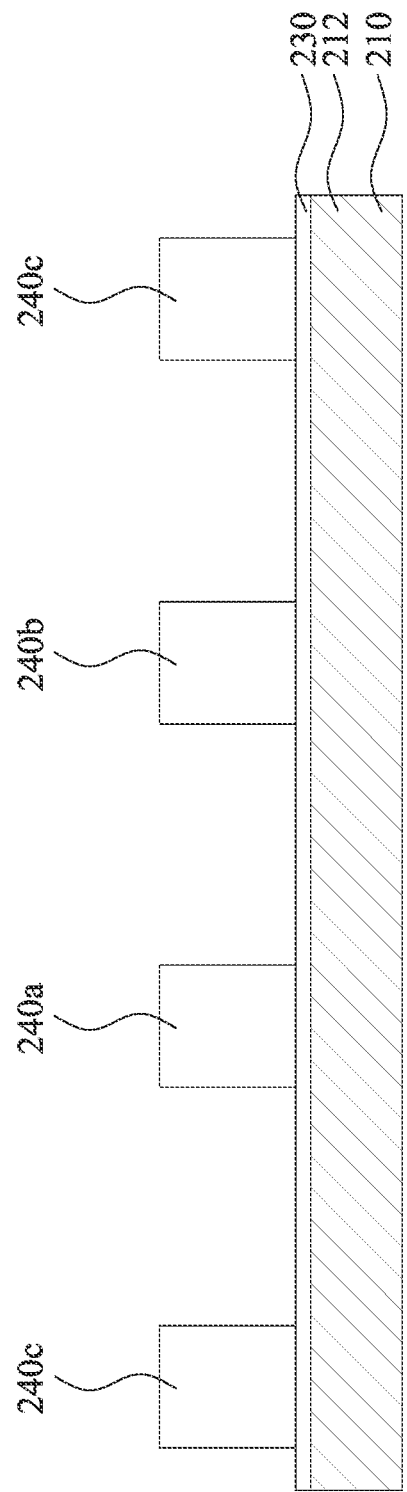
Figure 3C:
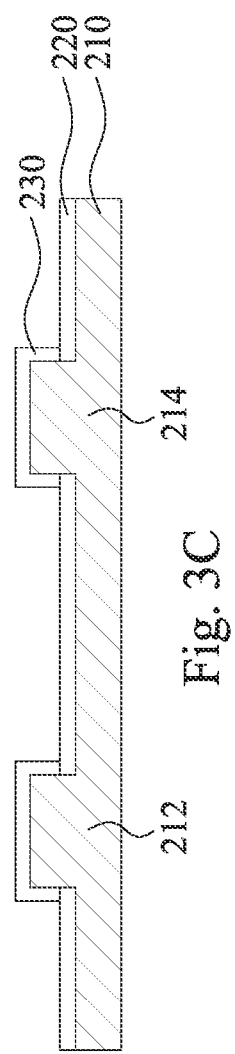

A dummy dielectric layer 230 is conformally formed to cover the semiconductor fins 212, 214, and the isolation structures 220. For clarity, the dummy dielectric layer 230 is shown in FIG. 3B and omitted in FIG. 3A. In some embodiments, the dummy dielectric layer 230 may include silicon dioxide, silicon nitride, a high-η dielectric material, or other suitable material. In various examples, the dummy dielectric layer 230 may be deposited by an ALD process, a CVD process, a subatmospheric CVD (SACVD) process, a flowable CVD process, a PVD process, or other suitable process. By way of example, the dummy dielectric layer 230 may be used to prevent damage to the semiconductor fins 212 and 214 by subsequent processing (e.g., subsequent formation of the dummy gate structure).

A plurality of dummy gate structures 240a, 240b, and 240c are formed over the dummy dielectric layer 230, the semiconductor fins 212, 214, and the isolation structures 220. In some embodiments, a dummy gate layer (not shown) may be formed over the dummy dielectric layer 230, and is then patterned to form the dummy gate structures 240a, 240b, and 240c. In some embodiments, the dummy gate structures 240a, 240b, and 240c may be made of polycrystalline-silicon (poly-Si), poly-crystalline silicon-germanium (poly-SiGe), or other suitable materials. If a gate-first technology is employed, the dummy gate structures 240a, 240b, and 240c and the dummy dielectric layer 230 are used as a gate electrode and a gate dielectric layer.

Figure 4A:
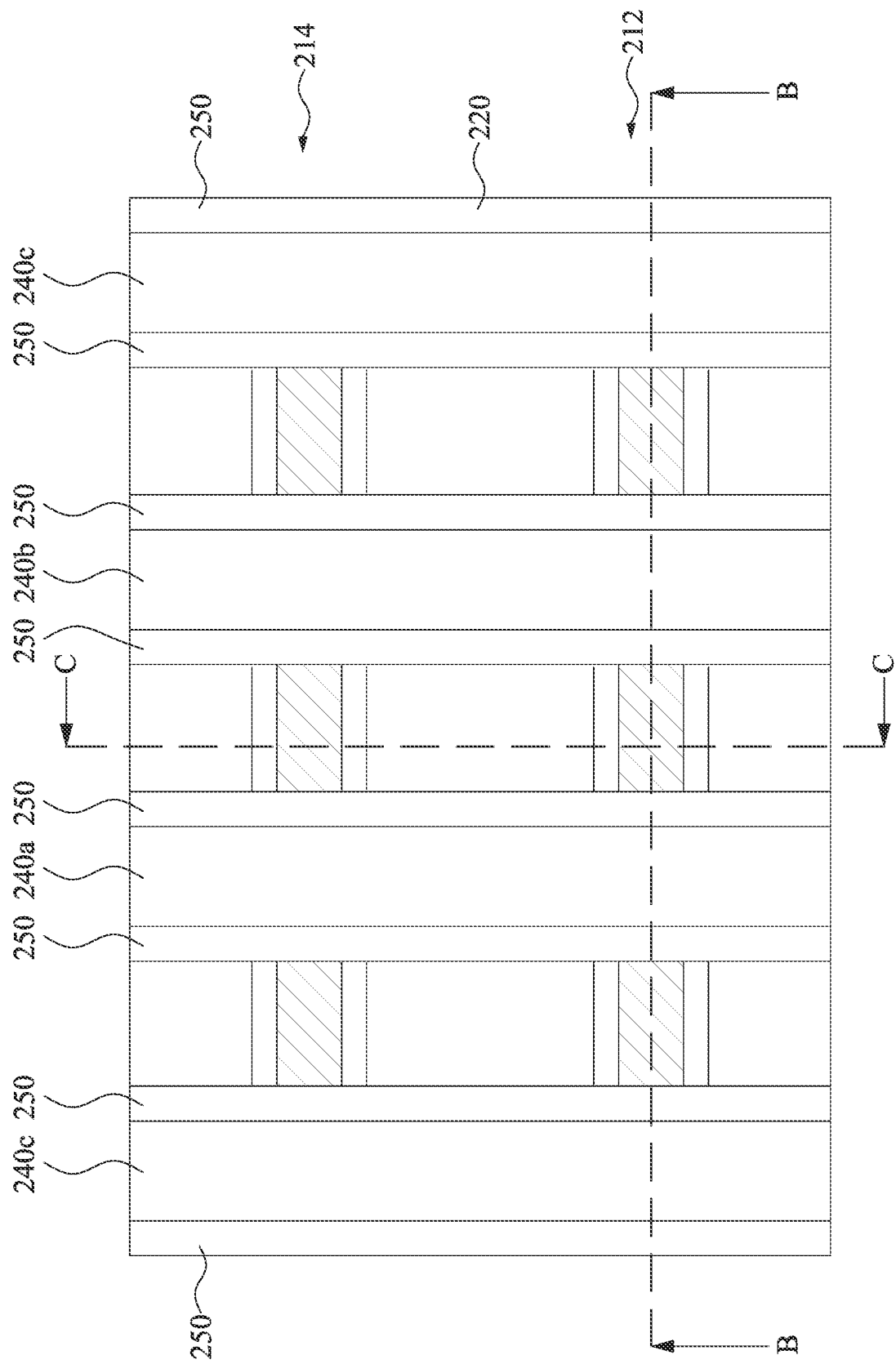
Figure 4B:
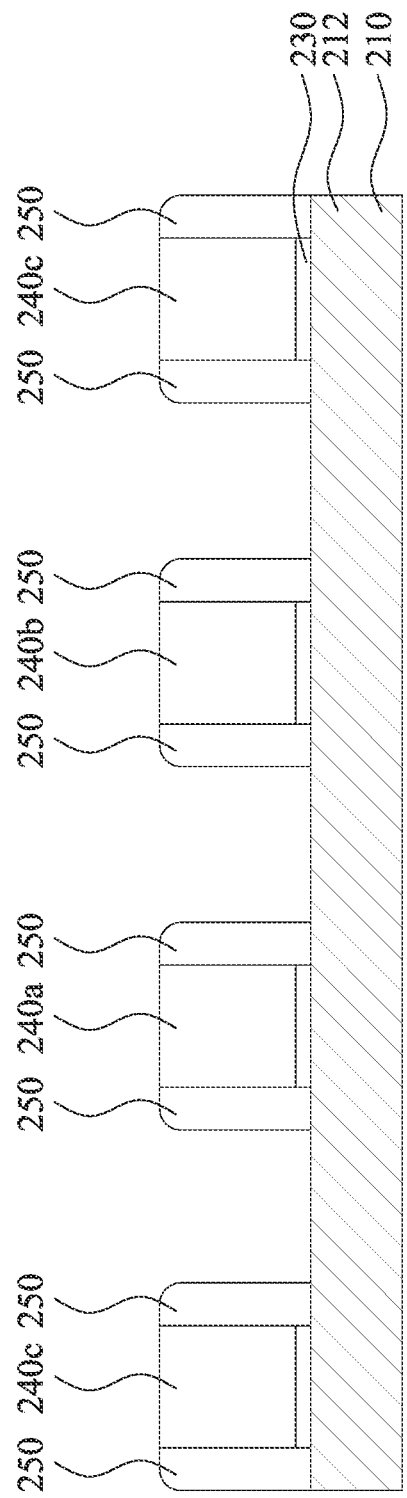
Figure 4C:
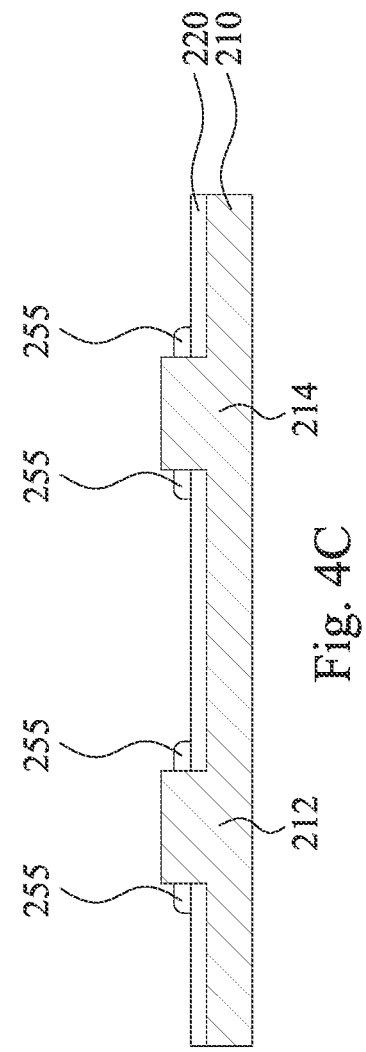

FIG. 4A is a top view of a method for manufacturing the semiconductor device 100 in FIG. 1 in various stages according to some embodiments, FIG. 4B is a cross-sectional view taking along line B-B of FIG. 4A, and FIG. 4C is a cross-sectional view taking along line C-C of FIG. 4A. Reference is made to FIGS. 4A-4C. Portions of the dummy dielectric layer 230 uncovered by the dummy gate structures 240a, 240b, and 240c are removed to expose portions of the semiconductor fins 212 and 214. Then, spacer structures 250 are at least formed on opposite sides of the dummy gate structures 240a, 240b, and 240c and the dummy dielectric layer 230. The spacer structures 250 may include a seal spacer and a main spacer (not shown). The spacer structures 250 include one or more dielectric materials, such as silicon oxide, silicon nitride, silicon oxynitride, SiCN, $SiC_xO_yN_z$, or combinations thereof. The seal spacers are formed on sidewalls of the dummy gate structure 240a, 240b, and 240c and the main spacers are formed on the seal spacers. The spacer structures 250 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 250 may include blanket forming spacer layers and then performing etching operations to remove the horizontal portions of the spacer layers. The remaining vertical portions of the spacer layers form the spacer structures 250.

In some embodiments, spacer residues 255, which are remaining parts of the spacer structures 250 that is not removed in the operation of etching the spacer layer, exist. Specifically, in the operation of the spacer layer deposition process, the spacer layer also covers the semiconductor fins 212 and 214. When the spacer layer is etched to form the spacer structures 250, the portions of the spacer layer on sidewalls of the semiconductor fins 212 and 214 are pullback-etched. Portions of the spacer structures 250 thus remain at corners between the isolation structure 220 and the semiconductor fins 212/214 after the etching and form the spacer residues 255. In some other embodiments, however, some of all the spacer residues 255 may be omitted.

Figure 5A:
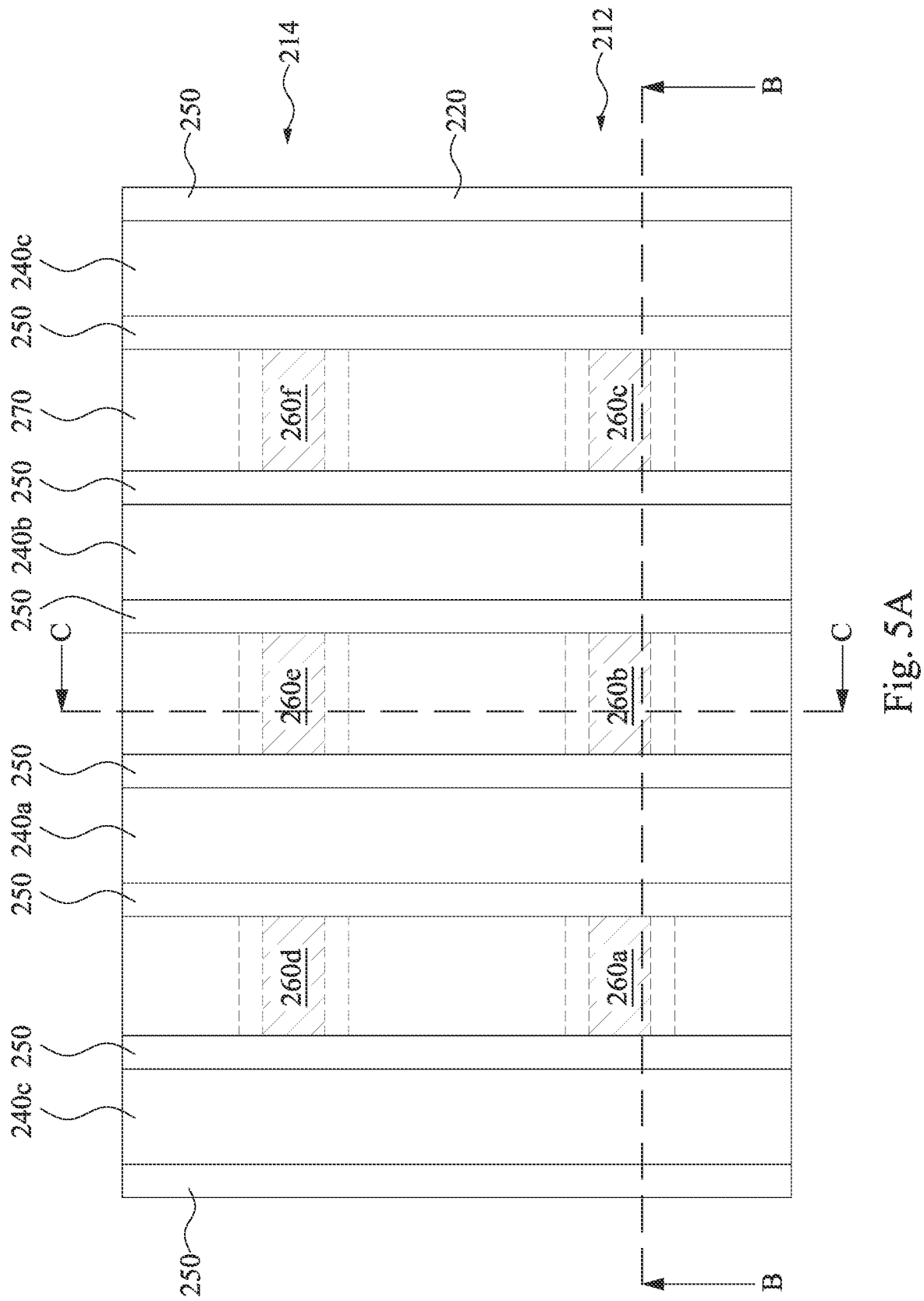
Figure 5B:
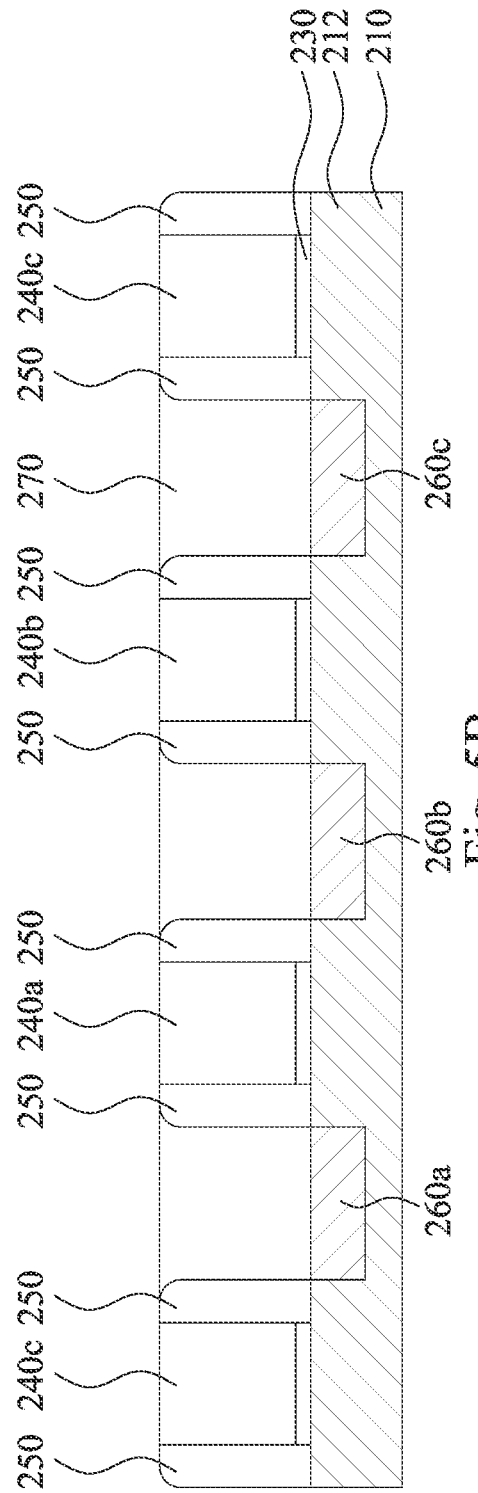
Figure 5C:
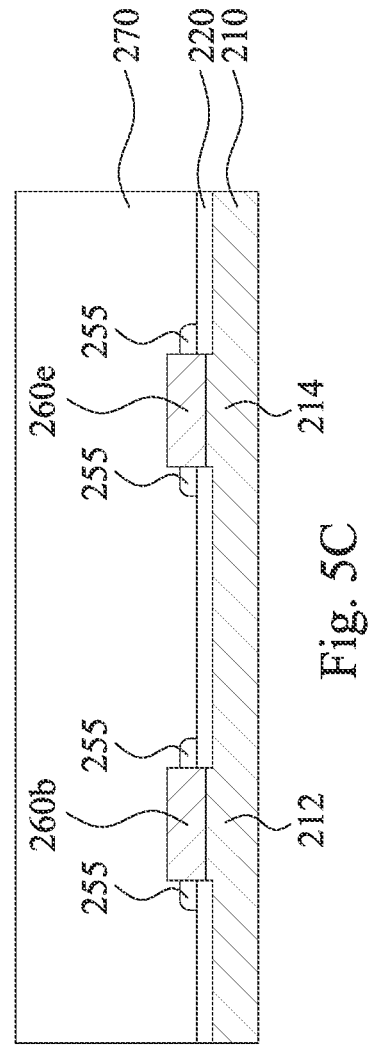

FIG. 5A is a top view of a method for manufacturing the semiconductor device 100 in FIG. 1 in various stages according to some embodiments FIG. 5B is a cross-sectional view taking along line B-B of FIG. 5A, and FIG. 5C is a cross-sectional view taking along line C-C of FIG. 5A. Reference is made to FIGS. 5A-5C. Epitaxial structures 260a, 260b, 260c, 260d, 260e, and 260f are then formed on portions of the semiconductor fins 212 and 214 uncovered by the dummy gate structures 240a, 240b, and 240c and the spacer structures 250 by performing, for example, a selectively growing process. The epitaxial structures 260a-260f are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxial structures 260a-260f may be separated from each other as shown in FIGS. 5B and 5C or be merged together. In some embodiments, the epitaxial structures 260a-260f are source/drain epitaxial structures. In some embodiments, where an N-type device is desired, the epitaxial structures 260a-260f may include an epitaxially growing silicon phosphorus (SiP) or silicon carbon (SiC). In some embodiments, where a P-type device is desired, the epitaxial structures 260a-260f may include an epitaxially growing silicon germanium (SiGe). The epitaxial structures 260a-260f formed over the semiconductor fins 212 and 214 have different conductivity types and may be formed in different processes. The epitaxial processes include CVD deposition techniques (e.g., vapor-phase epitaxy (VPE) and/or ultra-high vacuum CVD (UHV-CVD)), molecular beam epitaxy, and/or other suitable processes. In some embodiments, the formation of the epitaxial structures 260a-260f is omitted.

Then, a first interlayer dielectric (ILD) 270 is formed over the epitaxial structures 260a-260f, the dummy gate structures 240a, 240b, and 240c, the spacer structures 250, and the isolation structure 220. The first ILD 270 may be formed by chemical vapor deposition (CVD), high-density plasma CVD, spin-on, sputtering, or other suitable methods. In some embodiments, the first ILD 270 includes silicon oxide. In some other embodiments, the first ILD 270 may include silicon oxy-nitride, silicon nitride, or a low-k material. In some embodiments, a contact etch stop layer (CESL) is conformally formed over the epitaxial structures 260a-260f, the dummy gate structures 240a, 240b, and 240c, the spacer structures 250, and the isolation structure 220 in advance, and the first ILD 270 is formed over the CESL. Then, a planarization process, such as a chemical mechanical planarization (CMP) process, is performed to planarize the first ILD 270 to expose the dummy gate structures 240a, 240b, and 240c.

Figure 6A:
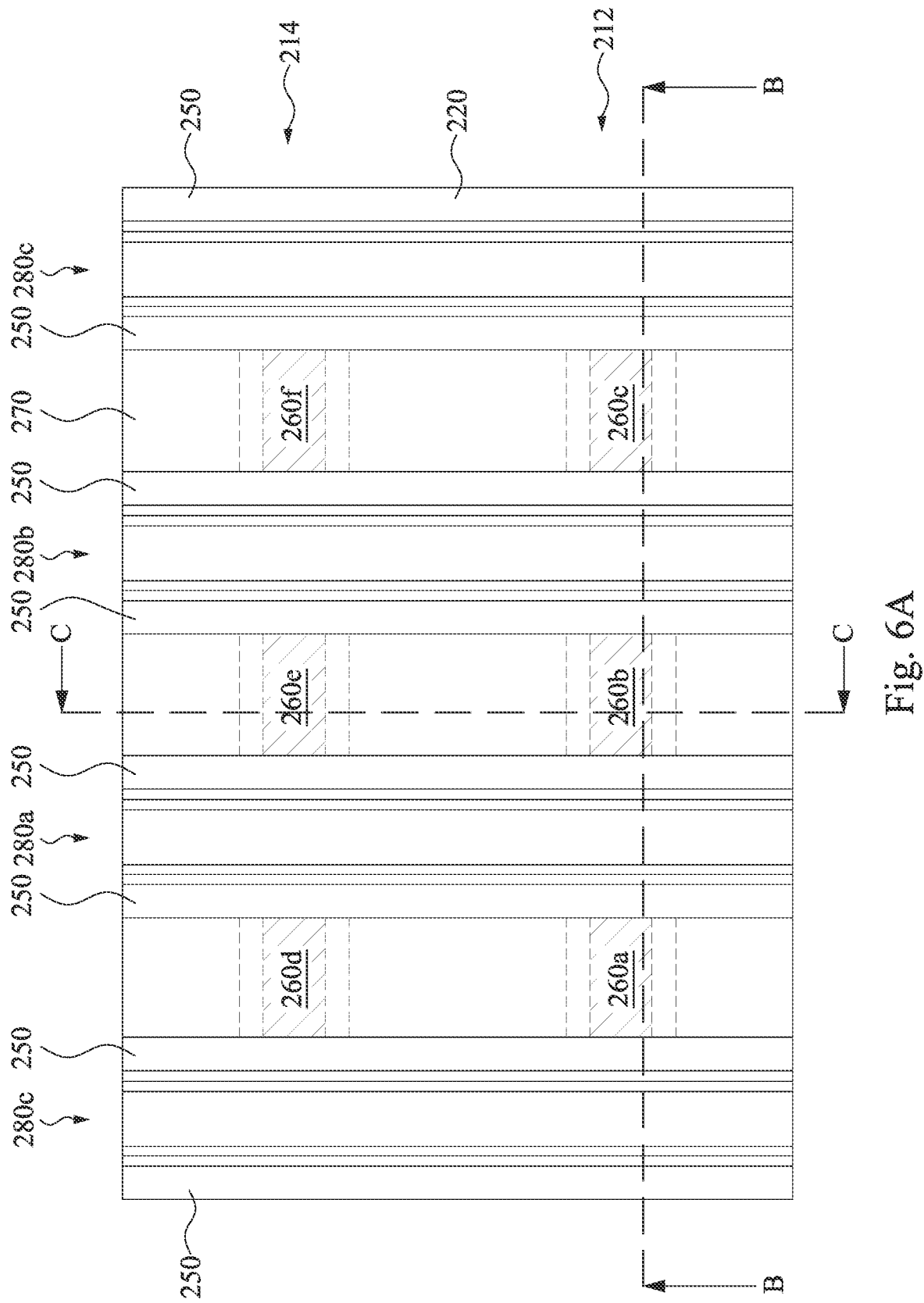
Figure 6B:
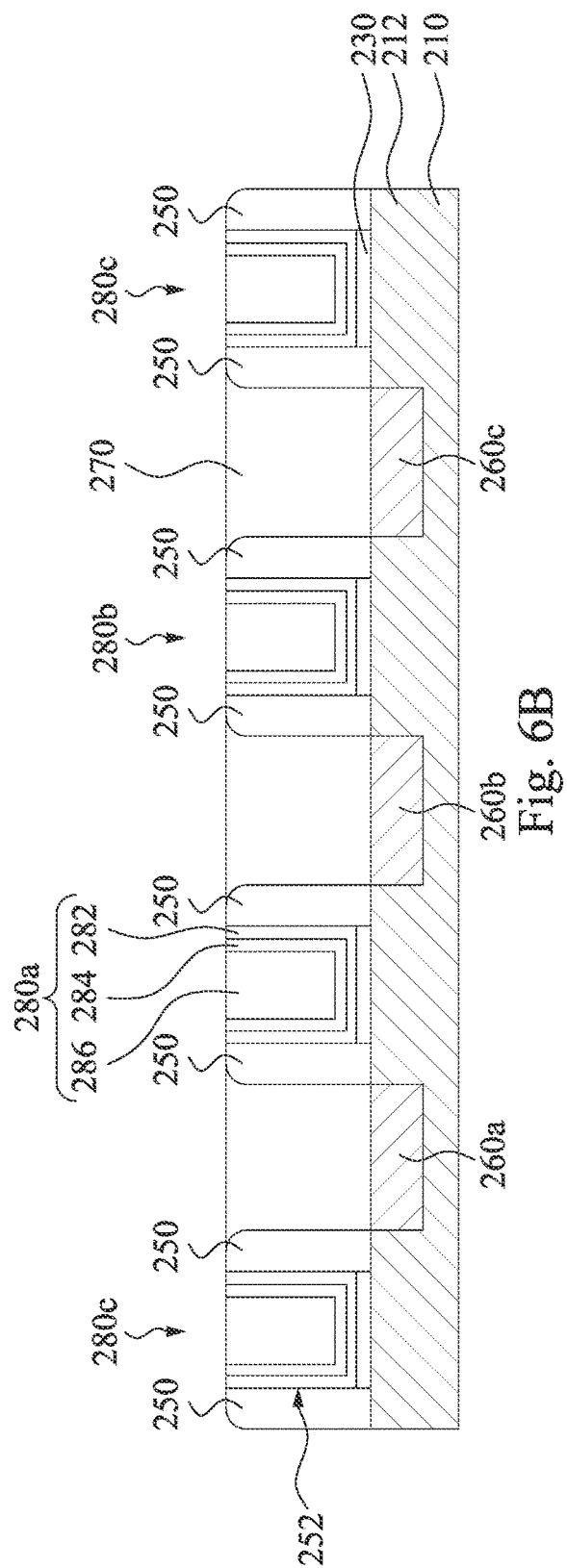
Figure 6C:
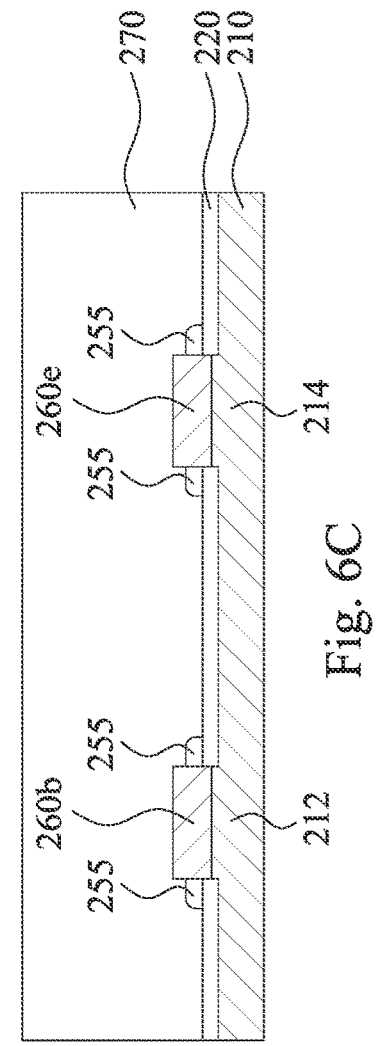

FIG. 6A is a top view of a method for manufacturing the semiconductor device 100 in FIG. 1 in various stages according to some embodiments, FIG. 6B is a cross-sectional view taking along line B-B of FIG. 6A, and FIG. 6C is a cross-sectional view taking along line C-C of FIG. 6A. Reference is made to FIGS. 6A-6C. A replacement gate (RPG) process scheme is employed. In the RPG process scheme, a dummy polysilicon gate (e.g., the dummy gate structures 240a, 240b, and 240c (see FIGS. 5A and 5B) in this case) is formed in advance and is replaced later by a metal gate. In some embodiments, the dummy gate structures 240a, 240b, and 240c are removed to form openings 252 with the spacer structures 250 as their sidewalls. In some other embodiments, the dummy dielectric layers 230 (see FIG. 5B) are removed as well. Alternatively, in some embodiments, the dummy gate structures 240a, 240b, and 240c are removed while the dummy dielectric layers 230 retain. The dummy gate structures 240a, 240b, and 240c (and the dummy dielectric layers 230) may be removed by dry etch, wet etch, or a combination of dry and wet etch.

A plurality of gate structures 280a, 280b, and 280c are then formed in the openings 252. The gate structures 280a, 280b, and 280c crosses over the semiconductor fins 212 and/or 214. The gate structures 280a and 280b may be referred to as functional gate structures, and the gate structures 280c may be referred to as dummy gate structures. In some embodiments, each of the gate structures 280a, 280b, and 280c includes a gate dielectric layer 282, at least one metal layer 284 over the gate dielectric layer 282, and a filling metal 286 over the metal layer 284.

The gate dielectric layer 282 is conformally formed in the opening 252. The gate dielectric layer 282 is over the semiconductor fins 212 and/or 214. The gate dielectric layer 282 can be a high-$\eta$ dielectric layer having a dielectric constant ($\eta$) higher than the dielectric constant of $SiO_2$, i.e. $\eta > 3.9$. The gate dielectric layer 282 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials. The gate dielectric layer 282 is deposited by suitable techniques, such as ALD, CVD, PVD, thermal oxidation, combinations thereof, or other suitable techniques.

The metal layer 284 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal layer 284 is a p-type metal gate including a p-type work function metal layer. In some embodiments, the capping layer in the metal layer 284 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the filling metal 286 may include tungsten (W) or other suitable conductive materials. The filling metal 286 may be deposited by ALD, PVD, CVD, or other suitable process.

Figure 7A:
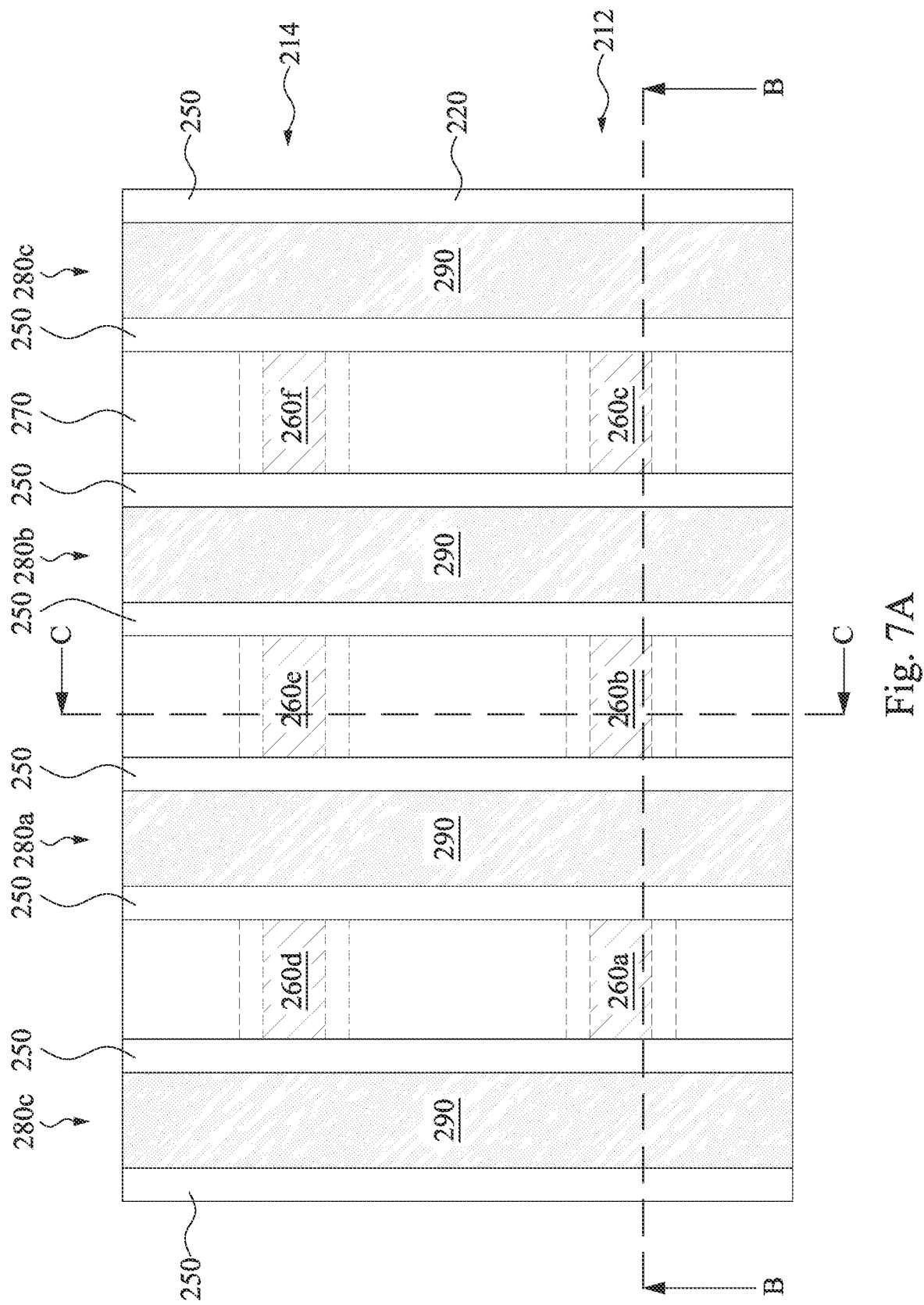
Figure 7B:
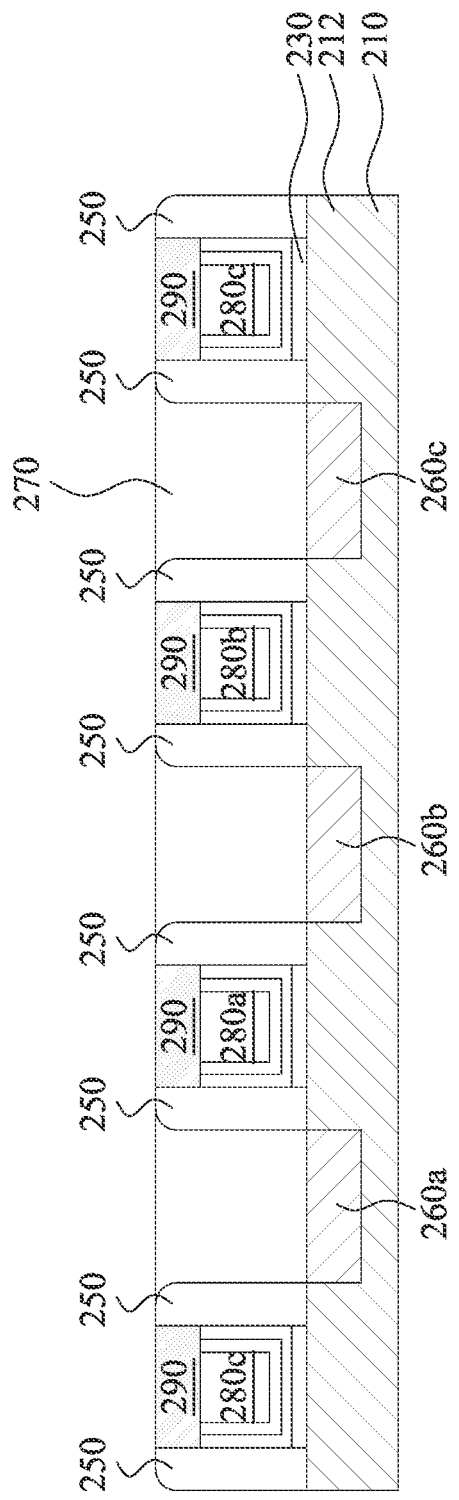
Figure 7C:
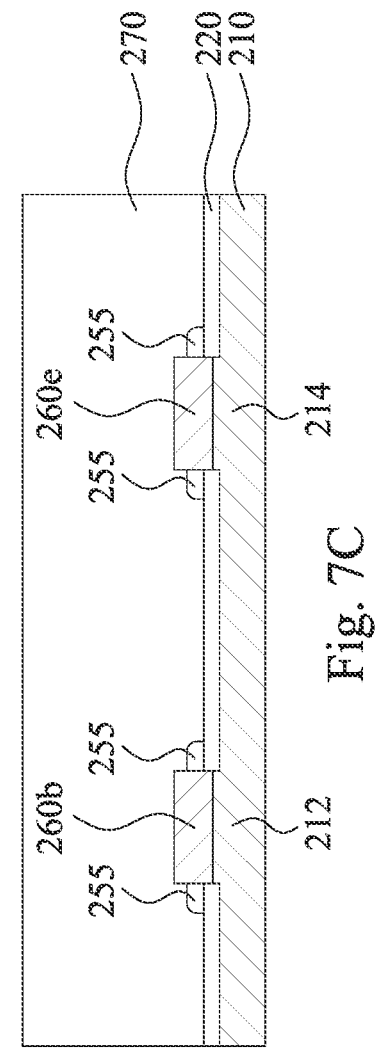

FIG. 7A is a top view of a method for manufacturing the semiconductor device 100 in FIG. 1 in various stages according to some embodiments, FIG. 7B is a cross-sectional view taking along line B-B of FIG. 7A, and FIG. 7C is a cross-sectional view taking along line C-C of FIG. 7A. Reference is made to FIGS. 7A-7C. In some embodiments, the gate structures 280a, 280b, and 280c are etched back to a predetermined level and form gate trenches thereon. Then, capping layers 290 are respectively formed over the etched gate structures 280a, 280b, and 280c using, for example, a deposition process to deposit a dielectric material over the substrate 210, followed by a CMP process to remove excess dielectric material outside the gate trenches. In some embodiments, the capping layer 290 includes silicon nitride or other suitable dielectric material. By way of example, if the capping layer 290 is SiN, the spacer structures 250 and/or the first ILD 270 are dielectric materials different from SiN. The capping layer 290 can be used to define self-aligned contact region and thus referred to as SAC structures or a SAC layer.

Figure 8B:
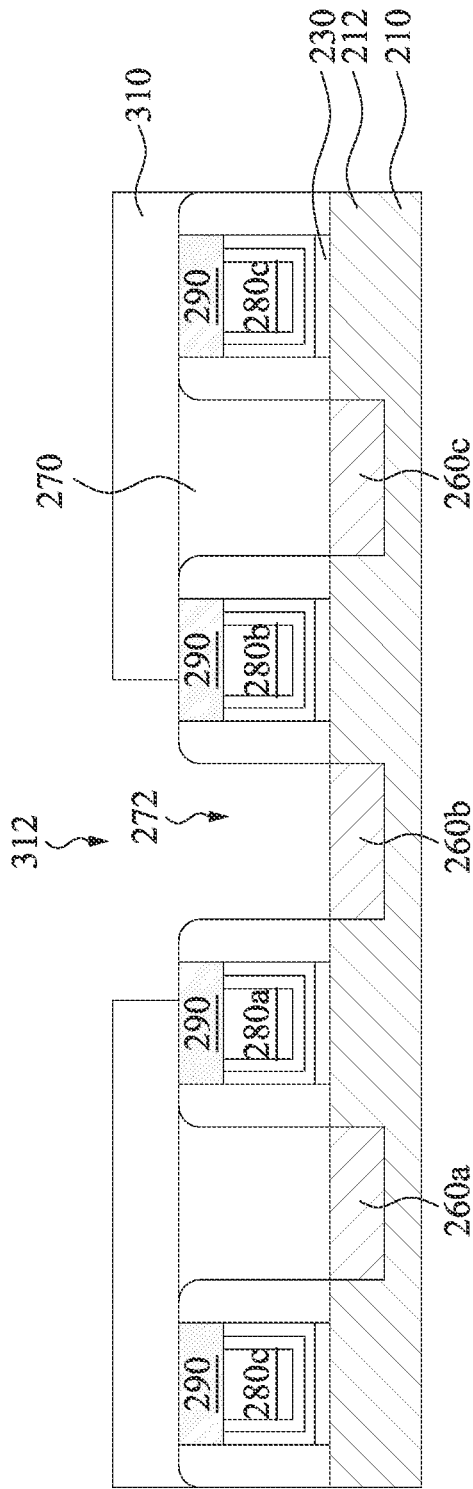
Figure 8C:
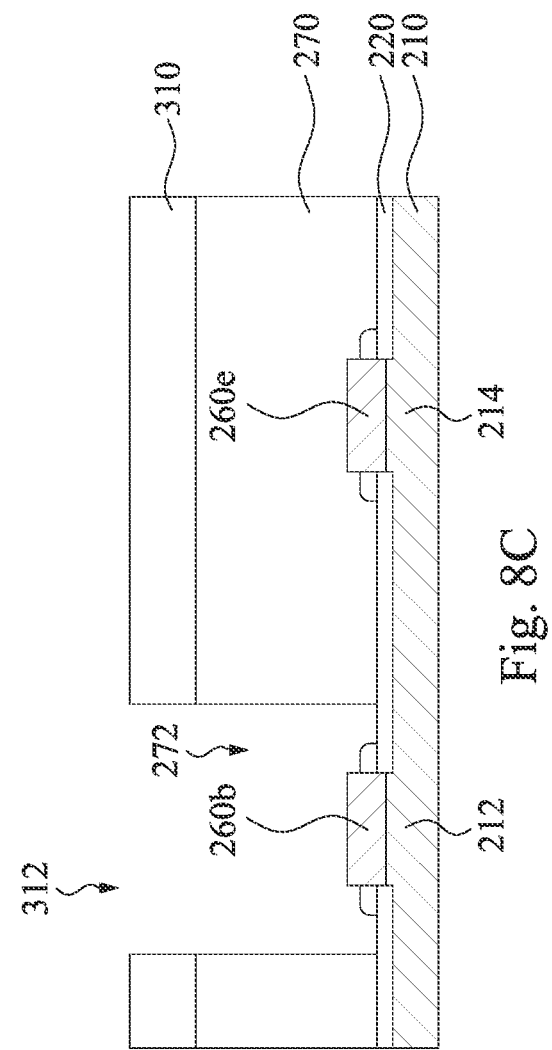

FIG. 8A is a top view of a method for manufacturing the semiconductor device 100 in FIG. 1 in various stages according to some embodiments, FIG. 8B is a cross-sectional view taking along line B-B of FIG. 8A, and FIG. 8C is a cross-sectional view taking along line C-C of FIG. 8A. Reference is made to FIGS. 8A-8C. A mask layer 310 is formed over the structure of FIG. 7A, and an opening 312 is formed therein. The opening 312 is over the epitaxial structure 260b, which is configured to be the shared source/drain 114 mentioned in FIG. 1. The opening 312 exposes a portion of the first ILD 270, portions of the spacer structure 250, and portions of the capping layer 290.

Then, the portion of the first ILD 270 uncovered by the mask layer 310 and exposed by the opening 312 is removed to expose the epitaxial structure 260b (and the spacer residues 255 and may be portions of the isolation structure 220 in some embodiments), such that another opening 272 is formed in the first ILD 270. In some embodiments, since the spacer structure 250 and the capping layer 290 have different etching rates from the first ILD 270, the spacer structure 250 and the capping layer 290 are not etched or barely etched during this process.

Figure 9A:
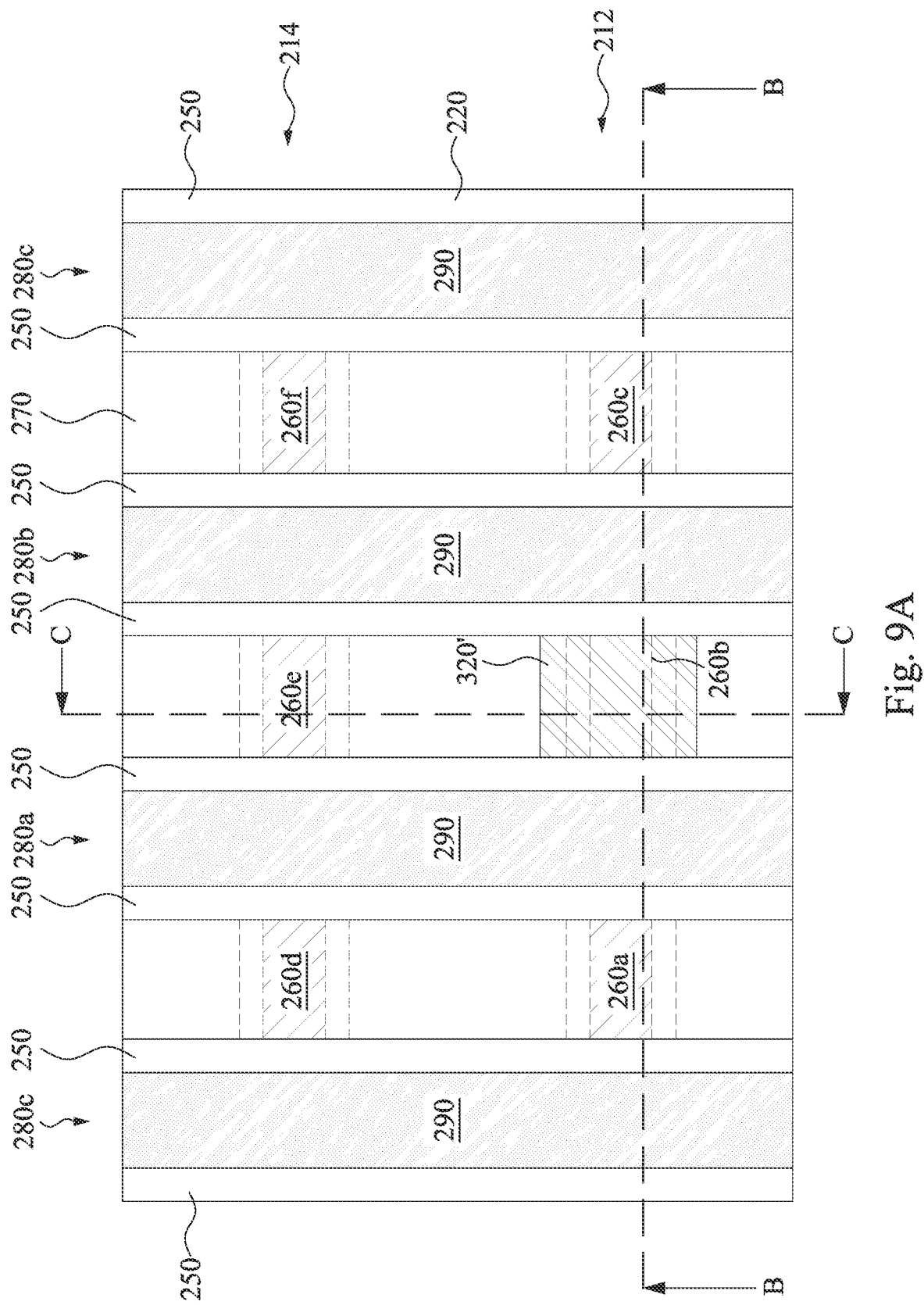
Figure 9B:
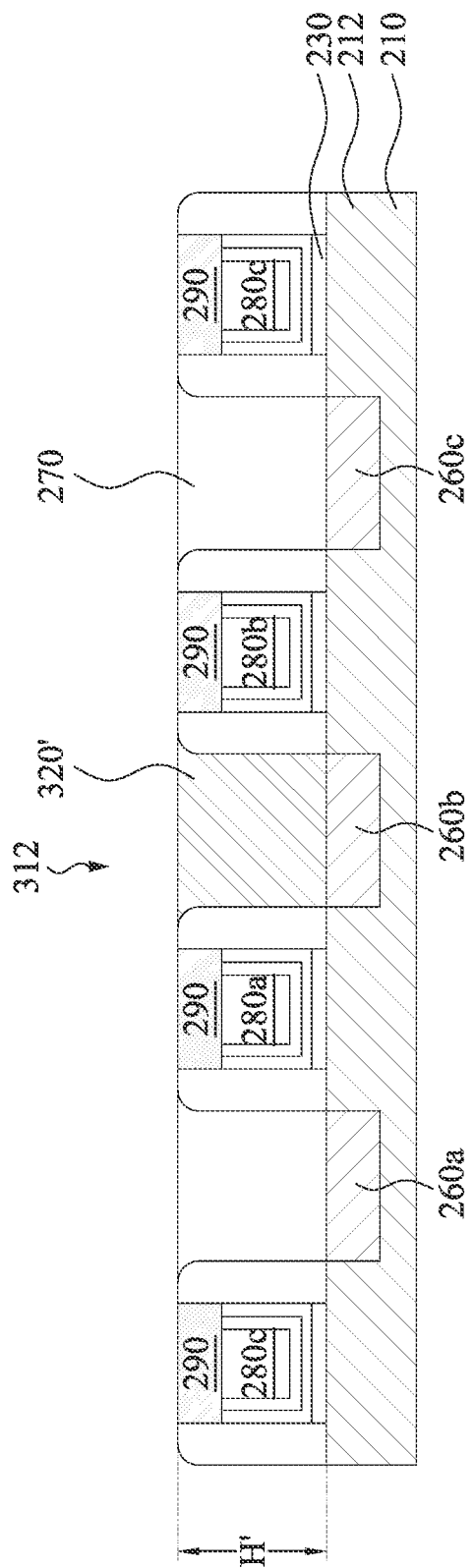
Figure 9C:
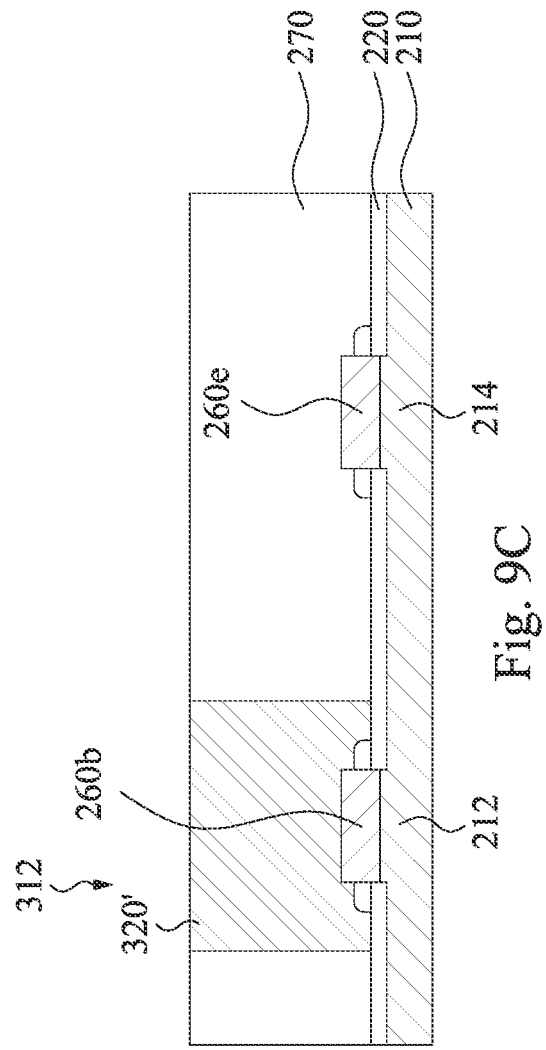

FIG. 9A is a top view of a method for manufacturing the semiconductor device 100 in FIG. 1 in various stages according to some embodiments, FIG. 9B is a cross-sectional view taking along line B-B of FIG. 9A, and FIG. 9C is a cross-sectional view taking along line C-C of FIG. 9A. Reference is made to FIGS. 9A-9C. An isolation material 320' is filled in the opening 272. In some embodiments, the isolation material 320' is a dielectric material such as $SiO_2$, SiCN, SiSN, combinations thereof, or the like. In some embodiments, the isolation material 320' includes a material different from the materials of the first ILD 270, the spacer structures 250, and the capping layers 290, such that the isolation material 320' and other structures (the first ILD 270, the spacer structures 250, and the capping layers 290) have different etching rates.

Figure 10A:
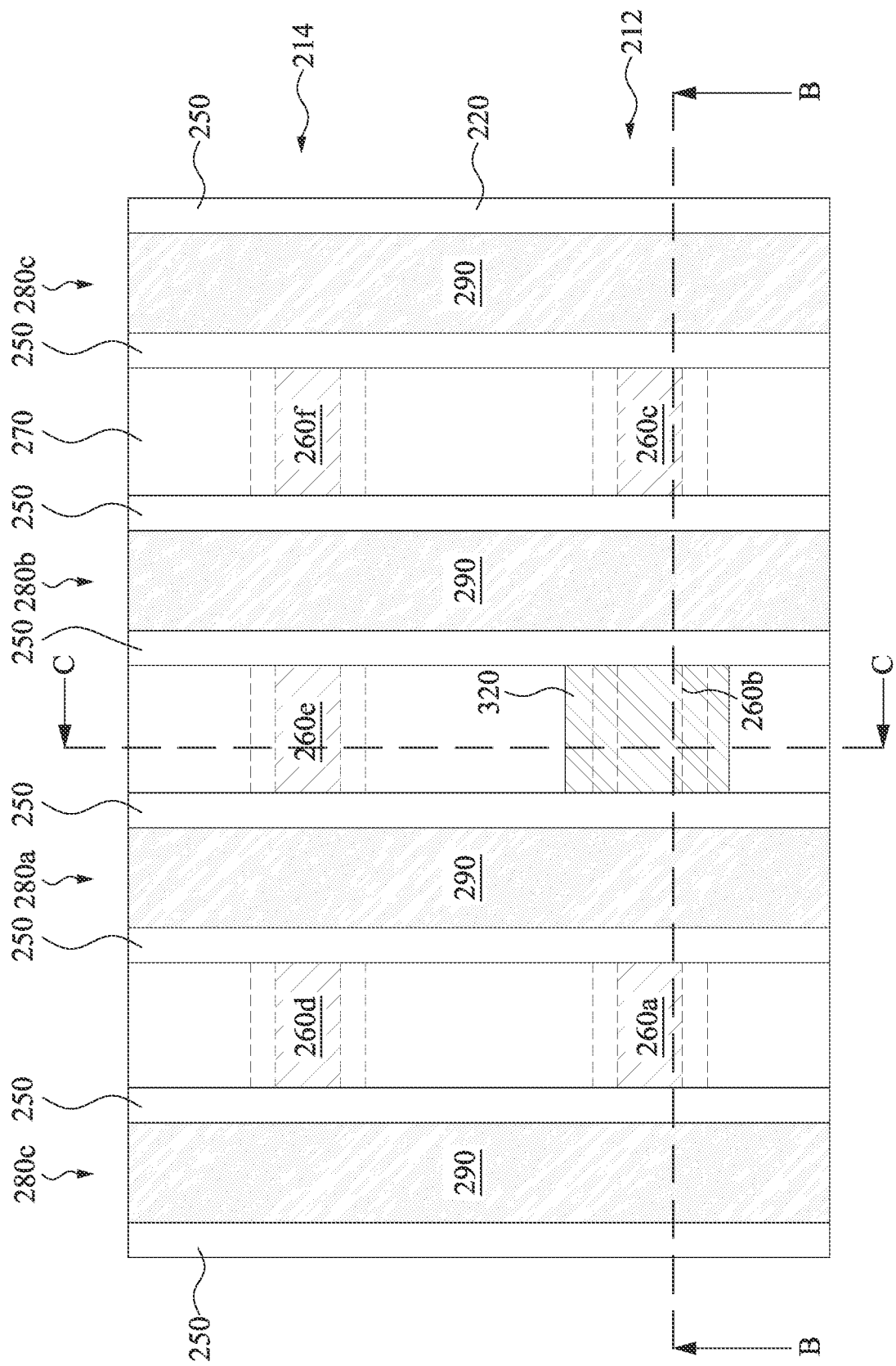
Figure 10B:
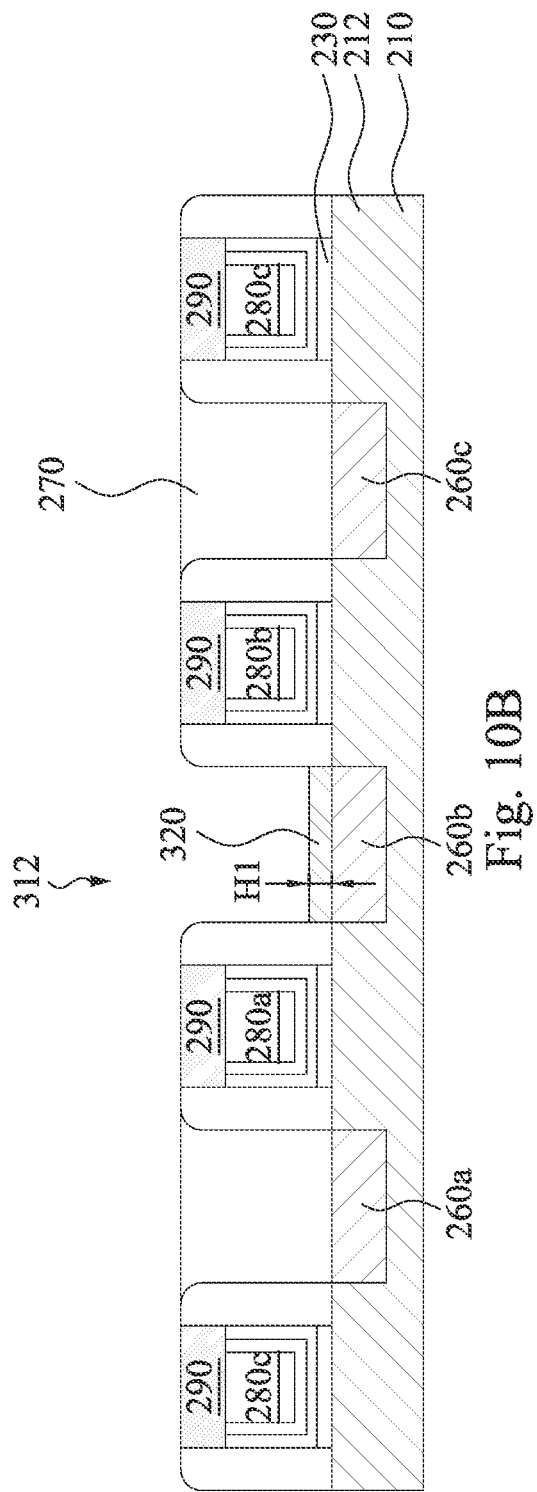
Figure 10C:
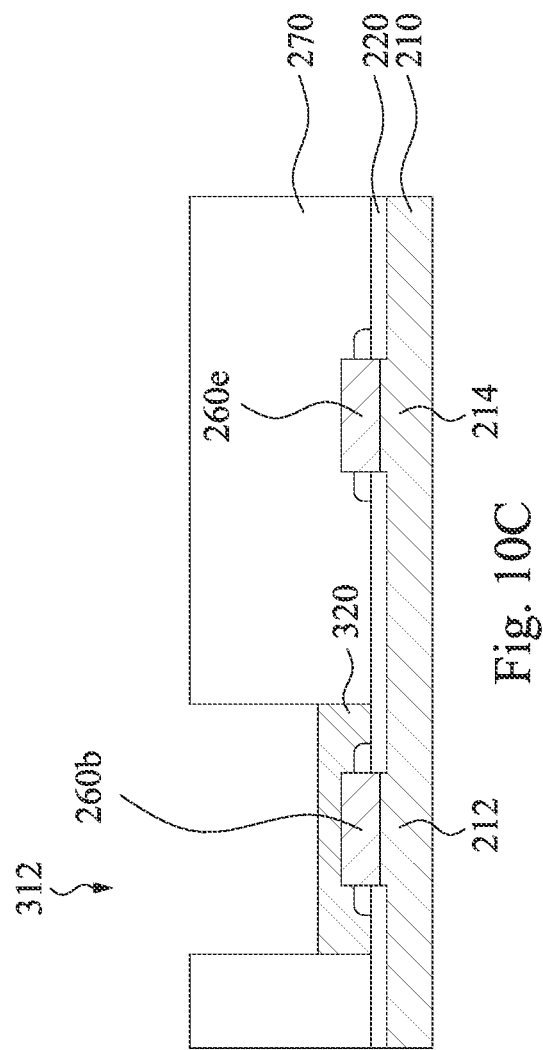

FIG. 10A is a top view of a method for manufacturing the semiconductor device 100 in FIG. 1 in various stages according to some embodiments, FIG. 10B is a cross-sectional view taking along line B-B of FIG. 10A, and FIG. 10C is a cross-sectional view taking along line C-C of FIG. 10A. Reference is made to FIGS. 10A-10C. The isolation material 320' is etched back to be an isolation layer 320. In some embodiments, since the spacer structure 250, the capping layer 290, and first ILD 270 have different etching rates from the isolation layer 320, the spacer structure 250, the capping layer 290, and FIRST ILD 270 are not etched or barely etched during this process.

The isolation material 320' in FIG. 9B has a height H', and a height H1 of the isolation layer 320 in FIG. 10B is about 0.05 H' to about 0.15 H'. If the height H1 of the isolation layer 320 is lower than about 0.05 H', then the isolation layer 320 may not provide sufficient isolation between the epitaxial structure 260b and the following formed MDC 350 (see FIGS. 12A-12C). If the height H1 of the isolation layer 320 is higher than about 0.15 H', then the following formed MDC 350 may have high electrical resistance over the isolation layer 320.

Figure 11A:
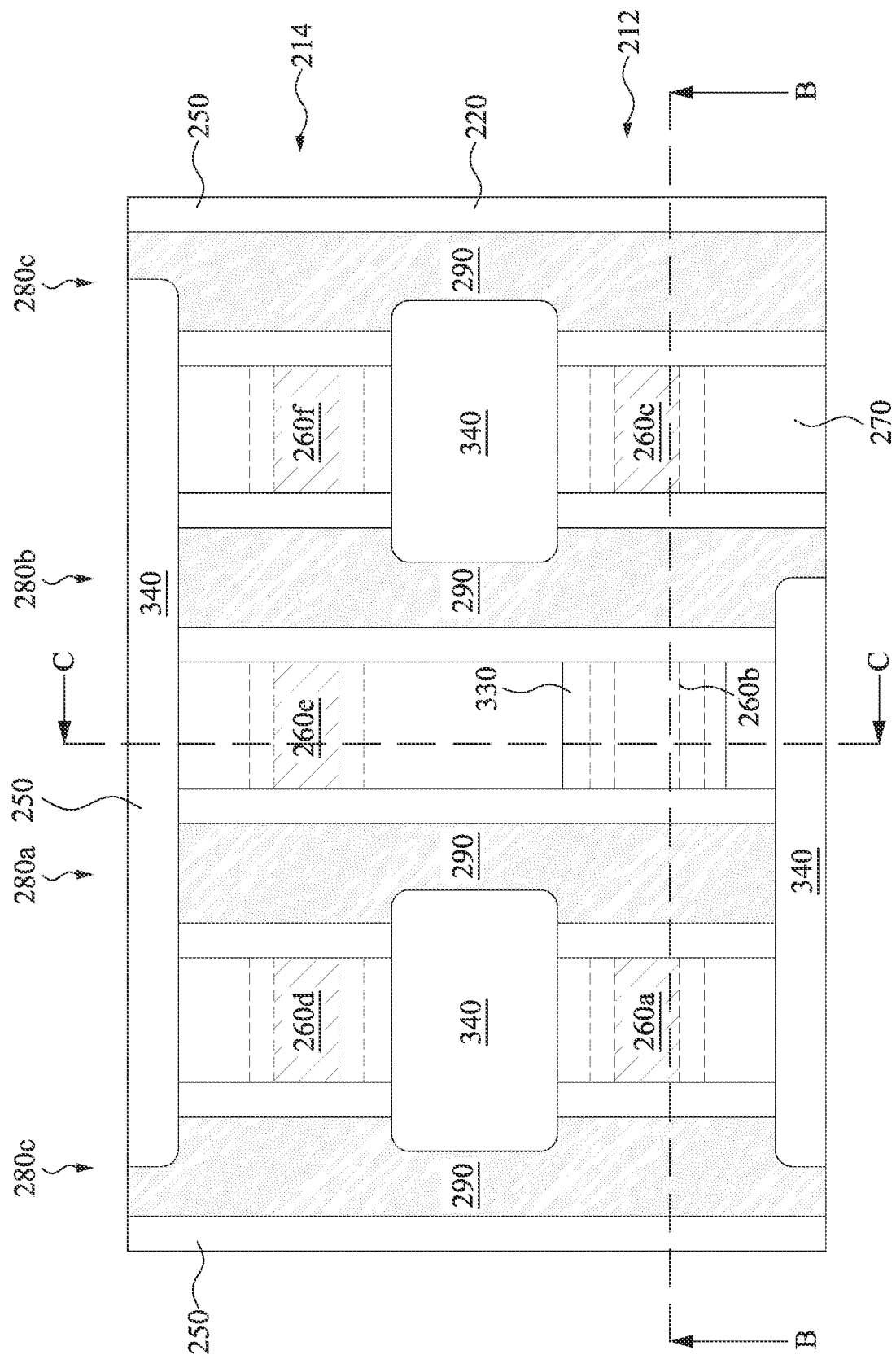

FIG. 11A is a top view of a method for manufacturing the semiconductor device 100 in FIG. 1 in various stages according to some embodiments, FIG. 11B is a cross-sectional view taking along line B-B of FIG. 11A, and FIG. 11C is a cross-sectional view taking along line C-C of FIG.

11A. Reference is made to FIGS. 11A-11C. A second ILD 330 is filled in the remaining opening 272. The second ILD 330 may be formed by chemical vapor deposition (CVD), high-density plasma CVD, spin-on, sputtering, or other suitable methods. In some embodiments, the second ILD 330 includes silicon oxide. In some other embodiments, the second ILD 330 may include silicon oxy-nitride, silicon nitride, or a low-k material. In some embodiments, the first and second ILDs 270 and 330 have substantially the same material. Then, a planarization process, such as a chemical mechanical planarization (CMP) process, is performed to planarize the second ILD 330 to expose the capping layers 290.

Then, a plurality of masks 340 are formed over portions of the first and second ILDs 270, 330, the spacer structures 250, and the capping layers 290. The masks 340 define the positions of the following formed MDC 350 and the following formed source/drain contacts 355 (see FIGS. 12A-12C). In some embodiments, a mask layer may be formed over the first and second ILDs 270, 330, the spacer structures 250, and the capping layers 290 in advance, and the mask layer is patterned to form the masks 340.

Figure 12B:
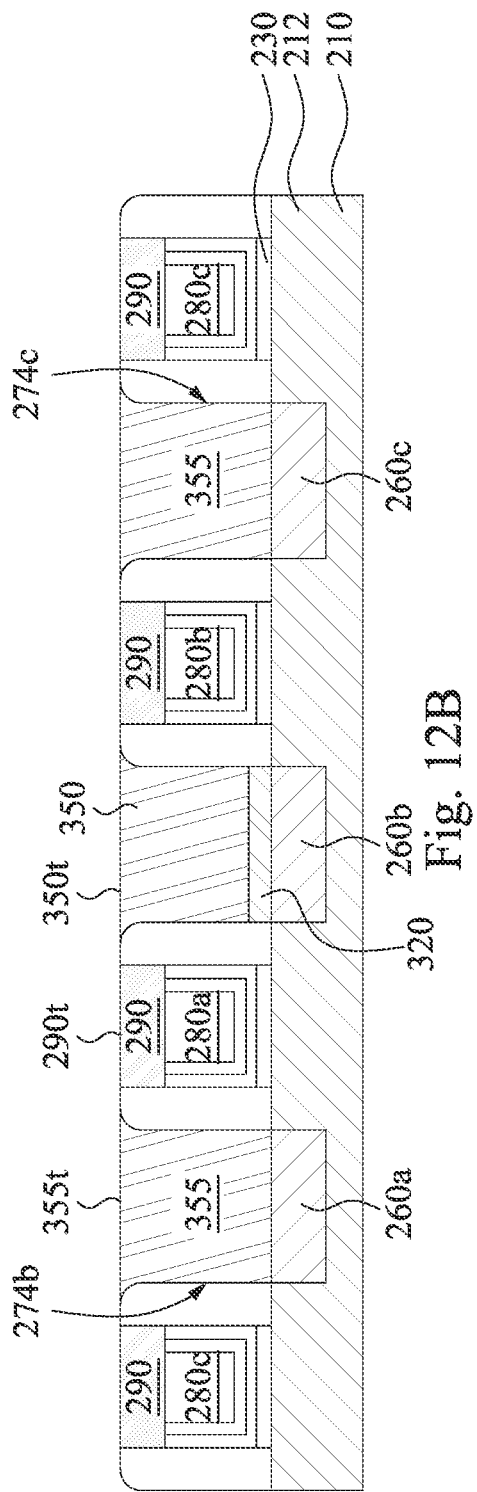
Figure 12C:
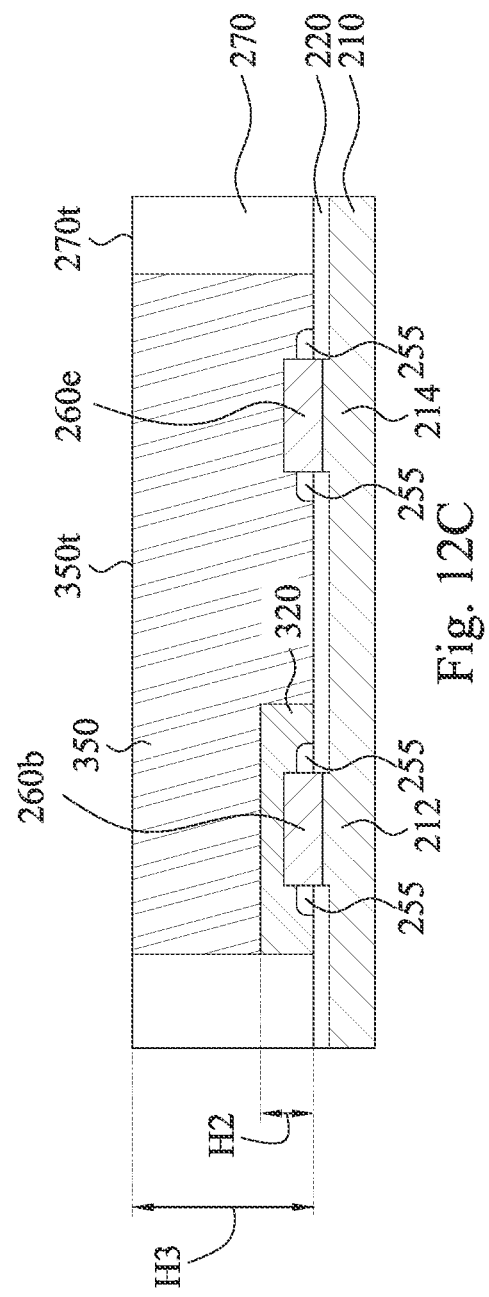

FIG. 12A is a top view of a method for manufacturing the semiconductor device 100 in FIG. 1 in various stages according to some embodiments, FIG. 12B is a cross-sectional view taking along line B-B of FIG. 12A, and FIG. 12C is a cross-sectional view taking along line C-C of FIG. 12A. Reference is made to FIGS. 12A-12C. Portions of the first ILD 270 and the second ILD 330 uncovered by the masks 340 are removed to expose the epitaxial structure 260a and 260c-260f and the isolation layer 320, such that openings 274a and 274b, 274c, 274d, and 274e are formed in the first ILD 270. The opening 274a exposes the epitaxial structure 260e and the isolation layer 320, the opening 274b exposes the epitaxial structure 260a, the opening 274c exposes the epitaxial structure 260c, the opening 274d exposes the epitaxial structure 260d, and the opening 274e exposes the epitaxial structure 260f.

Then, an MDC 350 is formed in the opening 274a and a plurality of source/drain contacts 355 are respectively formed in the openings 274b-274e. The MDC 350 is in contact with the epitaxial structure 260e and the isolation layer 320, and the source/drain contacts 355 are respectively connected to the epitaxial structures 260b-260e. In some embodiments, metal materials can be filled in the openings 274a-274e, and the excessive portions of the metal materials are removed by performing a CMP process to form the MDC 350 and the source/drain contacts 355. The MDC 350 and the source/drain contacts 355 can be made of tungsten, aluminum, copper, or other suitable materials. It is noted the routing of the source/drain contacts 355 in FIGS. 12A-12C are illustrative, and should not limit the present disclosure.

In FIG. 12A, the epitaxial structure 260a corresponds to the source/drain 112 in FIG. 1, the epitaxial structure 260b corresponds to the source/drain 114 in FIG. 1, and the gate structure 280a corresponds to the gate 118 in FIG. 1, such that the transistor 300A corresponds to the first transistor 110 in FIG. 1. Furthermore, the epitaxial structure 260c corresponds to the source/drain 122 in FIG. 1 and the gate structure 280b corresponds to the gate 128 in FIG. 1, such that the transistor 300B corresponds to the second transistor 120 in FIG. 1. Moreover, the epitaxial structure 260d or 260f corresponds to the source/drain 132 in FIG. 1, the epitaxial structure 260e corresponds to the source/drain 134 in FIG. 1, and the gate structure 280a or 280b corresponds to the gate 138 in FIG. 1, such that the transistor 300C or 300D corresponds to the third transistor 130 in FIG. 1.

In FIGS. 12B and 12C, the isolation layer 320 covers the epitaxial structure 260b (and the spacer residues 255, such that the isolation layer 320 provides good electrically isolation between the epitaxial structure 260b and the MDC 350. The isolation layer 320 is further in contact with the isolation structure 220. The MDC 350 covers the isolation layer 320 and the epitaxial structure 260e (and the spacer residues 255), such that the MDC 350 is electrically connected to the epitaxial structure 260e while electrically isolated from the epitaxial structure 260b. Due to the planarization process mentioned above, the top surface 350t of the MDC 350 is substantially coplanar with the top surface 270t of the first ILD 270, the top surface 290t of the capping layer 290, and/or the top surface 355t of the source/drain contacts 355. In FIG. 12C, the isolation layer 320 has a (maximum) height H2, and the MDC 350 has a (maximum) height H3. In some embodiments, the height H2 of the isolation layer 320 is about 0.05 H3 to about 0.15 H3. If the height H2 of the isolation layer 320 is lower than about 0.05 H3, then the isolation layer 320 may not provide sufficient isolation between the epitaxial structure 260b and the following formed MDC 350. If the height H2 of the isolation layer 320 is higher than about 0.15 H3, then the MDC 350 may have high electrical resistance over the isolation layer 320.

Figure 13A:
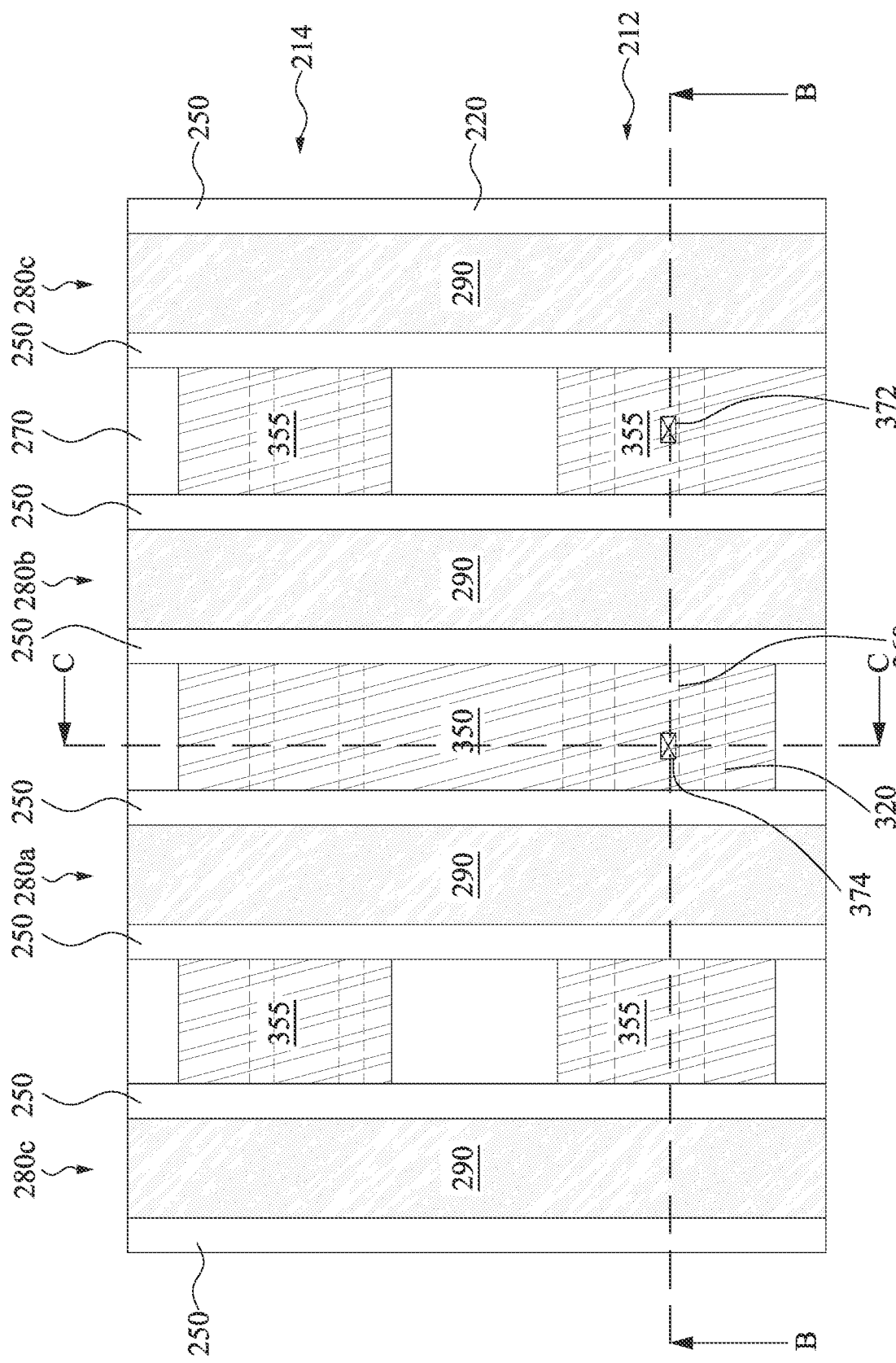

FIGS. 13A to 14C illustrate a method in various stages of manufacturing the semiconductor device 100A in FIG. 2A in accordance with some embodiments of the present disclosure. Throughout the various views and illustrative embodiments, like reference numbers are used to designate like elements. FIG. 13A is a top view of a method for manufacturing the semiconductor device 100 in FIG. 1 in various stages according to some embodiments, FIG. 13B is a cross-sectional view taking along line B-B of FIG. 13A, and FIG. 13C is a cross-sectional view taking along line C-C of FIG. 13A. The manufacturing processes of FIGS. 3A to 12C are performed in advance. Since the relevant manufacturing details are similar to FIGS. 3A to 12C, and, therefore, a description in this regard will not be repeated hereinafter. Reference is made to FIGS. 13A-13C. A third ILD 360 is formed over structure of FIG. 12A (i.e., over the capping layers 290, the spacer structures 250, the first ILD 270, the MDC 350, and the source/drain contacts 355). For clarity, the third ILD 360 is shown in FIGS. 13B and 13C and is omitted in FIG. 13A. The third ILD 360 may be formed by chemical vapor deposition (CVD), high-density plasma CVD, spin-on, sputtering, or other suitable methods. In some embodiments, the third ILD 360 includes silicon oxide. In some other embodiments, the third ILD 360 may include silicon oxy-nitride, silicon nitride, or a low-k material.

Then, vias 372 and 374 are formed in the third ILD 360. For example, a plurality of openings 362 and 364 are formed in the third ILD 360. The opening 362 exposes the source/drain contact 355 over the epitaxial structure 260a, and the opening 364 exposes the MDC 350. Then, vias 372 and 374 are respectively formed in the openings 362 and 364, such that the via 372 is electrically connected to the source/drain contact 355 over the epitaxial structure 260a, and the via 374 is electrically connected to the MDC 350. In some embodiments, metal materials can be filled in the openings 362 and 364, and the excessive portions of the metal materials are removed by performing a CMP process to form the vias 372 and 374. The vias 372 and 374 can be made of copper, tungsten, aluminum, or other suitable materials.

Figure 14A:
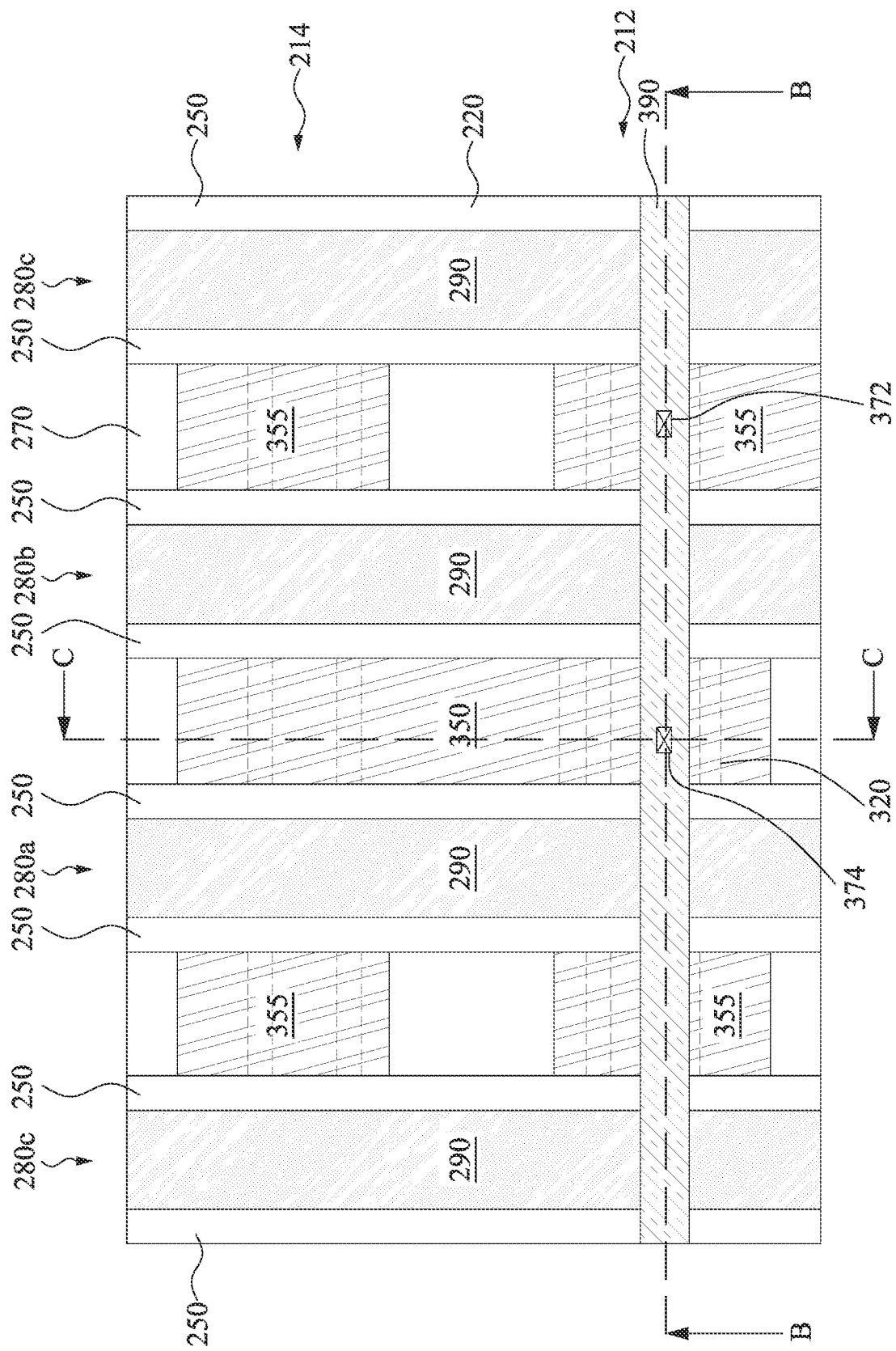
Figure 14B:
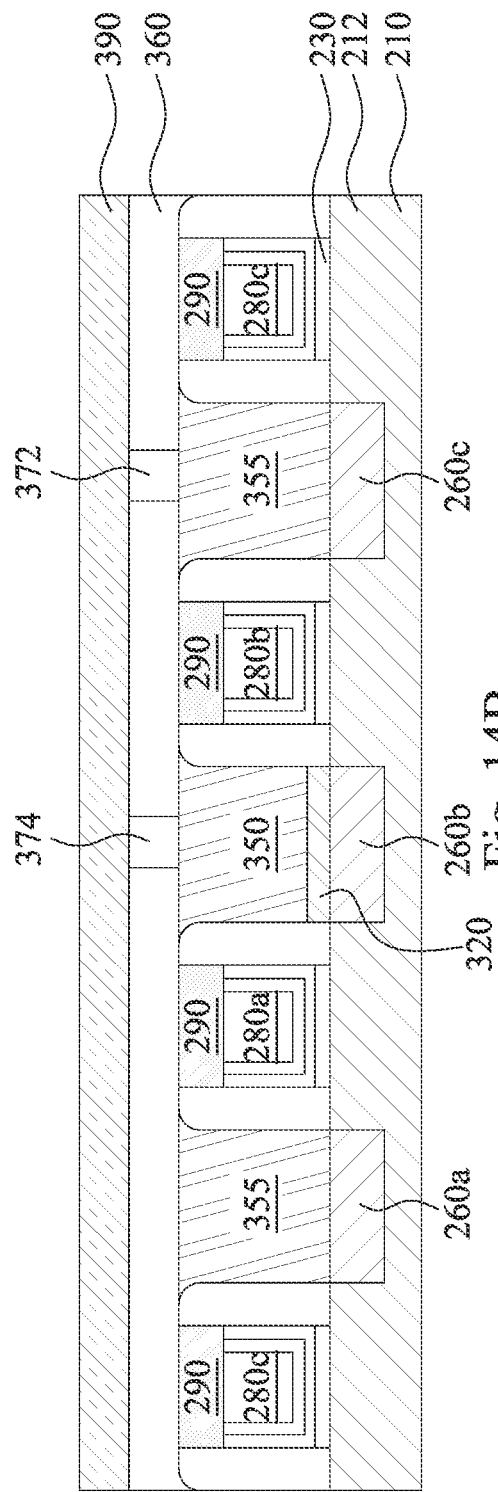
Figure 14C:
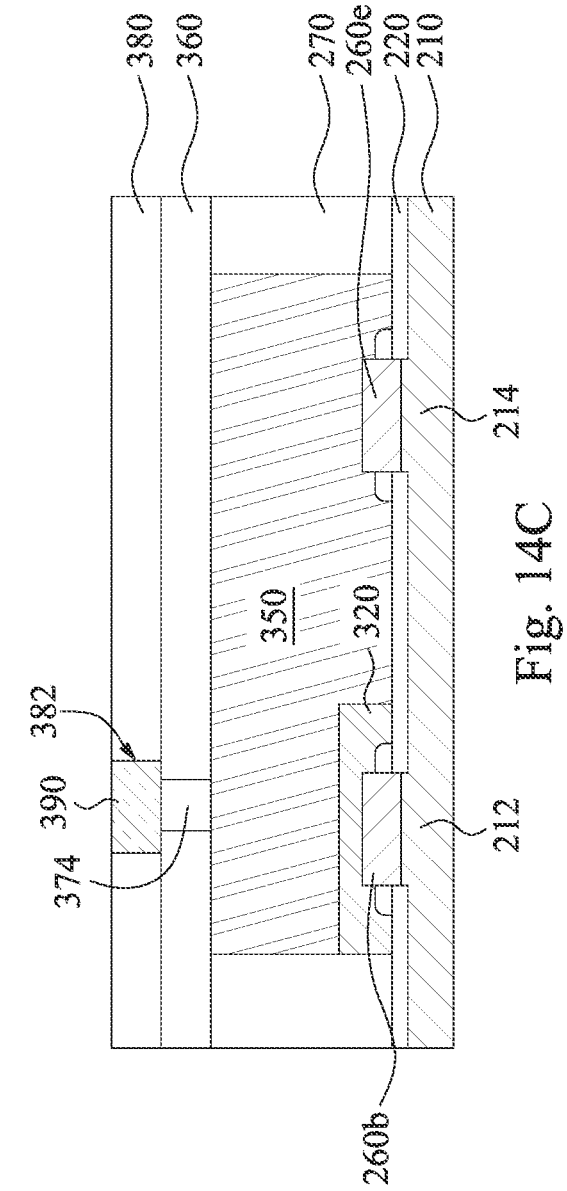

FIG. 14A is a top view of a method for manufacturing the semiconductor device 100 in FIG. 1 in various stages according to some embodiments, FIG. 14B is a cross-sectional view taking along line B-B of FIG. 14A, and FIG. 14C is a cross-sectional view taking along line C-C of FIG. 14A. Reference is made to FIGS. 14A-14C. A fourth ILD 380 is formed over structure of FIG. 13A (i.e., over the third ILD 360 and the vias 372 and 374). For clarity, the fourth ILD 380 is shown in FIG. 14C and is omitted in FIG. 14A. The fourth ILD 380 may be formed by chemical vapor deposition (CVD), high-density plasma CVD, spin-on, sputtering, or other suitable methods. In some embodiments, the fourth ILD 380 includes silicon oxide. In some other embodiments, the fourth ILD 380 may include silicon oxynitride, silicon nitride, or a low-k material.

Then, a conductive trace 390 is formed in the fourth ILD 380. For example, at least one opening 382 is formed in the fourth ILD 380. The opening 382 exposes the vias 372 and 374. Then, the conductive trace 390 is formed in the opening 382, such that the conductive trace 390 is electrically connected to the vias 372 and 374. In some embodiments, metal materials can be filled in the opening 382, and the excessive portions of the metal materials are removed by performing a CMP process to form the conductive trace 390. The conductive trace 390 can be made of copper, tungsten, aluminum, or other suitable materials.

The semiconductor device 100B in FIG. 2B may be formed using the same or similar processes shown in FIGS. 13A-14C, and the detailed description is not repeated hereinafter. Similarly, the semiconductor device 100C in FIG. 2C may be formed using the same or similar processes shown in FIGS. 3A-12C, and the detailed description is not repeated hereinafter.

Figure 15A:
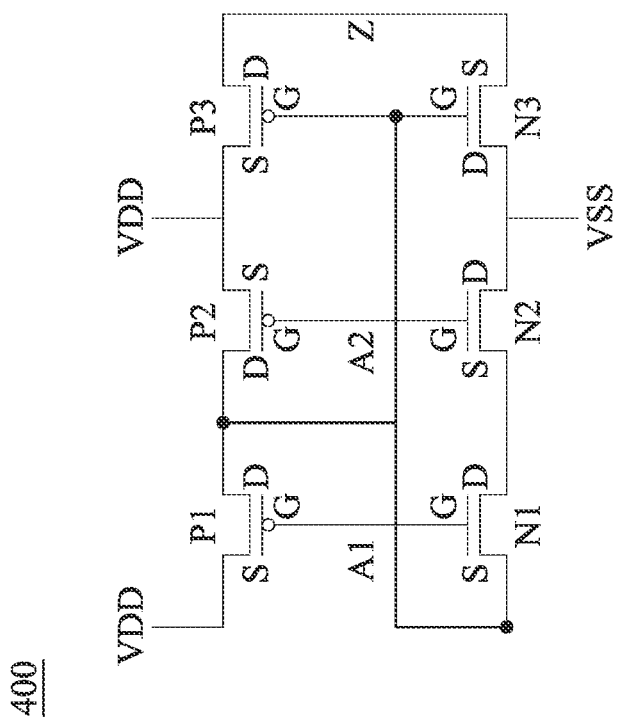
FIG. 15A is a circuit diagram of an integrated circuit, in accordance with some embodiments of the present disclosure.

The structure in FIG. 1 may be applied to various integrated circuits/circuit cells to increasing routing flexibility. FIG. 15A is a circuit diagram of an integrated circuit 400, in accordance with some embodiments of the present disclosure. The integrated circuit 400 is an AN2D1 circuit and includes NMOS transistors N1, N2, and N3 and PMOS transistors P1, P2, and P3. Each of the transistors N1, N2, N3, P1, P2, and P3 has a gate terminal G, a source terminal S, and a drain terminal D. In FIG. 15A, the transistor N1 may correspond to the first transistor 110 in FIG. 1, the transistor N2 may correspond to the second transistor 120 in FIG. 1, and the transistor P1 or P2 may correspond to the third transistor 130 in FIG. 1.

In FIG. 15A, the gate terminal G of the transistor N1 is coupled to the gate terminal G of the transistor P1 and a first input signal A1, the source terminal S of the transistor N1 is coupled to the drain terminals D of the transistors P1 and P2 and the gate terminals G of the transistors N3 and P3, and the drain terminal D of the transistor N1 is coupled to the source terminal S of the transistor N2. The gate terminal G of the transistor N2 is coupled to the gate terminal G of the transistor P2 and a second input signal A2, and the drain terminal D of the transistor N2 is coupled to the drain terminal D of the transistor N3 and a VSS signal. The source terminal S of the transistor N3 is coupled to the drain terminals D of the transistor P3 and a third input signal Z. The source terminal S of the transistor P1 is coupled to a VDD signal. The source terminal S of the transistor P2 is coupled to the source terminal S of the transistor P3 and the VDD signal. In some embodiments, the integrated circuit 400 is a single height cell. To implement the integrated circuit 400 including the MDC and the isolation layer in the embodiments of the present disclosure, embodiments of layout designs and/or structures are provided as discussed in more detail below.

Figure 15B:
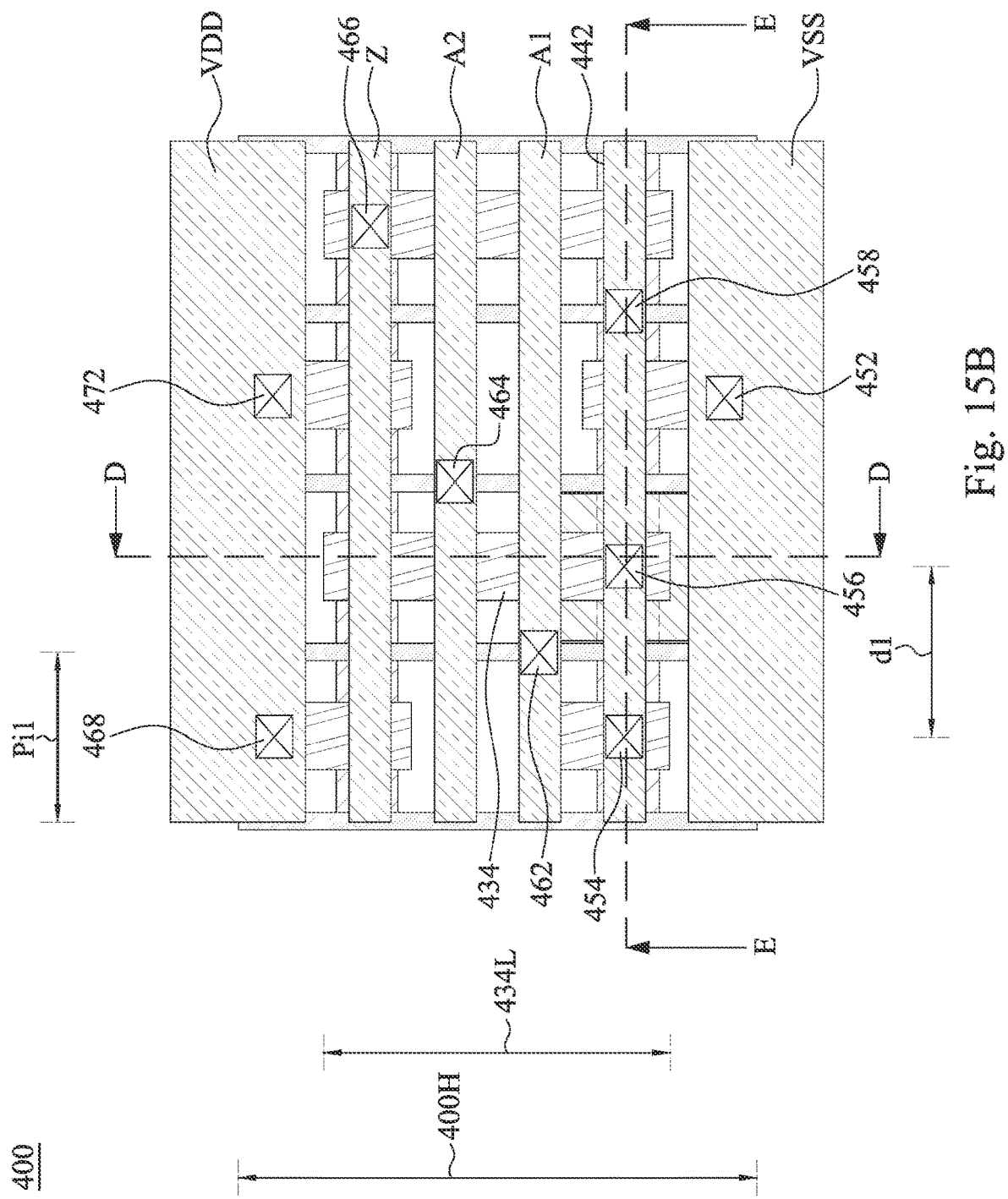
FIG. 15B is a layout diagram corresponding to the integrated circuit of FIG. 15A, in accordance with some embodiments of the present disclosure.

FIG. 15B is a layout diagram corresponding to the integrated circuit 400 of FIG. 15A, in accordance with some embodiments of the present disclosure, and FIG. 15C is a top view of the layout diagram in FIG. 15A without the conductive traces VSS, VDD, A1, A2, Z, and 442, in accordance with some embodiments of the present disclosure. In FIGS. 15B and 15C, the layout structure of the integrated circuit 400 includes semiconductor fins 412 and 414 and gates 422, 424, 426, and 428. The semiconductor fin 412 may be n-type and the semiconductor fin 414 may be p-type and extend along a first direction. The gates 422, 424, 426, and 428 crosses over the semiconductor fins 412 and 414 and extend along a second direction different from the first direction. In some embodiments, the first and second directions are substantially perpendicular to each other.

The semiconductor fin 412 includes conductive segments (e.g., fin portions or epitaxial structures) 412a, 412b, 412c, and 412d, and the semiconductor fin 414 includes conductive segments (e.g., fin portions or epitaxial structures) 414a, 414b, 414c, and 414d. The conductive segments 412a and 412b are on opposite sides of the gate 422, and the conductive segments 412a and 412b and the gate 422 together corresponds to the transistor N1. The conductive segments 412b and 412c are on opposite sides of the gate 424, and the conductive segments 412b and 412c and the gate 424 together corresponds to the transistor N2. The conductive segments 412c and 412d are on opposite sides of the gate 426, and the conductive segments 412c and 412d and the gate 426 together corresponds to the transistor N3. The conductive segments 414a and 414b are on opposite sides of the gate 422, and the conductive segments 414a and 414b and the gate 422 together corresponds to the transistor P1. The conductive segments 414b and 414c are on opposite sides of the gate 424, and the conductive segments 414b and 414c and the gate 424 together corresponds to the transistor P2. The conductive segments 414c and 414d are on opposite sides of the gate 426, and the conductive segments 414c and 414d and the gate 426 together corresponds to the transistor P3. In some embodiments, the gates 428 are dummy gates. In some other embodiments, the gates 428 are functional gates of another circuit cell adjacent the integrated circuit 400.

Figure 15D:
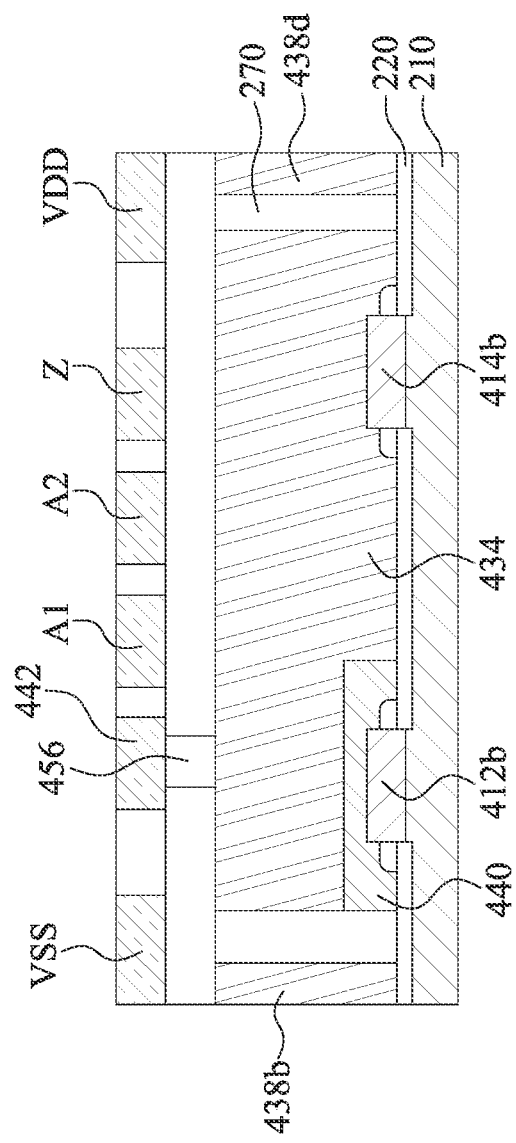
FIG. 15D is a cross-sectional view taking along line D-D in FIG. 15B.

FIG. 15D is a cross-sectional view taking along line D-D in FIG. 15B. Reference is made to FIGS. 15C and 15D. The layout structure of the integrated circuit 400 further includes a plurality of source/drain contacts 432a, 432b, 432c, and 432d, an isolation layer 440, an MDC 434, and an MD local interconnect (MDLI) 436. The source/drain contact 432a is on and in contact with the conductive segment 412a, the source/drain contact 432b is over and in contact with the conductive segment 412c, the source/drain contact 432c is over and in contact with the conductive segment 414a, and the source/drain contact 432d is over and in contact with the conductive segment 414c. The isolation layer 440 is on and in contact with the conductive segment 412b. The MDC 434 is on and in contact with the isolation layer 440 and the conductive segment 414b. The structural details of the isolation layer 440 and the MDC 434 are similar to the isolation layer 320 and the MDC 350 in FIG. 12B, and therefore, a detailed description is not repeated hereinafter. The MDLI 436 is on and in contact with the conductive segments 412d and 414d.

In some embodiments, the layout structure of the integrated circuit 400 further includes a plurality of MD segments 438a, 438b, 438c, 438d, and 438e over the isolation structures 220. The MD segments 438a-438e may extend to cells adjacent the integrated circuit 400 and be functional contacts of the adjacent cells. In some other embodiments, the MD segments 438a, 438b, 438c, 438d, and/or 438e may be omitted if the adjacent cells do not have a requirement of the MD segments 438a, 438b, 438c, 438d, and/or 438e.

Figure 15E:
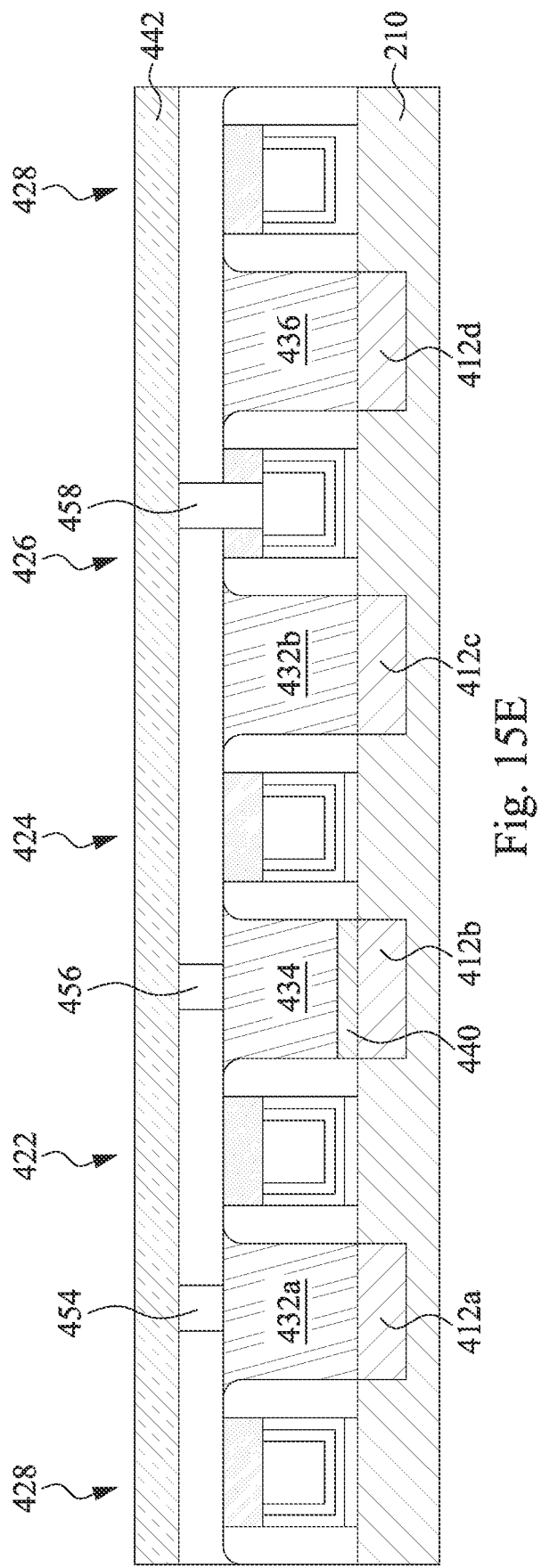
FIG. 15E is a cross-sectional view taking along line E-E in FIG. 15B.

FIG. 15E is a cross-sectional view taking along line E-E in FIG. 15B. Reference is made to FIGS. 15B, 15C, and 15E. The layout structure of the integrated circuit 400 further includes a plurality of conductive traces VSS, VDD, A1, A2, Z, and 442 and a plurality of vias 452, 454, 456, 458, 462, 464, 466, 468, and 472. The conductive traces VSS, VDD, A1, A2, Z, and 442 are over the structure of FIG. 15C. The conductive traces VSS, VDD, A1, A2, Z, and 442 are in a metal zero (M0) layer in some embodiments, and accordingly, the conductive traces VSS, VDD, A1, A2, Z, and 442 are also referred to as M0 portions in some embodiments. The conductive traces VSS, VDD, A1, A2, Z, and 442 extend along the first direction, i.e., substantially parallel to the semiconductor fins 412 and 414 and/or substantially perpendicular to the gates 422, 424, 426, and 428.

The conductive trace VSS is coupled to the source/drain contact 432b through the via 452. The conductive trace 442 is coupled to the source/drain contact 432a through the via 454, coupled to the MDC 434 through the via 456, and coupled to the gate 426 through the via 458. In some embodiments, the conductive trace 442 may be referred to as an internal signal trace. The conductive trace A1 is coupled to the gate 422 through the via 462. The conductive trace A2 is coupled to the gate 424 through the via 464. The conductive trace Z is coupled to the MDLIs 436 through the via 466. The conductive trace VDD is coupled to the source/drain contact 432c through the via 468 and coupled to the source/drain contact 432d through the via 472.

In FIGS. 15B and 15C, the integrated circuit 400 has a cell height 400H, which may be defined by a distance between (centers of) the conductive traces VSS and VDD. The MDC 434 has a length 434L. In some embodiments, the length 434L is in a range of about 0.5 times of the height 400H to about 0.75 times of the height 400H. If the length 434L is shorter than about 0.5 times of the height 400H, the MDC 434 may not successfully interconnects the conductive segment 414b and the conductive trace 442, and if the length 434L is greater than about 0.75 times of the height 400H, the MDC 434 and adjacent MD segments 438b and/or 438d may have short problems. Further, a distance d1 is formed between the vias 454 and 456, and adjacent gates 422, 424, 426, and 428 have a pitch Pi1. In some embodiments, the distance d1 between the vias 454 and 456 is about n*Pi1, where n is integer. In the case of FIG. 15B, n is equal to 1. In some embodiments, the conductive segments 414a and 414c are connected to the same conductive trace, such that they have the same potential. For example, the conductive segments 414a and 414c are connected to the conductive trace VDD in the case of FIG. 15B. Further, the conductive segment 412a is connected to the conductive segment 414b.

In FIG. 15B, the integrated circuit 400 includes four M0 conductive traces (A1, A2, Z and 442 except the VSS and VDD traces) and there is no M1 conductive trace since the M1 conductive trace is replaced by the MDC. This configuration is benefit for the reducing of the layout area. In addition, the configuration of the four M0 conductive traces (A1, A2, Z and 442) are symmetric with relative to a center line of the integrated circuit 400 (i.e., the gate 424 in this case). As such, the four M0 conductive traces have the same configuration under different cell orientations, which means all of the vias formed on the M0 conductive traces in one orientation can also be formed on the M0 conductive traces in another cell orientation. Furthermore, since there is no M1 conductive trace used in the integrated circuit 400, adjacent cells (or integrated circuits) can be abut to each other, and the overall layout area can be further reduced. Also, the interconnection usage on the M1 and higher layers can be increased and more flexible.

Figure 16A:
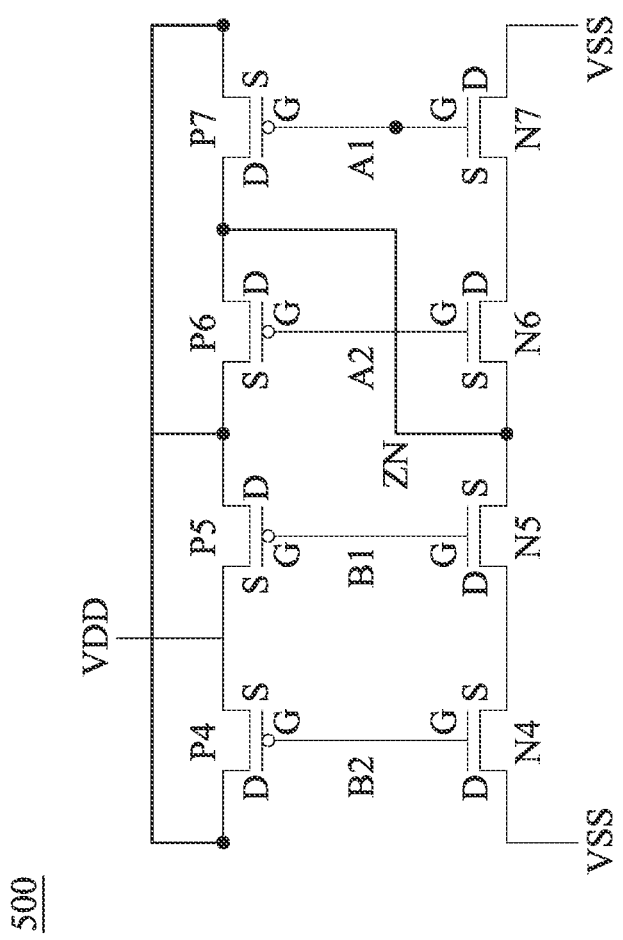
FIG. 16A is a circuit diagram of an integrated circuit, in accordance with some embodiments of the present disclosure.

FIG. 16A is a circuit diagram of an integrated circuit 500, in accordance with some embodiments of the present disclosure. The integrated circuit 500 is an AOI22D1 circuit and includes NMOS transistors N4, N5, N6, and N7 and PMOS transistors P4, P5, P6, and P7. Each of the transistors N4, N5, N6, N7, P4, P5, P6, and P7 has a gate terminal G, a source terminal S, and a drain terminal D. In FIG. 16A, the transistor N7 may correspond to the first transistor 110 in FIG. 1, the transistor N6 may correspond to the second transistor 120 in FIG. 1, and the transistor P6 or P7 may correspond to the third transistor 130 in FIG. 1.

In FIG. 16A, the gate terminal G of the transistor N4 is coupled to the gate terminal G of the transistor P4 and a first input signal B2, the source terminal S of the transistor N4 is coupled to the drain terminals D of the transistor N5, and the drain terminal D of the transistor N4 is coupled to a VSS signal. The gate terminal G of the transistor N5 is coupled to the gate terminal G of the transistor P5 and a second input signal B1, and the source terminal S of the transistor N5 is coupled to the drain terminals D of the transistors P6 and P7, the source terminal S of the transistor N6, and a ZN signal. The gate terminal G of the transistor N6 is coupled to the gate terminal G of the transistor P6 and a third input signal A2, and the drain terminal D of the transistor N6 is coupled to the source terminal S of the transistor N7. The gate terminal G of the transistor N7 is coupled to the gate terminal G of the transistor P7 and a fourth input signal A1, and the drain terminal D of the transistor N7 is coupled to the VSS signal. The source terminal S of the transistor P4 is coupled to a VDD signal and the source terminal S of the transistor P5, and the drain terminal D of the transistor P4 is coupled to the drain terminal D of the transistor P5 and the source terminals S of the transistors P6 and P7. In some embodiments, the integrated circuit 500 is in a single height cell. To implement the integrated circuit 500 including the MDC and the isolation layer in the embodiments of the present disclosure, embodiments of layout designs and/or structures are provided as discussed in more detail below.

Figure 16B:
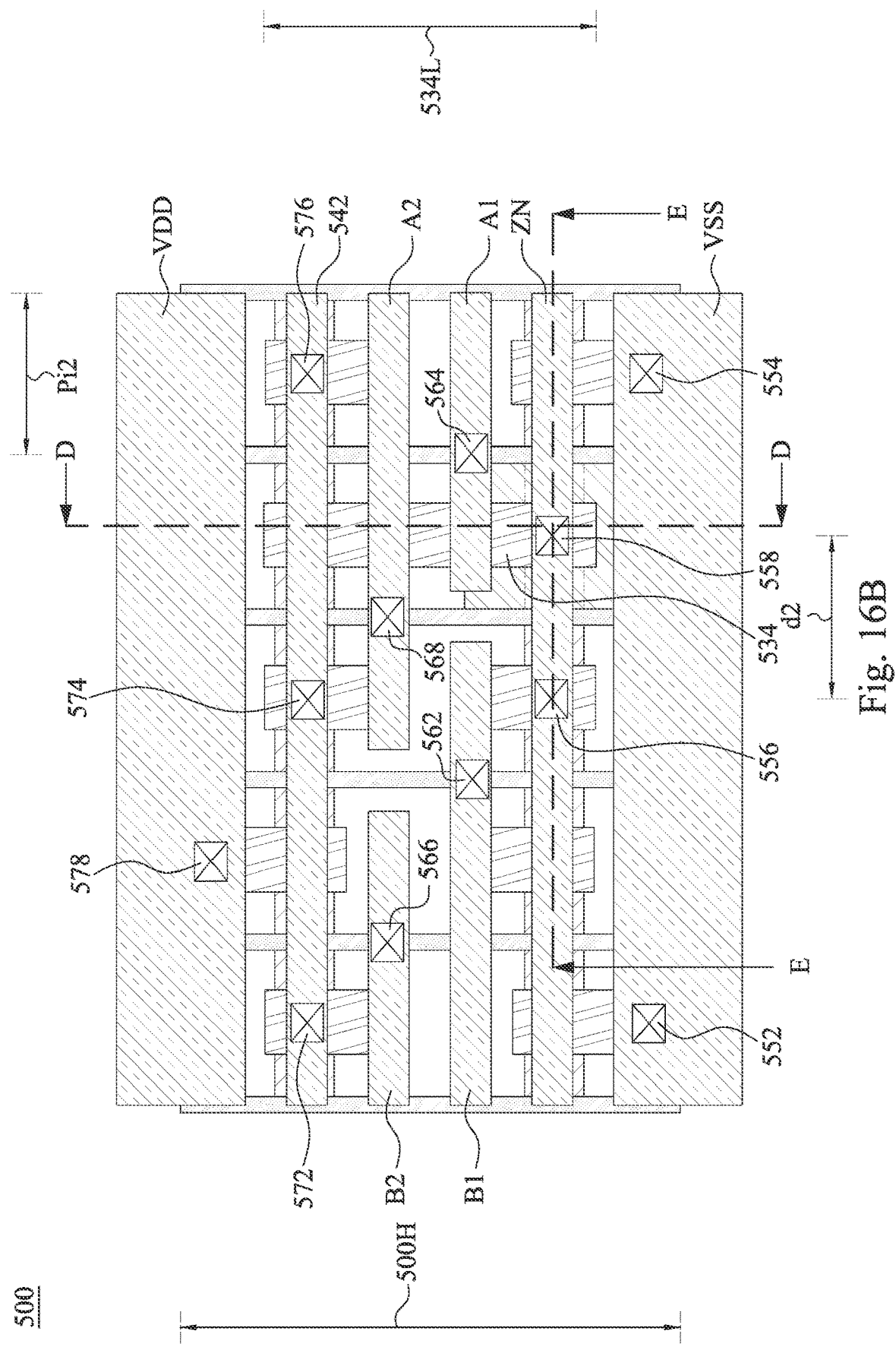
FIG. 16B is a layout diagram corresponding to the integrated circuit of FIG. 16A, in accordance with some embodiments of the present disclosure.
Figure 16C:
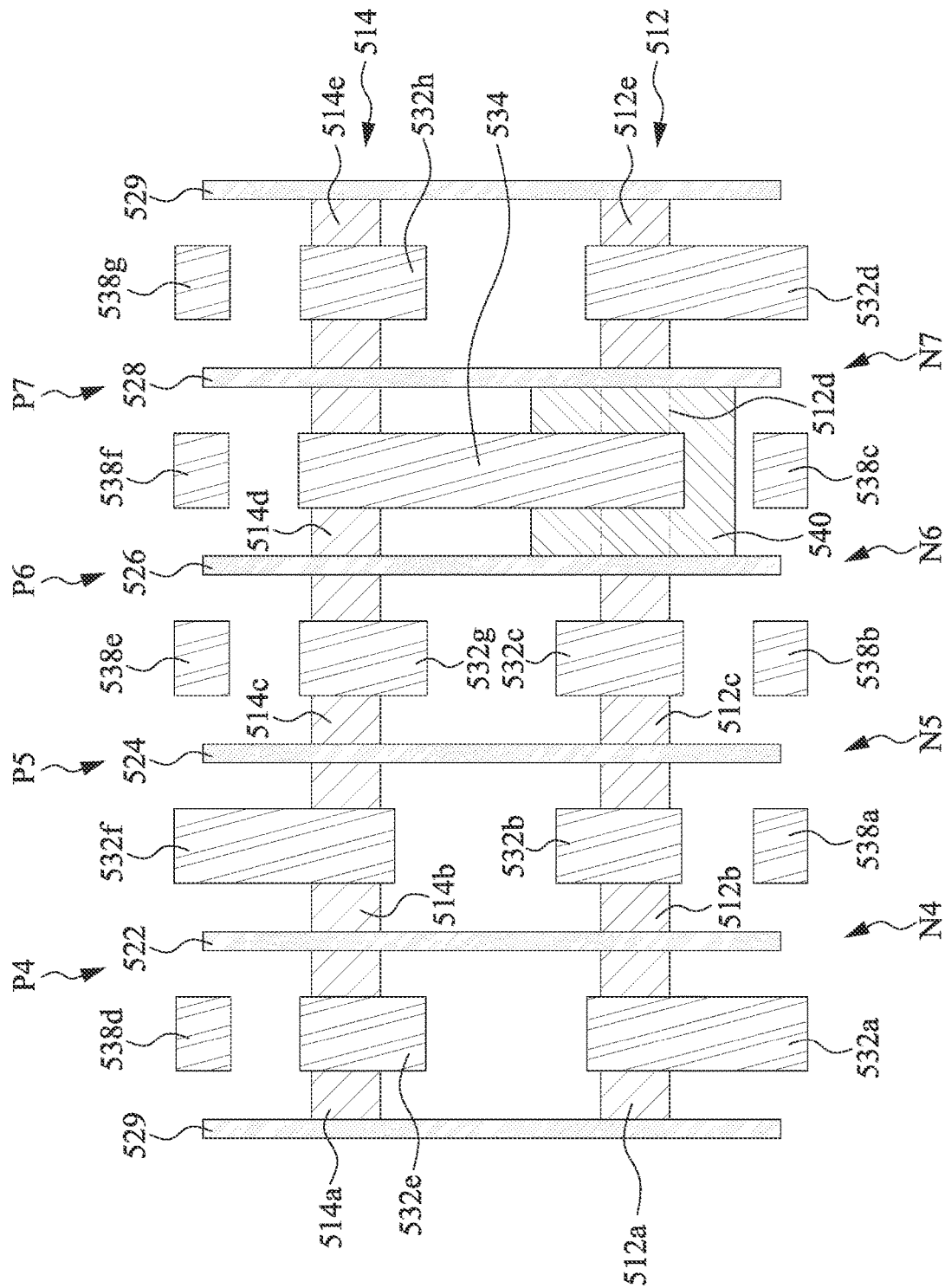
FIG. 16C is a top view of the layout diagram in FIG. 16A without the conductive traces, in accordance with some embodiments of the present disclosure.

FIG. 16B is a layout diagram corresponding to the integrated circuit 500 of FIG. 16A, in accordance with some embodiments of the present disclosure, and FIG. 16C is a top view of the layout diagram in FIG. 16A without the conductive traces VSS, VDD, A1, A2, B1, B2, ZN, and 542, in accordance with some embodiments of the present disclosure. In FIGS. 16B and 16C, the layout structure of the integrated circuit 500 includes semiconductor fins 512 and 514 and gates 522, 524, 526, 528, and 529. The semiconductor fin 512 may be n-type and the semiconductor fin 514 may be p-type and extend along a first direction. The gates 522, 524, 526, 528, and 529 crosses over the semiconductor fins 512 and 514 and extend along a second direction different from the first direction. In some embodiments, the first and second directions are substantially perpendicular to each other.

The semiconductor fin 512 includes conductive segments (e.g., fin portions or epitaxial structures) 512a, 512b, 512c, 512d, and 512e, and the semiconductor fin 514 includes conductive segments (e.g., fin portions or epitaxial structures) 514a, 514b, 514c, 514d, and 514e. The conductive segments 512a and 512b are on opposite sides of the gate 522, and the conductive segments 512a and 512b and the gate 522 together corresponds to the transistor N4. The conductive segments 512b and 512c are on opposite sides of the gate 524, and the conductive segments 512b and 512c and the gate 524 together corresponds to the transistor N5. The conductive segments 512c and 512d are on opposite sides of the gate 526, and the conductive segments 512c and 512d and the gate 526 together corresponds to the transistor N6. The conductive segments 512d and 512e are on opposite sides of the gate 528, and the conductive segments 512d and 512e and the gate 528 together corresponds to the transistor N7. The conductive segments 514a and 514b are on opposite sides of the gate 522, and the conductive segments 514a and 514b and the gate 522 together corresponds to the transistor P4. The conductive segments 514b and 514c are on opposite sides of the gate 524, and the conductive segments 514b and 514c and the gate 524 together corresponds to the transistor P5. The conductive segments 514c and 514d are on opposite sides of the gate 526, and the conductive segments 514c and 514d and the gate 526 together corresponds to the transistor P6. The conductive segments 514d and 514e are on opposite sides of the gate 528, and the conductive segments 514d and 514e and the gate 528 together corresponds to the transistor P7. In some embodiments, the gates 529 are dummy gates. In some other embodiments, the gates 529 are functional gates of another circuit cell adjacent the integrated circuit 500.

Figure 16D:
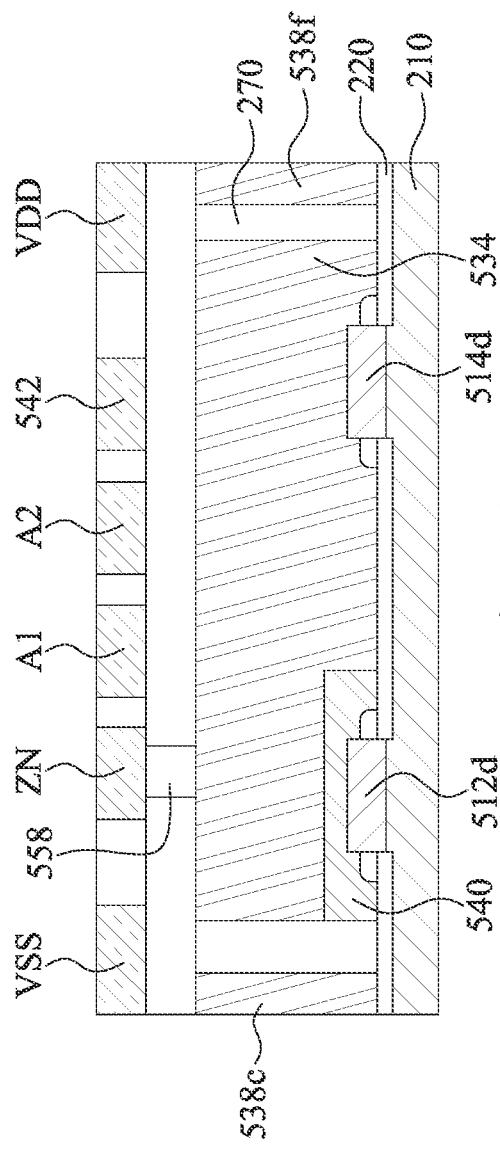
FIG. 16D is a cross-sectional view taking along line D-D in FIG. 16B.

FIG. 16D is a cross-sectional view taking along line D-D in FIG. 16B. Reference is made to FIGS. 16C and 16D. The layout structure of the integrated circuit 500 further includes a plurality of source/drain contacts 532a, 532b, 532c, 532d, 532e, 532f, 532g, and 532h, an isolation layer 540, and an MDC 534. The source/drain contact 532a is on and in contact with the conductive segment 512a, the source/drain contact 532b is over and in contact with the conductive segment 512b, the source/drain contact 532c is over and in contact with the conductive segment 512c, the source/drain contact 532d is over and in contact with the conductive segment 512e, the source/drain contact 532e is over and in contact with the conductive segment 514a, the source/drain contact 532f is over and in contact with the conductive segment 514b, the source/drain contact 532g is over and in contact with the conductive segment 514c, and the source/drain contact 532h is over and in contact with the conductive segment 514e. The isolation layer 540 is on and in contact with the conductive segment 512d. The MDC 534 is on and in contact with the isolation layer 540 and the conductive segment 514d. The structural details of the isolation layer 540 and the MDC 534 are similar to the isolation layer 320 and the MDC 350 in FIG. 12B, and therefore, a detailed description is not repeated hereinafter.

In some embodiments, the layout structure of the integrated circuit 500 further includes a plurality of MD segments 538a, 538b, 538c, 538d, 538e, 538f, and 538g over the isolation structures 220. The MD segments 538a-538g may extend to cells adjacent the integrated circuit 500 and be functional contacts of the adjacent cells. In some other embodiments, the MD segments 538a, 538b, 538c, 538d, 538e, 538f, and/or 538g may be omitted if the adjacent cells do not have a requirement of the MD segments 538a, 538b, 538c, 538d, 538e, 538f, and/or 538g.

Figure 16E:
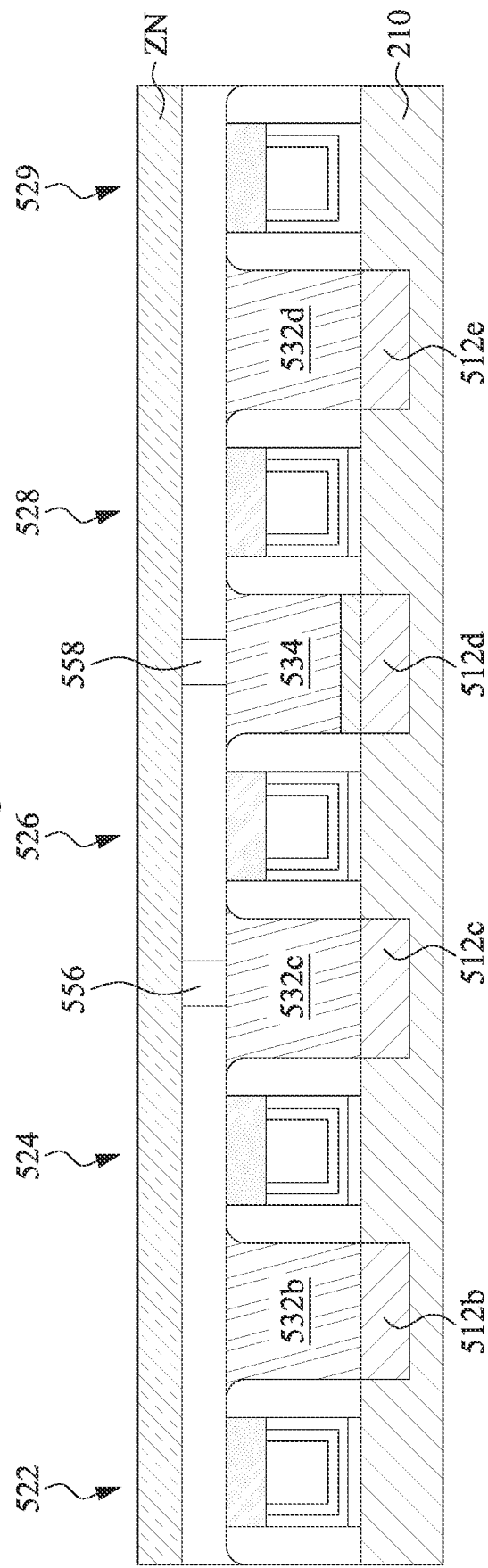
FIG. 16E is a cross-sectional view taking along line E-E in FIG. 16B.

FIG. 16E is a cross-sectional view taking along line E-E in FIG. 16B. Reference is made to FIGS. 16B and 16E. The layout structure of the integrated circuit 500 further includes a plurality of conductive traces VSS, VDD, A1, A2, B1, B2, ZN, and 542 and a plurality of vias 552, 554, 556, 558, 562, 564, 566, 568, 572, 574, 576, and 578. The conductive traces VSS, VDD, A1, A2, B1, B2, ZN, and 542 are over the structure of FIG. 16C. The conductive traces VSS, VDD, A1, A2, B1, B2, ZN, and 542 are in a metal zero (M0) layer in some embodiments, and accordingly, the conductive traces VSS, VDD, A1, A2, B1, B2, ZN, and 542 are also referred to as M0 portions in some embodiments. The conductive traces VSS, VDD, A1, A2, B1, B2, ZN, and 542 extend along the first direction, i.e., substantially parallel to the semiconductor fins 512 and 514 and/or substantially perpendicular to the gates 522, 524, 526, 528, and 529.

The conductive trace VSS is coupled to the source/drain contact 532a through the via 552 and coupled to the source/drain contact 532d through the via 554. The conductive trace ZN is coupled to the source/drain contact 532c through the via 556 and coupled to the MDC 534 through the via 558. The conductive trace A1 is coupled to the gate 528 through the via 564. The conductive trace B1 is coupled to the gate 524 through the via 562. The conductive trace A2 is coupled to the gate 526 through the via 568. The conductive trace B2 is coupled to the gate 522 through the via 566. The conductive trace 542 is coupled to the source/drain contact 532e through the via 572, coupled to the source/drain contact 532g through the via 574, and coupled to the source/drain contact 532h through the via 576. The conductive trace VDD is coupled to the source/drain contact 532f through the via 578.

In FIG. 16B, the integrated circuit 500 has a cell height 500H, which may be defined by a distance between (centers of) the conductive traces VSS and VDD. The MDC 534 has a length 534L. In some embodiments, the length 534L is in a range of about 0.5 times of the height 500H to about 0.75 times of the height 500H. If the length 534L is shorter than about 0.5 times of the height 500H, the MDC 534 may not successfully interconnects the conductive segment 514d and the conductive trace ZN, and if the length 534L is greater than about 0.75 times of the height 500H, the MDC 534 and adjacent MD segments 538c and/or 538f may have short problems. Further, a distance d2 is formed between the vias 556 and 558, and adjacent gates 522, 524, 526, 528, and 529 have a pitch Pi2. In some embodiments, the distance d2 between the vias 556 and 558 is about n*Pi2, where n is integer. In the case of FIG. 16B, n is equal to 1. In some embodiments, the conductive segments 514c and 514e are connected to the same conductive trace, such that they have the same potential. For example, the conductive segments 514c and 514e are connected to the conductive trace ZN in the case of FIG. 16B. Further, the conductive segment 512c is connected to the conductive segment 514d.

In FIG. 16A, since the AOI circuit is one of high usage cells in an integrated circuit, the usage of the MDC and isolation layer can effectively increase routing flexibility of the integrated circuit. Further, in FIG. 16B, the integrated circuit 500 includes four rows of M0 conductive traces (A1, A2, B1, B2, ZN and 542 except the VSS and VDD traces) and there is no M1 conductive trace since the M1 conductive trace is replaced by the MDC. This configuration is benefit for the reducing of the layout area. In addition, the configuration of the four M0 conductive traces (A1, A2, B1, B2, ZN and 542) are symmetric with relative to a center line of the integrated circuit 500 (i.e., the MD segments 532g and 532c in this case). As such, all of the vias formed on the M0 conductive traces in one orientation can also be formed on the M0 conductive traces in another orientation. Furthermore, since there is no M1 conductive trace used in the integrated circuit 500, adjacent cells (or integrated circuits) can be abut to each other, and the overall layout area can be further reduced. Also, the interconnection usage on the M1 and higher layers can be increased and more flexible.

Figure 17A:
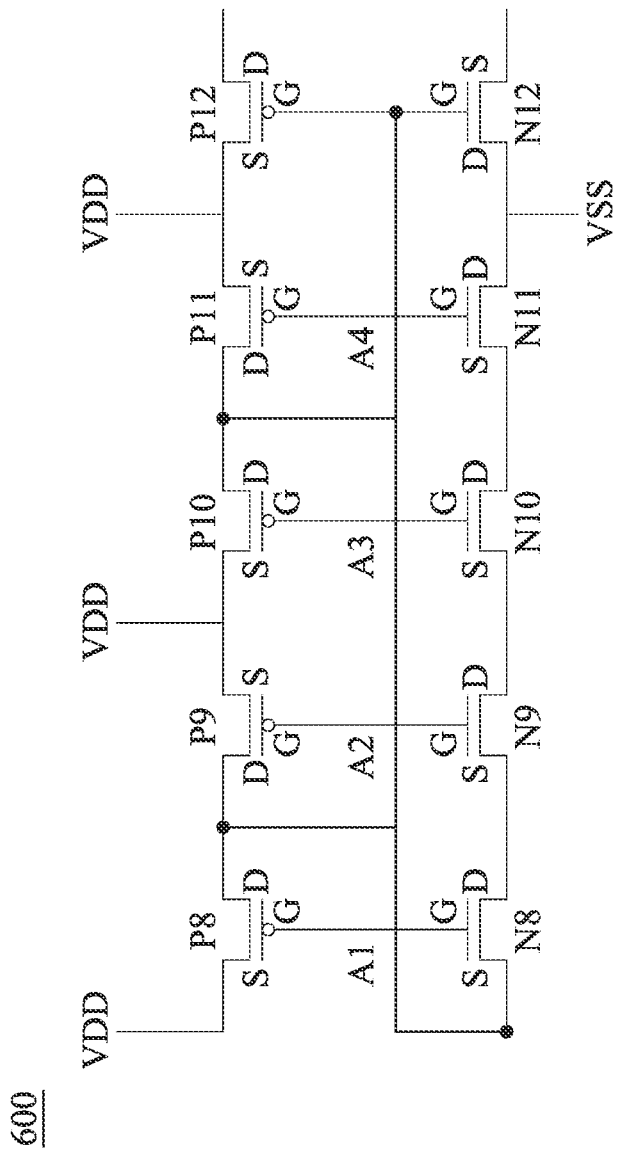
FIG. 17A is a circuit diagram of an integrated circuit, in accordance with some embodiments of the present disclosure.

FIG. 17A is a circuit diagram of an integrated circuit 600, in accordance with some embodiments of the present disclosure. The integrated circuit 600 is an AN4D1 circuit and includes NMOS transistors N8, N9, N10, N11, and N12 and PMOS transistors P8, P9, P10, P11, and P12. Each of the transistors N8-N12 and P8-P12 has a gate terminal G, a source terminal S, and a drain terminal D. In FIG. 17A, the transistor N9 or N10 may correspond to the first transistor 110 in FIG. 1, the transistor N8 or N11 may correspond to the second transistor 120 in FIG. 1, and the transistor P8, P9, P10, or P11 may correspond to the third transistor 130 in FIG. 1.

In FIG. 17A, the gate terminal G of the transistor N8 is coupled to the gate terminal G of the transistor P8 and a first input signal A1, the source terminal S of the transistor N8 is coupled to the drain terminals D of the transistors P8, P9, P10, and P11 and the gate terminals G of the transistors N12 and P12, and the drain terminal D of the transistor N8 is coupled to the source terminal S of the transistor N9. The gate terminal G of the transistor N9 is coupled to the gate terminal G of the transistor P9 and a second input signal A2, and the drain terminal D of the transistor N9 is coupled to the source terminal S of the transistor N10. The gate terminal G of the transistor N10 is coupled to the gate terminal G of the transistor P10 and a third input signal A3, and the drain terminal D of the transistor N10 is coupled to the source terminal S of the transistor N11. The gate terminal G of the transistor N11 is coupled to the gate terminal G of the transistor P11 and a fourth input signal A4, and the drain terminal D of the transistor N11 is coupled to the drain terminal D of the transistor N12 and a VSS signal. The gate terminal G of the transistor N12 is coupled to the gate terminal G of the transistor P12, and the source terminal S of the transistor N12 is coupled to the drain terminal D of the transistor P12 and a fifth signal Z. The source terminal S of the transistor P8 is coupled to a VDD signal, and the drain terminal D of the transistor P8 is coupled to the drain terminal D of the transistor P9. The source terminal S of the transistor P9 is coupled to the VDD signal and the source terminal S of the transistor P10. The drain terminal D of the transistor P10 is coupled to the drain terminal D of the transistor P11. The source terminal S of the transistor P11 is coupled to the VDD signal and the source terminal S of the transistor P12. In some embodiments, the integrated circuit 600 is in a single height cell. To implement the integrated circuit 600 including the MDC and the isolation layer in the embodiments of the present disclosure, embodiments of layout designs and/or structures are provided as discussed in more detail below.

Figure 17B:
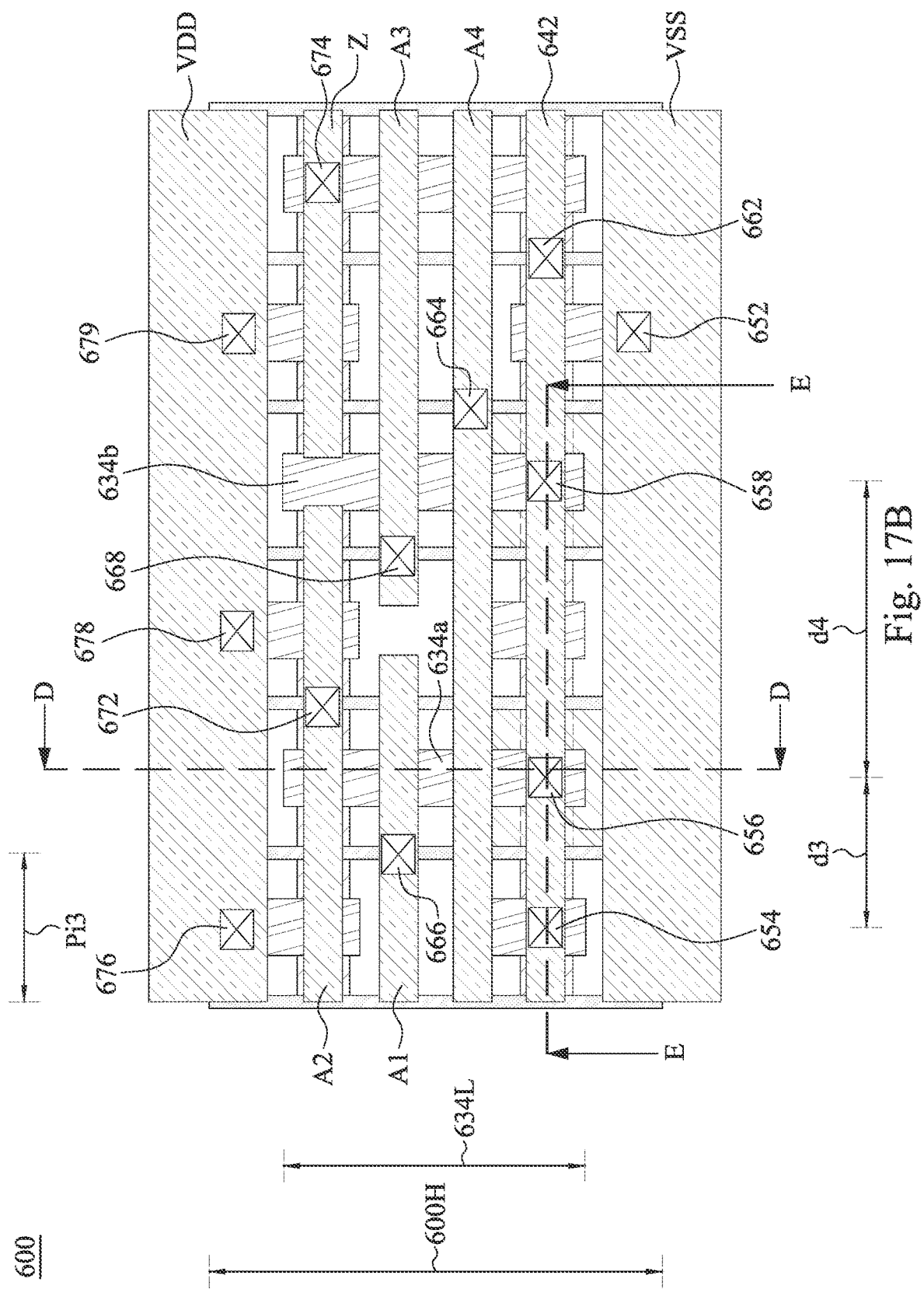
FIG. 17B is a layout diagram corresponding to the integrated circuit of FIG. 17A, in accordance with some embodiments of the present disclosure.
Figure 17C:
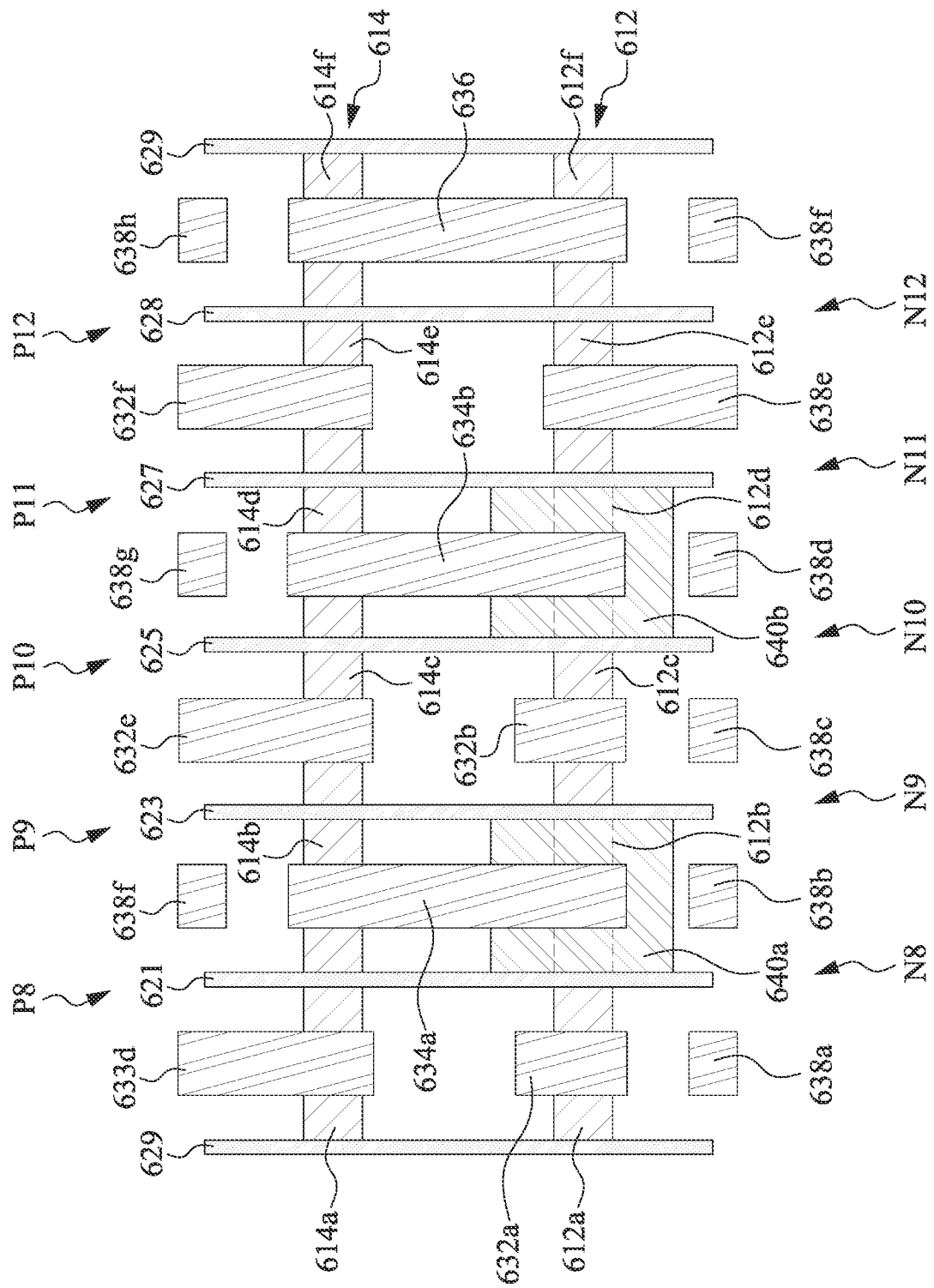
FIG. 17C is a top view of the layout diagram in FIG. 17A without the conductive traces, in accordance with some embodiments of the present disclosure.

FIG. 17B is a layout diagram corresponding to the integrated circuit 600 of FIG. 17A, in accordance with some embodiments of the present disclosure, and FIG. 17C is a top view of the layout diagram in FIG. 17A without the conductive traces VSS, VDD, A1, A2, A3, A4, Z, and 642, in accordance with some embodiments of the present disclosure. In FIGS. 17B and 17C, the layout structure of the integrated circuit 600 includes semiconductor fins 612 and 614 and gates 621, 623, 625, 627, 628, and 629. The semiconductor fin 612 may be n-type and the semiconductor fin 614 may be p-type and extend along a first direction. The gates 621, 623, 625, 627, 628, and 629 crosses over the semiconductor fins 612 and 614 and extend along a second direction different from the first direction. In some embodiments, the first and second directions are substantially perpendicular to each other.

The semiconductor fin 612 includes conductive segments (e.g., fin portions or epitaxial structures) 612a, 612b, 612c, 612d, 612e, and 612f, and the semiconductor fin 614 includes conductive segments (e.g., fin portions or epitaxial structures) 614a, 614b, 614c, 614d, 614e, and 614f. The conductive segments 612a and 612b are on opposite sides of the gate 621, and the conductive segments 612a and 612b and the gate 621 together corresponds to the transistor N8. The conductive segments 612b and 612c are on opposite sides of the gate 623, and the conductive segments 612b and 612c and the gate 623 together corresponds to the transistor N9. The conductive segments 612c and 612d are on opposite sides of the gate 625, and the conductive segments 612c and 612d and the gate 625 together corresponds to the transistor N10. The conductive segments 612d and 612e are on opposite sides of the gate 627, and the conductive segments 612d and 612e and the gate 627 together corresponds to the transistor N11. The conductive segments 612e and 612f are on opposite sides of the gate 628, and the conductive segments 612e and 612f and the gate 628 together corresponds to the transistor N12. The conductive segments 614a and 614b are on opposite sides of the gate 621, and the conductive segments 614a and 614b and the gate 621 together corresponds to the transistor P8. The conductive segments 614b and 614c are on opposite sides of the gate 623, and the conductive segments 614b and 614c and the gate 623 together corresponds to the transistor P9. The conductive segments 614c and 614d are on opposite sides of the gate 625, and the conductive segments 614c and 614d and the gate 625 together corresponds to the transistor P10. The conductive segments 614d and 614e are on opposite sides of the gate 627, and the conductive segments 614d and 614e and the gate 627 together corresponds to the transistor P11. The conductive segments 614e and 614f are on opposite sides of the gate 628, and the conductive segments 614e and 614f and the gate 628 together corresponds to the transistor P12. In some embodiments, the gates 629 are dummy gates. In some other embodiments, the gates 629 are functional gates of another circuit cell adjacent the integrated circuit 600.

Figure 17D:
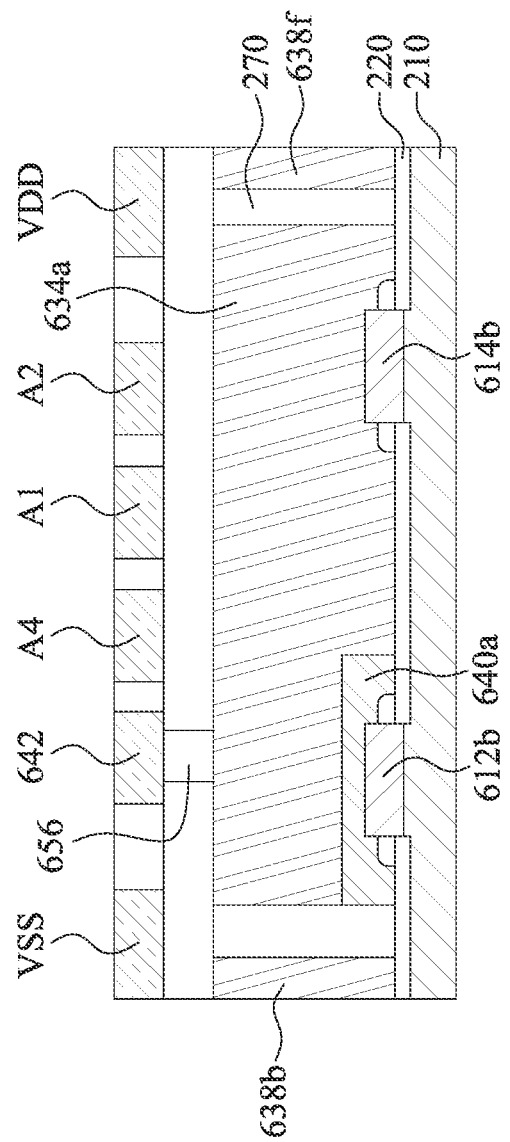
FIG. 17D is a cross-sectional view taking along line D-D in FIG. 17B.

FIG. 17D is a cross-sectional view taking along line D-D in FIG. 17B. Reference is made to FIGS. 17C and 17D. The layout structure of the integrated circuit 600 further includes a plurality of source/drain contacts 632a, 632b, 632c, 632d, 632e, and 632f, a plurality of isolation layers 640a and 640b, MDCs 634a, 634b, and an MDLI 636. The source/drain contact 632a is on and in contact with the conductive segment 612a, the source/drain contact 632b is over and in contact with the conductive segment 612c, the source/drain contact 632c is over and in contact with the conductive segment 612e, the source/drain contact 632d is over and in contact with the conductive segment 614a, the source/drain contact 632e is over and in contact with the conductive segment 614c, and the source/drain contact 632f is over and in contact with the conductive segment 614e. The isolation layer 640a is on and in contact with the conductive segment 612b, and the isolation layer 640b is on and in contact with the conductive segment 612d. The MDC 634a is on and in contact with the isolation layer 640a and the conductive segment 614b, and the MDC 634b is on and in contact with the isolation layer 640b and the conductive segment 614d. The MDLI 636 is on and in contact with the conductive segments 612f and 614f. The structural details of the isolation layers 640a-640b and the MDCs 634a-634b are similar to the isolation layer 320 and the MDC 350 in FIG. 12B, and therefore, a detailed description is not repeated hereinafter.

In some embodiments, the layout structure of the integrated circuit 600 further includes a plurality of MD segments 638a, 638b, 638c, 638d, 638e, 638f, 638g, and 638h over the isolation structures 220. The MD segments 638a-638h may extend to cells adjacent the integrated circuit 600 and be functional contacts of the adjacent cells. In some other embodiments, the MD segments 638a, 638b, 638c, 638d, 638e, 638f, 638g, and/or 638h may be omitted if the adjacent cells do not have a requirement of the MD segments 638a, 638b, 638c, 638d, 638e, 638f, 638g, and/or 638h.

Figure 17E:
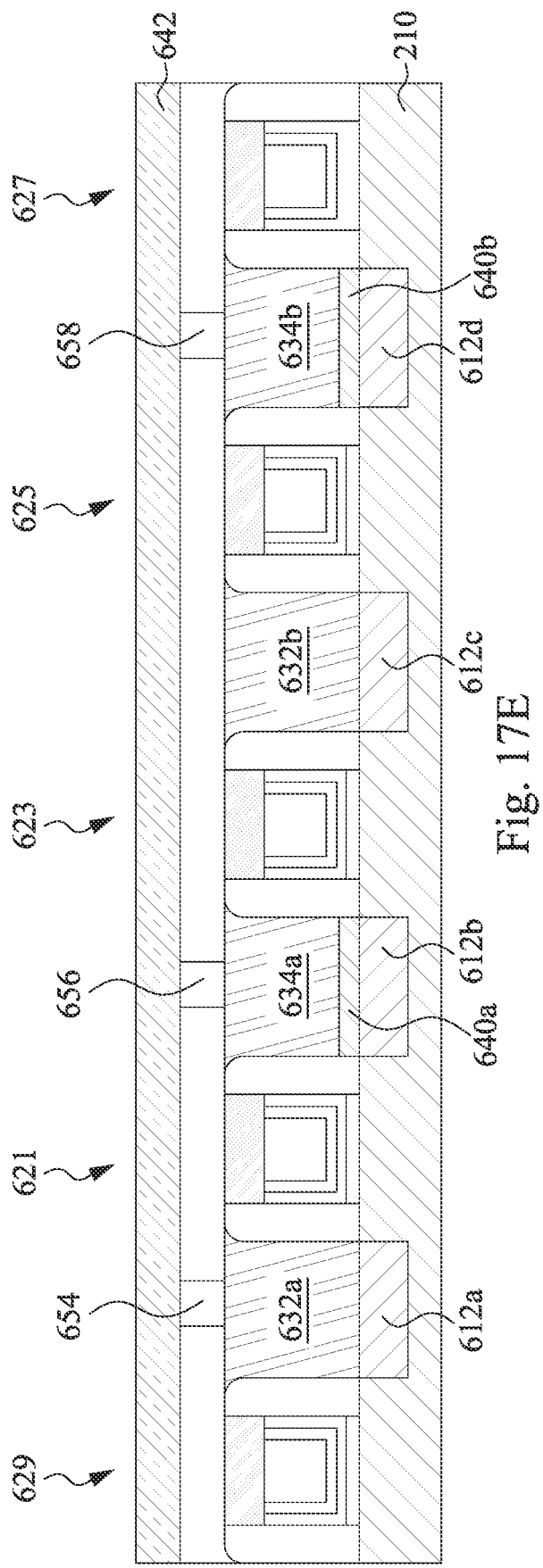
FIG. 17E is a cross-sectional view taking along line E-E in FIG. 17B.

FIG. 17E is a cross-sectional view taking along line E-E in FIG. 17B. Reference is made to FIGS. 17B, 17C, and 17E. The layout structure of the integrated circuit 600 further includes a plurality of conductive traces VSS, VDD, A1, A2, A3, A4, Z, and 642 and a plurality of vias 652, 654, 656, 658, 662, 664, 666, 668, 672, 674, 676, 678, and 679. The conductive traces VSS, VDD, A1, A2, A3, A4, Z, and 642 are over the structure of FIG. 17C. The conductive traces VSS, VDD, A1, A2, A3, A4, Z, and 642 are in a metal zero (M0) layer in some embodiments, and accordingly, the conductive traces VSS, VDD, A1, A2, A3, A4, Z, and 642 are also referred to as M0 portions in some embodiments. The conductive traces VSS, VDD, A1, A2, A3, A4, Z, and 642 extend along the first direction, i.e., substantially parallel to the semiconductor fins 612 and 614 and/or substantially perpendicular to the gates 621, 623, 625, 627, 628, and 629.

The conductive trace VSS is coupled to the source/drain contact 632c through the via 652. The conductive trace 642 is coupled to the source/drain contact 632a through the via 654, coupled to the MDC 634a through the via 656, coupled to the MDC 634b through the via 658, and coupled to the gate 628 through the via 662. In some embodiments, the conductive trace 642 may be referred to as an internal signal trace. The conductive trace A4 is coupled to the gate 627 through the via 664. The conductive trace A1 is coupled to the gate 621 through the via 666. The conductive trace A3 is coupled to the gate 625 through the via 668. The conductive trace A2 is coupled to the gate 623 through the via 672. The conductive trace Z is coupled to the MDLI 636 through the via 674. The conductive trace VDD is coupled to the source/drain contact 632d through the via 676, coupled to the source/drain contact 632e through the via 678, and coupled to the source/drain contact 632f through the via 679.

In FIG. 17B, the integrated circuit 600 has a cell height 600H, which may be defined by a distance between (centers of) the conductive traces VSS and VDD. The MDC 634a and/or 634b has a length 634L. In some embodiments, the length 634L is in a range of about 0.5 times of the height 600H to about 0.75 times of the height 600H. If the length 634L is shorter than about 0.5 times of the height 600H, the MDC 634a (634b) may not successfully interconnects the conductive segment 614b (614d) and the conductive trace 642, and if the length 634L is greater than about 0.75 times of the height 600H, the MDC 634a (634b) and adjacent MD segments 638b (638d) and/or 638f (638g) may have short problems. Further, a distance D3 is formed between the vias 654 and 656, a distance D4 is formed between the vias 656 and 658, and adjacent gates 621, 623, 625, 627, 628, and 629 have a pitch Pi3. In some embodiments, the distance d3 (d4) is about n*Pi3, where n is integer. In the case of FIG. 17B, the distance d3 is about 1*Pi3, and the distance d4 is about 2*Pi3. In some embodiments, the conductive segments 614a, 614c, and 614e are connected to the same conductive trace, such that they have the same potential. For example, the conductive segments 614a, 614c, and 614e are connected to the conductive trace VDD in the case of FIG. 17B. Further, the conductive segment 612a is connected to the conductive segments 614b and 614d.

In FIG. 17B, the integrated circuit 600 includes four rows of M0 conductive traces (A1, A2, A3, A4, Z and 642 except the VSS and VDD traces) and there is no M1 conductive trace since the M1 conductive trace is replaced by the MDC. This configuration is benefit for the reducing of the layout area. In addition, the configuration of the four M0 conductive traces (A1, A2, A3, A4, Z and 642) are symmetric with relative to a center line of the integrated circuit 600 (i.e., the gate 625 in this case). As such, all of the vias formed on the M0 conductive traces in one orientation can also be formed on the M0 conductive traces in another orientation. Furthermore, since there is no M1 conductive trace used in the integrated circuit 600, adjacent cells (or integrated circuits) can be abut to each other, and the overall layout area can be further reduced. Also, the interconnection usage on the M1 and higher layers can be increased and more flexible.

Figure 18A:
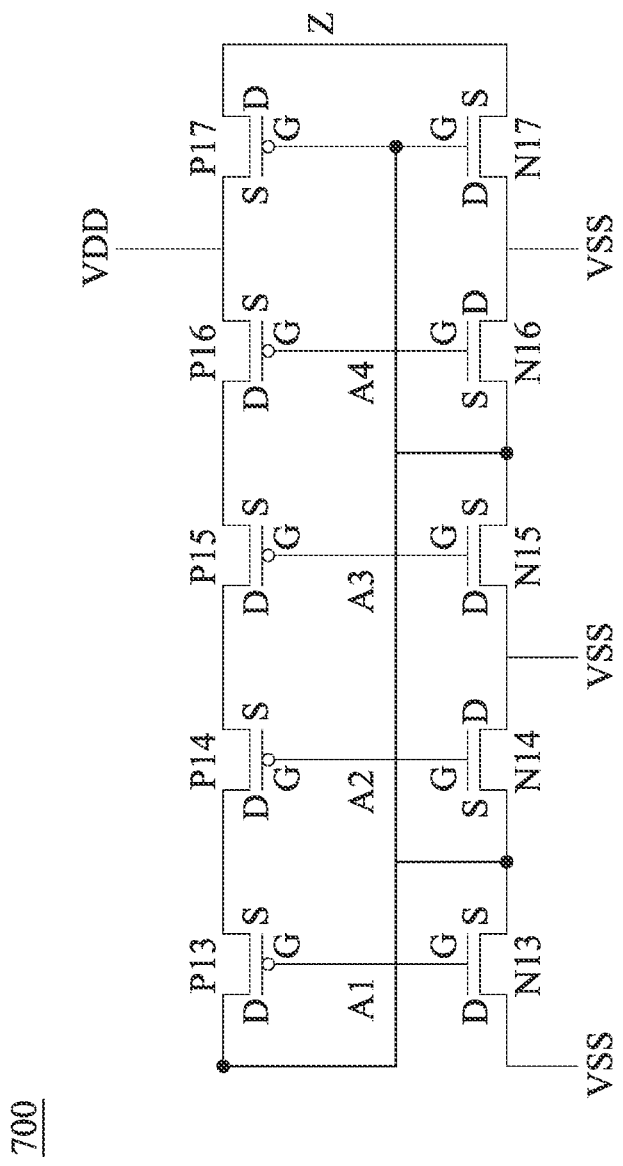
FIG. 18A is a circuit diagram of an integrated circuit, in accordance with some embodiments of the present disclosure.

FIG. 18A is a circuit diagram of an integrated circuit 700, in accordance with some embodiments of the present disclosure. The integrated circuit 700 is an OR4D1 circuit and includes NMOS transistors N13, N14, N15, N16, and N17 and PMOS transistors P13, P14, P15, P16, and P17. Each of the transistors N13-N17 and P13-P17 has a gate terminal G, a source terminal S, and a drain terminal D. In FIG. 18A, the transistor P14 or P15 may correspond to the first transistor 110 in FIG. 1, the transistor P13 or P16 may correspond to the second transistor 120 in FIG. 1, and the transistor N13, N14, N15, or N16 may correspond to the third transistor 130 in FIG. 1.

In FIG. 18A, the gate terminal G of the transistor N13 is coupled to the gate terminal G of the transistor P13 and a first input signal A1, the source terminal S of the transistor N13 is coupled to the source terminals S of the transistors N14, N15, and N16, the drain terminal D of the transistor P13, and the gate terminals G of the transistors N17 and P17, and the drain terminal D of the transistor N13 is coupled to a VSS signal. The gate terminal G of the transistor N14 is coupled to the gate terminal G of the transistor P14 and a second input signal A2, and the drain terminal D of the transistor N14 is coupled to the drain terminal D of the transistor N15 and the VSS signal. The gate terminal G of the transistor N15 is coupled to the gate terminal G of the transistor P15 and a third input signal A3. The gate terminal G of the transistor N16 is coupled to the gate terminal G of the transistor P16 and a fourth input signal A4, and the drain terminal D of the transistor N16 is coupled to the drain terminal D of the transistor N17 and the VSS signal. The source terminal S of the transistor N17 is coupled to the drain terminal D of the transistor P17 and a fifth signal Z. The source terminal S of the transistor P13 is coupled to the drain terminal D of the transistor P14. The source terminal S of the transistor P14 is coupled to the drain terminal D of the transistor P15. The source terminal S of the transistor P15 is coupled to the drain terminal D of the transistor P16. The source terminal S of the transistor P16 is coupled to the VDD signal and the source terminal S of the transistor P17. In some embodiments, the integrated circuit 700 is in a single height cell. To implement the integrated circuit 700 including the MDC and the isolation layer in the embodiments of the present disclosure, embodiments of layout designs and/or structures are provided as discussed in more detail below.

Figure 18B:
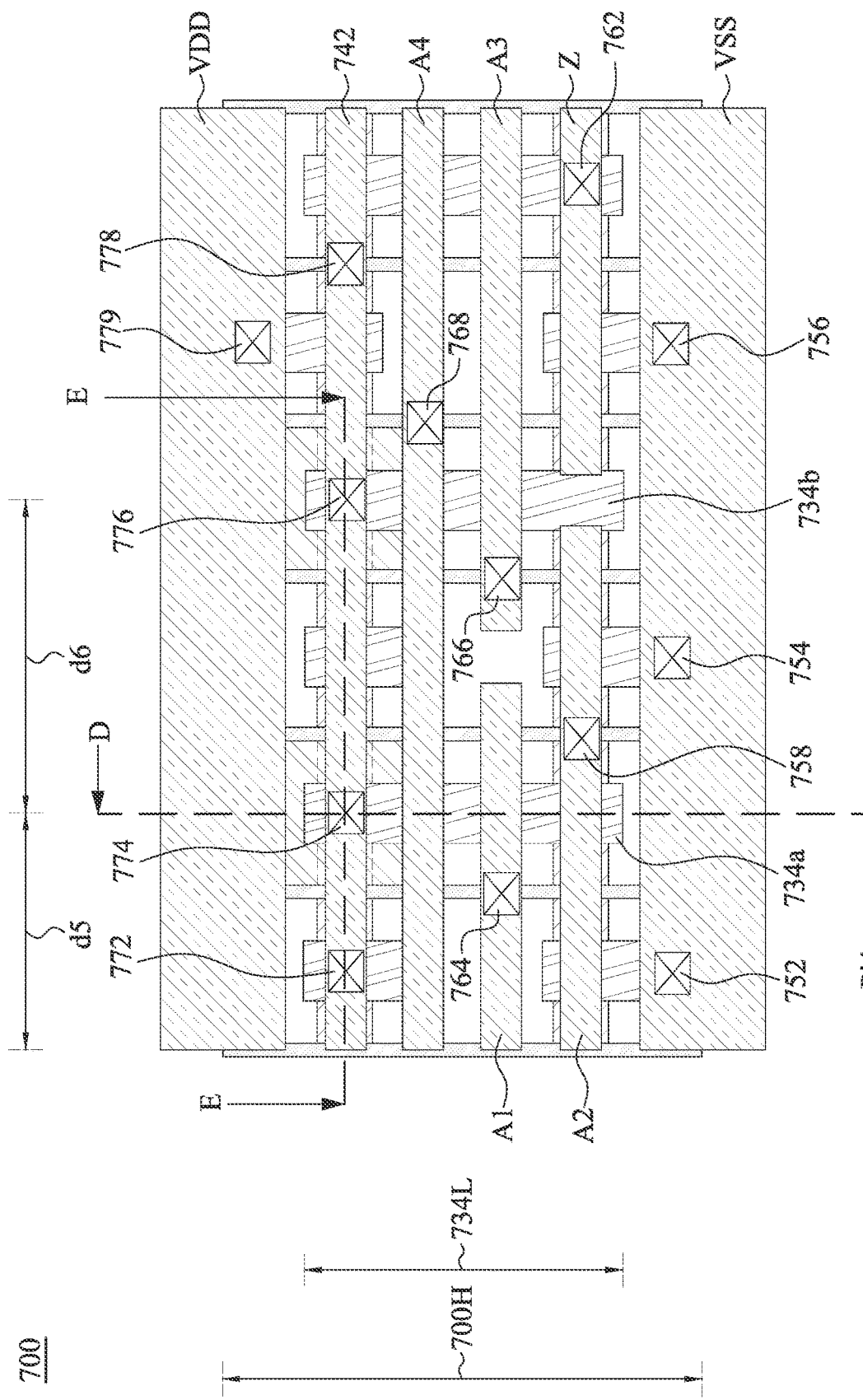
FIG. 18B is a layout diagram corresponding to the integrated circuit of FIG. 18A, in accordance with some embodiments of the present disclosure.
Figure 18C:
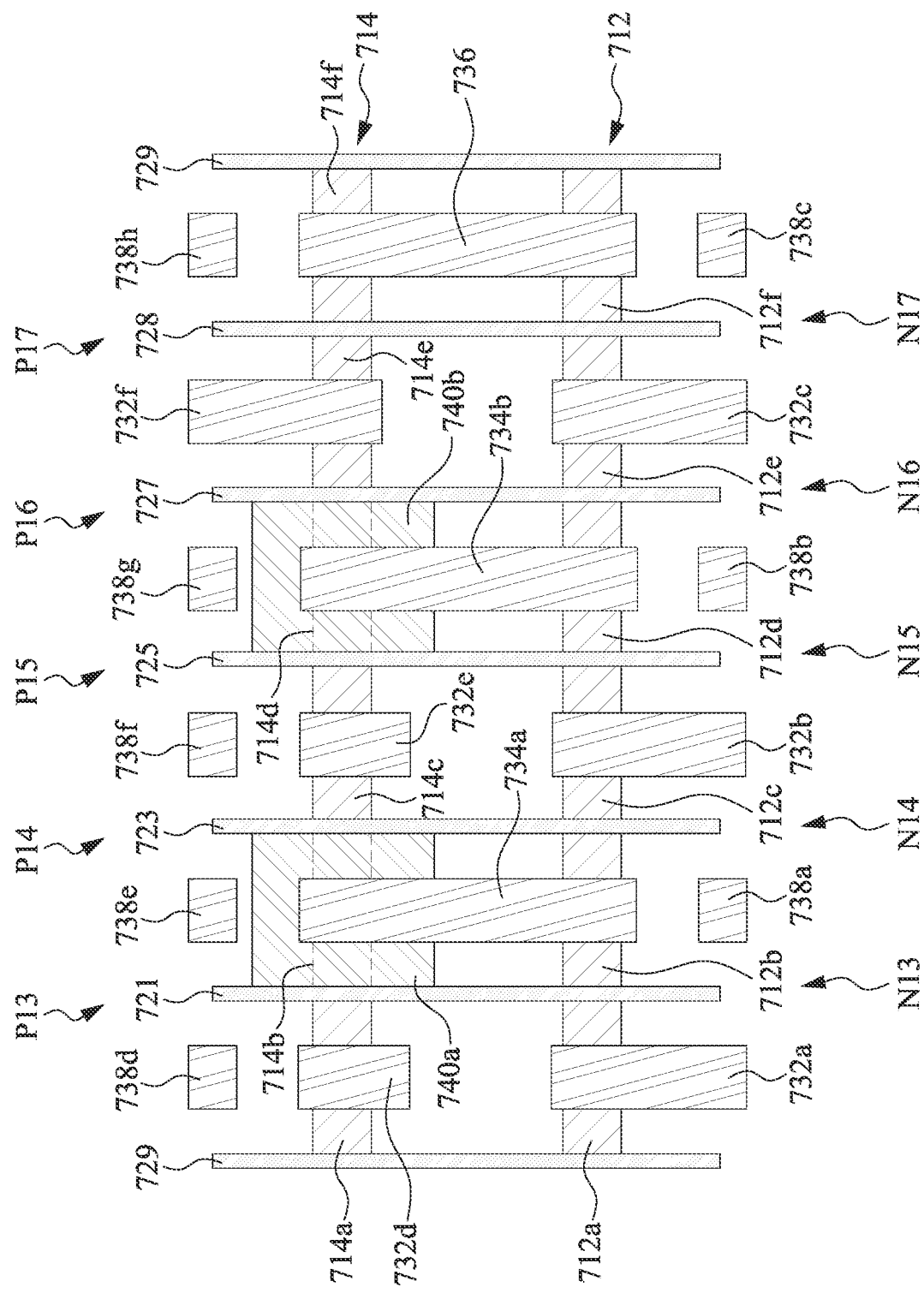
FIG. 18C is a top view of the layout diagram in FIG. 18A without the conductive traces, in accordance with some embodiments of the present disclosure.

FIG. 18B is a layout diagram corresponding to the integrated circuit 700 of FIG. 18A, in accordance with some embodiments of the present disclosure, and FIG. 18C is a top view of the layout diagram in FIG. 18A without the conductive traces VSS, VDD, A1, A2, A3, A4, Z, and 742, in accordance with some embodiments of the present disclosure. In FIGS. 18B and 18C, the layout structure of the integrated circuit 700 includes semiconductor fins 712 and 714 and gates 721, 723, 725, 727, 728, and 729. The semiconductor fin 712 may be n-type and the semiconductor fin 714 may be p-type and extend along a first direction. The gates 721, 723, 725, 727, 728, and 729 crosses over the semiconductor fins 712 and 714 and extend along a second direction different from the first direction. In some embodiments, the first and second directions are substantially perpendicular to each other.

The semiconductor fin 712 includes conductive segments (e.g., fin portions or epitaxial structures) 712a, 712b, 712c, 712d, 712e, and 712f, and the semiconductor fin 714 includes conductive segments (e.g., fin portions or epitaxial structures) 714a, 714b, 714c, 714d, 714e, and 714f. The conductive segments 712a and 712b are on opposite sides of the gate 721, and the conductive segments 712a and 712b and the gate 721 together corresponds to the transistor N13. The conductive segments 712b and 712c are on opposite sides of the gate 723, and the conductive segments 712b and 712c and the gate 723 together corresponds to the transistor N14. The conductive segments 712c and 712d are on opposite sides of the gate 725, and the conductive segments 712c and 712d and the gate 725 together corresponds to the transistor N15. The conductive segments 712d and 712e are on opposite sides of the gate 727, and the conductive segments 712d and 712e and the gate 727 together corresponds to the transistor N16. The conductive segments 712e and 712f are on opposite sides of the gate 728, and the conductive segments 712e and 712f and the gate 728 together corresponds to the transistor N17. The conductive segments 714a and 714b are on opposite sides of the gate 721, and the conductive segments 714a and 714b and the gate 721 together corresponds to the transistor P13. The conductive segments 714b and 714c are on opposite sides of the gate 723, and the conductive segments 714b and 714c and the gate 723 together corresponds to the transistor P14. The conductive segments 714c and 714d are on opposite sides of the gate 725, and the conductive segments 714c and 714d and the gate 725 together corresponds to the transistor P15. The conductive segments 714d and 714e are on opposite sides of the gate 727, and the conductive segments 714d and 714e and the gate 727 together corresponds to the transistor P16. The conductive segments 714e and 714f are on opposite sides of the gate 728, and the conductive segments 714e and 714f and the gate 728 together corresponds to the transistor P17. In some embodiments, the gates 729 are dummy gates. In some other embodiments, the gates 729 are functional gates of another circuit cell adjacent the integrated circuit 700.

FIG. 18D is a cross-sectional view taking along line D-D in FIG. 18B. Reference is made to FIGS. 18C and 18D. The layout structure of the integrated circuit 700 further includes a plurality of source/drain contacts 732a, 732b, 732c, 732d, 732e, and 732f, a plurality of isolation layers 740a and 740b, MDCs 734a, 734b, and an MDLI 736. The source/drain contact 732a is on and in contact with the conductive segment 712a, the source/drain contact 732b is over and in contact with the conductive segment 712c, the source/drain contact 732c is over and in contact with the conductive segment 712e, the source/drain contact 732d is over and in contact with the conductive segment 714a, the source/drain contact 732e is over and in contact with the conductive segment 714c, and the source/drain contact 732f is over and in contact with the conductive segment 714e. The isolation layer 740a is on and in contact with the conductive segment 714b, and the isolation layer 740b is on and in contact with the conductive segment 714d. The MDC 734a is on and in contact with the isolation layer 740a and the conductive segment 712b, and the MDC 734b is on and in contact with the isolation layer 740b and the conductive segment 712d. The MDLI 736 is on and in contact with the conductive segments 712f and 714f. The structural details of the isolation layers 740a-740b and the MDCs 734a-734b are similar to the isolation layer 320 and the MDC 350 in FIG. 12B, and therefore, a detailed description is not repeated hereinafter.

In some embodiments, the layout structure of the integrated circuit 700 further includes a plurality of MD segments 738a, 738b, 738c, 738d, 738e, 738f, 738g, and 738h over the isolation structures 220. The MD segments 738a-738h may extend to cells adjacent the integrated circuit 700 and be functional contacts of the adjacent cells. In some other embodiments, the MD segments 738a, 738b, 738c, 738d, 738e, 738f, 738g, and/or 738h may be omitted if the adjacent cells do not have a requirement of the MD segments 738a, 738b, 738c, 738d, 738e, 738f, 738g, and/or 738h.

FIG. 18E is a cross-sectional view taking along line E-E in FIG. 18B. Reference is made to FIGS. 18B, 18C, and 18E. The layout structure of the integrated circuit 700 further includes a plurality of conductive traces VSS, VDD, A1, A2, A3, A4, Z, and 742 and a plurality of vias 752, 754, 756, 758, 762, 764, 766, 768, 772, 774, 776, 778, and 779. The conductive traces VSS, VDD, A1, A2, A3, A4, Z, and 742 are over the structure of FIG. 18C. The conductive traces VSS, VDD, A1, A2, A3, A4, Z, and 742 are in a metal zero (M0) layer in some embodiments, and accordingly, the conductive traces VSS, VDD, A1, A2, A3, A4, Z, and 742 are also referred to as M0 portions in some embodiments. The conductive traces VSS, VDD, A1, A2, A3, A4, Z, and 742 extend along the first direction, i.e., substantially parallel to the semiconductor fins 712 and 714 and/or substantially perpendicular to the gates 721, 723, 725, 727, 728, and 729.

The conductive trace VSS is coupled to the source/drain contact 732a through the via 752, coupled to the source/drain contact 732b through the via 754, and coupled to the source/drain contact 732c through the via 756. The conductive trace A2 is coupled to the gate 723 through the via 758. The conductive trace Z is coupled to the MDLI 736 through the via 762. The conductive trace A1 is coupled to the gate 621 through the via 764. The conductive trace A3 is coupled to the gate 725 through the via 766. The conductive trace A4 is coupled to the gate 727 through the via 768. The conductive trace 742 is coupled to the source/drain contact 732d through the via 772, coupled to the MDC 734a through the via 774, coupled to the MDC 734b through the via 776, and coupled to the gate 728 through the via 778. In some embodiments, the conductive trace 742 may be referred to as an internal signal trace. The conductive trace VDD is coupled to the source/drain contact 732f through the via 779.

In FIG. 18B, the integrated circuit 700 has a cell height 700H, which may be defined by a distance between (centers of) the conductive traces VSS and VDD. The MDC 734a and/or 734b has a length 734L. In some embodiments, the length 734L is in a range of about 0.5 times of the height 700H to about 0.75 times of the height 700H. If the length 734L is shorter than about 0.5 times of the height 700H, the MDC 734a (734b) may not successfully interconnects the conductive segment 712b (712d) and the conductive trace 742, and if the length 734L is greater than about 0.75 times of the height 700H, the MDC 734a (734b) and adjacent MD segments 738a (738b) and/or 738e (738g) may have short problems. Further, a distance D5 is formed between the vias 772 and 774, a distance D6 is formed between the vias 774 and 776, and adjacent gates 721, 723, 725, 727, 728, and 729 have a pitch Pi4. In some embodiments, the distance d5 (d6) is about n*Pi4, where n is integer. In the case of FIG. 18B, the distance d5 is about 1*Pi4, and the distance d6 is about 2*Pi4. In some embodiments, the conductive segments 712a, 712c, and 712e are connected to the same conductive trace, such that they have the same potential. For example, the conductive segments 712a, 712c, and 712e are connected to the conductive trace VSS in the case of FIG. 18B. Further, the conductive segment 714a is connected to the conductive segments 712b and 712d.

In FIG. 18B, the integrated circuit 700 includes four rows of M0 conductive traces (A1, A2, A3, A4, Z and 742 except the VSS and VDD traces) and there is no M1 conductive trace since the M1 conductive trace is replaced by the MDC. This configuration is benefit for the reducing of the layout area. In addition, the configuration of the four M0 conductive traces (A1, A2, A3, A4, Z and 742) are symmetric with relative to a center line of the integrated circuit 700 (i.e., the gate 725 in this case). As such, all of the vias formed on the M0 conductive traces in one orientation can also be formed on the M0 conductive traces in another orientation. Furthermore, since there is no M1 conductive trace used in the integrated circuit 700, adjacent cells (or integrated circuits) can be abut to each other, and the overall layout area can be further reduced. Also, the interconnection usage on the M1 and higher layers can be increased and more flexible.

Figure 19A:
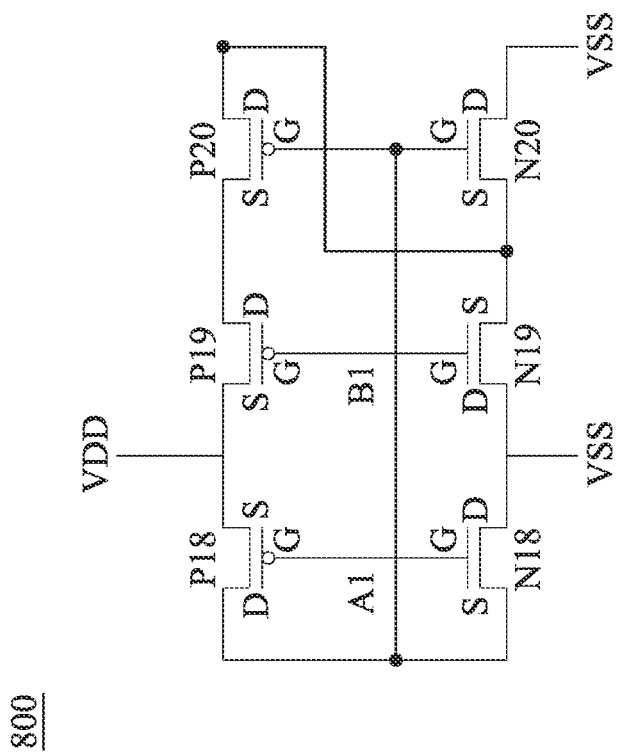
FIG. 19A is a circuit diagram of an integrated circuit, in accordance with some embodiments of the present disclosure.

FIG. 19A is a circuit diagram of an integrated circuit 800, in accordance with some embodiments of the present disclosure. The integrated circuit 800 is an INR2D1 circuit and includes NMOS transistors N18, N19, and N20 and PMOS transistors P18, P19, and P20. Each of the transistors N18-P20 and P18-P20 has a gate terminal G, a source terminal S, and a drain terminal D. In FIG. 19A, the transistor P19 may correspond to the first transistor 110 in FIG. 1, the transistor P20 may correspond to the second transistor 120 in FIG. 1, and the transistor N19 or N20 may correspond to the third transistor 130 in FIG. 1.

In FIG. 19A, the gate terminal G of the transistor N18 is coupled to the gate terminal G of the transistor P18 and a first input signal A1, the source terminal S of the transistor N18 is coupled to the drain terminal D of the transistor P18 and the gate terminals G of the transistors N20 and P20, and the drain terminal D of the transistor N18 is coupled to the drain terminal D of the transistor N19. The gate terminal G of the transistor N19 is coupled to the gate terminal G of the transistor P19 and a second input signal B1, and the source terminal S of the transistor N19 is coupled to the source terminal S of the transistor N20 and the drain terminal D of the transistor P20. The drain terminal D of the transistor N20 is coupled to the VSS signal. The source terminal S of the transistor P18 is coupled to a VDD signal and the source terminal S of the transistor P19. The drain terminal D of the transistor P19 is coupled to the source terminal S of the transistor P20. In some embodiments, the integrated circuit 800 is in a single cell. To implement the integrated circuit 800 including the MDC and the isolation layer in the embodiments of the present disclosure, embodiments of layout designs and/or structures are provided as discussed in more detail below.

Figure 19B:
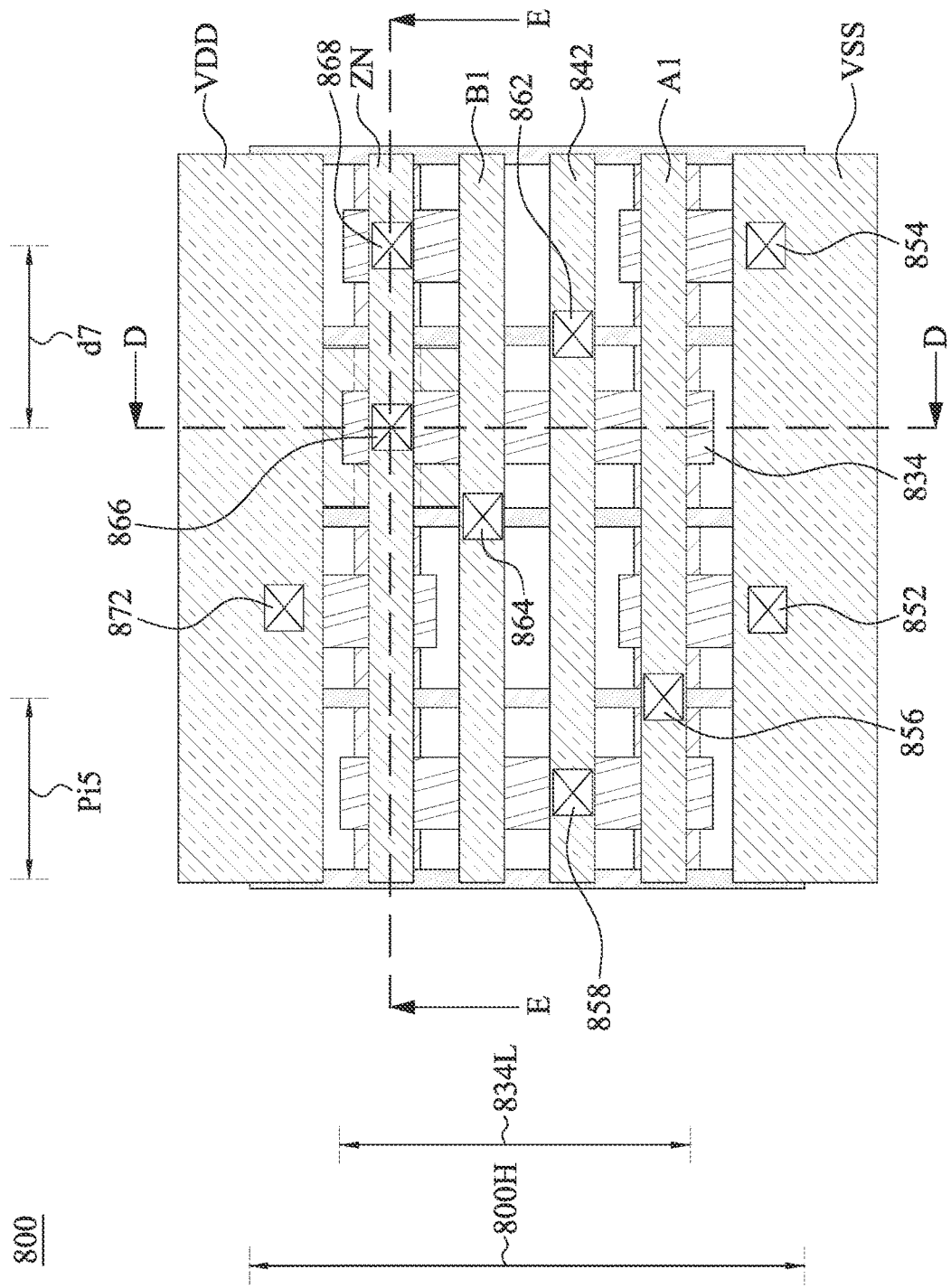
FIG. 19B is a layout diagram corresponding to the integrated circuit of FIG. 19A, in accordance with some embodiments of the present disclosure.
Figure 19C:
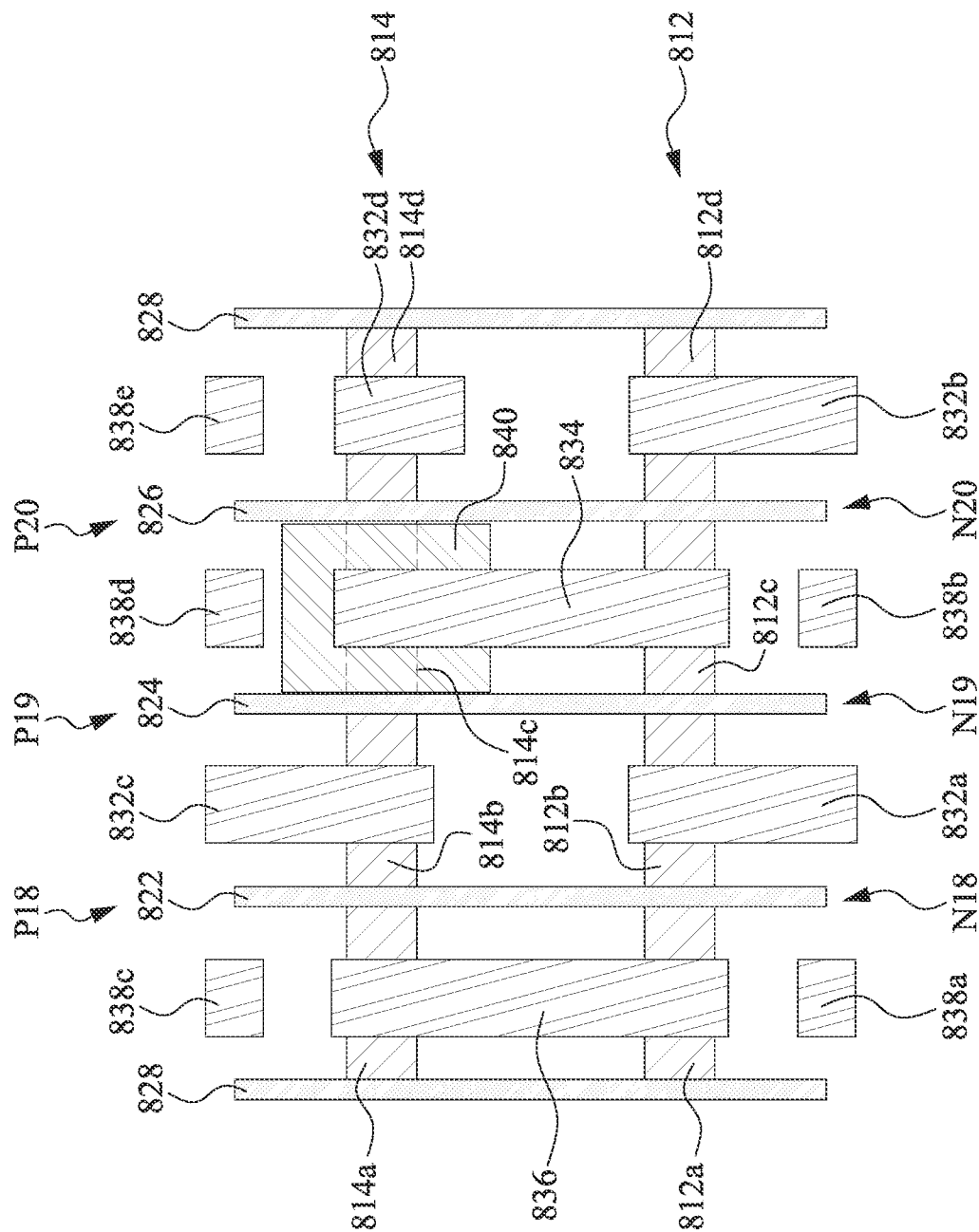
FIG. 19C is a top view of the layout diagram in FIG. 19A without the conductive traces, in accordance with some embodiments of the present disclosure.

FIG. 19B is a layout diagram corresponding to the integrated circuit 800 of FIG. 19A, in accordance with some embodiments of the present disclosure, and FIG. 19C is a top view of the layout diagram in FIG. 19A without the conductive traces VSS, VDD, A1, B1, ZN, and 842, in accordance with some embodiments of the present disclosure. In FIGS. 19B and 19C, the layout structure of the integrated circuit 800 includes semiconductor fins 812 and 814 and gates 822, 824, 826, and 828. The semiconductor fin 812 may be n-type and the semiconductor fin 814 may be p-type and extend along a first direction. The gates 822, 824, 826, and 828 crosses over the semiconductor fins 812 and 814 and extend along a second direction different from the first direction. In some embodiments, the first and second directions are substantially perpendicular to each other.

The semiconductor fin 812 includes conductive segments (e.g., fin portions or epitaxial structures) 812a, 812b, 812c, and 812d, and the semiconductor fin 814 includes conductive segments (e.g., fin portions or epitaxial structures) 814a, 814b, 814c, and 814d. The conductive segments 812a and 812b are on opposite sides of the gate 822, and the conductive segments 812a and 812b and the gate 822 together corresponds to the transistor N18. The conductive segments 812b and 812c are on opposite sides of the gate 824, and the conductive segments 812b and 812c and the gate 824 together corresponds to the transistor N19. The conductive segments 812c and 812d are on opposite sides of the gate 826, and the conductive segments 812c and 812d and the gate 826 together corresponds to the transistor N20. The conductive segments 814a and 814b are on opposite sides of the gate 822, and the conductive segments 814a and 814b and the gate 822 together corresponds to the transistor P18. The conductive segments 814b and 814c are on opposite sides of the gate 824, and the conductive segments 814b and 814c and the gate 824 together corresponds to the transistor P19. The conductive segments 814c and 814d are on opposite sides of the gate 826, and the conductive segments 814c and 814d and the gate 826 together corresponds to the transistor P20. In some embodiments, the gates 828 are dummy gates. In some other embodiments, the gates 828 are functional gates of another circuit cell adjacent the integrated circuit 800.

Figure 19D:
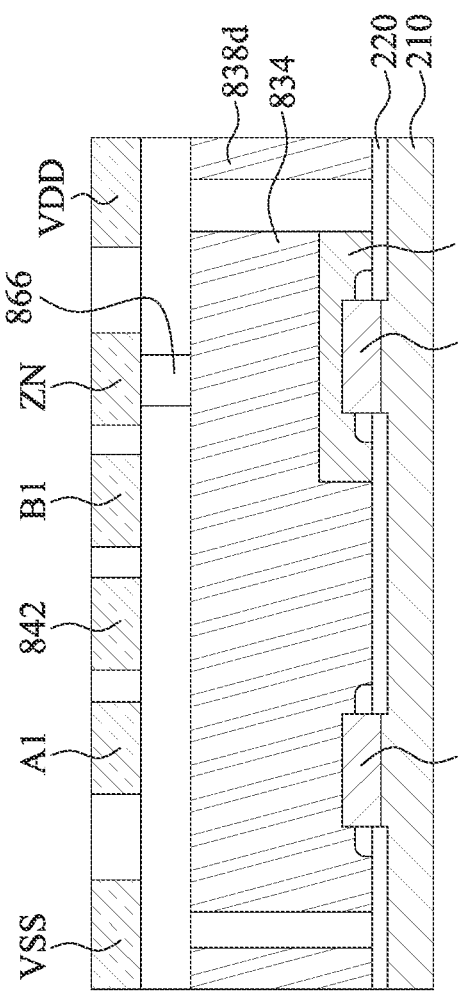
FIG. 19D is a cross-sectional view taking along line D-D in FIG. 19B.

FIG. 19D is a cross-sectional view taking along line D-D in FIG. 19B. Reference is made to FIGS. 19C and 19D. The layout structure of the integrated circuit 800 further includes a plurality of source/drain contacts 832a, 832b, 832c, and 832d, an isolation layer 840, an MDC 834, and an MDLI 836. The source/drain contact 832a is on and in contact with the conductive segment 812b, the source/drain contact 832b is over and in contact with the conductive segment 812d, the source/drain contact 832c is over and in contact with the conductive segment 814b, and the source/drain contact 832d is over and in contact with the conductive segment 814d. The isolation layer 840 is on and in contact with the conductive segment 814c. The MDC 834 is on and in contact with the isolation layer 840 and the conductive segment 812c. The structural details of the isolation layer 840 and the MDC 834 are similar to the isolation layer 320 and the MDC 350 in FIG. 12B, and therefore, a detailed description is not repeated hereinafter. The MDLI 836 is on and in contact with the conductive segments 812a and 814a.

In some embodiments, the layout structure of the integrated circuit 800 further includes a plurality of MD segments 838a, 838b, 838c, 838d, and 838e over the isolation structures 220. The MD segments 838a-838e may extend to cells adjacent the integrated circuit 800 and be functional contacts of the adjacent cells. In some other embodiments, the MD segments 838a, 838b, 838c, 838d, and/or 838e may be omitted if the adjacent cells do not have a requirement of the MD segments 838a, 838b, 838c, 838d, and/or 838e.

Figure 19E:
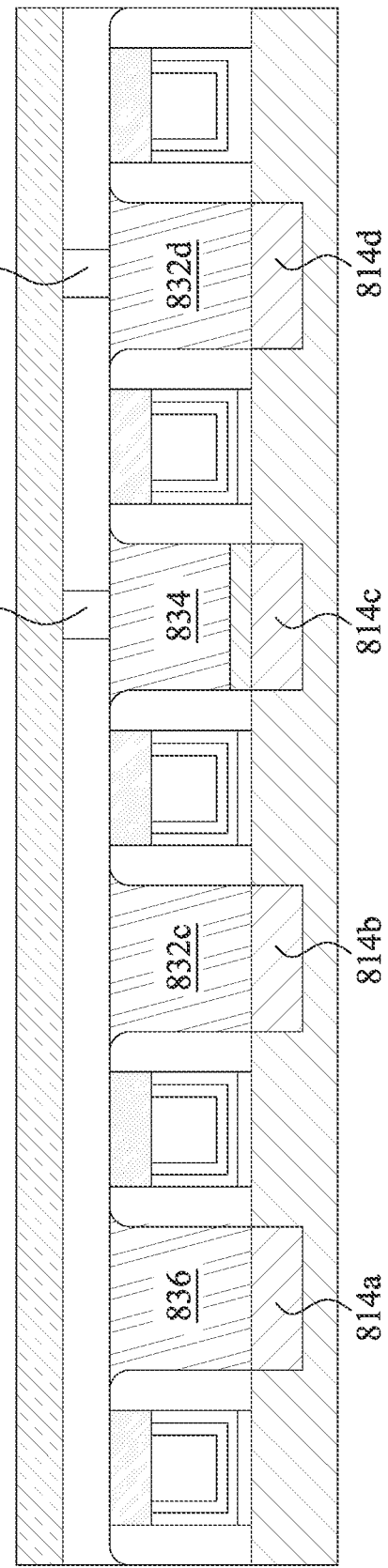
FIG. 19E is a cross-sectional view taking along line E-E in FIG. 19B.

FIG. 19E is a cross-sectional view taking along line E-E in FIG. 19B. Reference is made to FIGS. 19B, 19C, and 19E. The layout structure of the integrated circuit 800 further includes a plurality of conductive traces VSS, VDD, A1, B1, ZN, and 842 and a plurality of vias 852, 854, 856, 858, 862, 864, 866, 868, and 872. The conductive traces VSS, VDD, A1, B1, ZN, and 842 are over the structure of FIG. 19C. The conductive traces VSS, VDD, A1, B1, ZN, and 842 are in a metal zero (M0) layer in some embodiments, and accordingly, the conductive traces VSS, VDD, A1, B1, ZN, and 842 are also referred to as M0 portions in some embodiments. The conductive traces VSS, VDD, A1, B1, ZN, and 842 extend along the first direction, i.e., substantially parallel to the semiconductor fins 812 and 814 and/or substantially perpendicular to the gates 822, 824, 826, and 828.

The conductive trace VSS is coupled to the source/drain contact 832a through the via 852 and coupled to the source/drain contact 832b through the via 854. The conductive trace A1 is coupled to the gate 822 through the via 856. The conductive trace 842 is coupled to the MDLI 836 through the via 858 and coupled to the gate 826 through the via 862. The conductive trace B1 is coupled to the gate 824 through the via 864. The conductive trace ZN is coupled to the MDC 834 through the via 866 and the source/drain contact 832d through the via 868. The conductive trace VDD is coupled to the source/drain contact 832c through the via 872.

In FIG. 19B, the integrated circuit 800 has a cell height 800H, which may be defined by a distance between (centers of) the conductive traces VSS and VDD. The MDC 834 has a length 834L. In some embodiments, the length 834L is in a range of about 0.5 times of the height 800H to about 0.75 times of the height 800H. If the length 834L is shorter than about 0.5 times of the height 800H, the MDC 834 may not successfully interconnects the conductive segment 814c and the conductive trace ZN, and if the length 834L is greater than about 0.75 times of the height 800H, the MDC 834 and adjacent MD segments 838b and/or 838d may have short problems. Further, a distance d7 is formed between the vias 866 and 868, and adjacent gates 822, 824, 826, and 828 have a pitch Pi5. In some embodiments, the distance d7 between the vias 866 and 868 is about n*Pi5, where n is integer. In the case of FIG. 19B, n is equal to 1. In some embodiments, the conductive segments 812b and 812d are connected to the same conductive trace, such that they have the same potential. For example, the conductive segments 812b and 812d are connected to the conductive trace VSS in the case of FIG. 19B. Further, the conductive segment 814d is connected to the conductive segment 812c, such that the conductive segments 814d and 812c have the same potential ZN.

In FIG. 19B, the integrated circuit 800 includes four rows of M0 conductive traces (A1, B1, ZN and 842 except the VSS and VDD traces) and there is no M1 conductive trace since the M1 conductive trace is replaced by the MDC. This configuration is benefit for the reducing of the layout area. In addition, the configuration of the four M0 conductive traces (A1, B1, ZN and 842) are symmetric with relative to a center line of the integrated circuit 800 (i.e., the gate 824 in this case). As such, all of the vias formed on the M0 conductive traces in one orientation can also be formed on the M0 conductive traces in another orientation. Furthermore, since there is no M1 conductive trace used in the integrated circuit 800, adjacent cells (or integrated circuits) can be abut to each other, and the overall layout area can be further reduced. Also, the interconnection usage on the M1 and higher layers can be increased and more flexible.

Figure 20A:
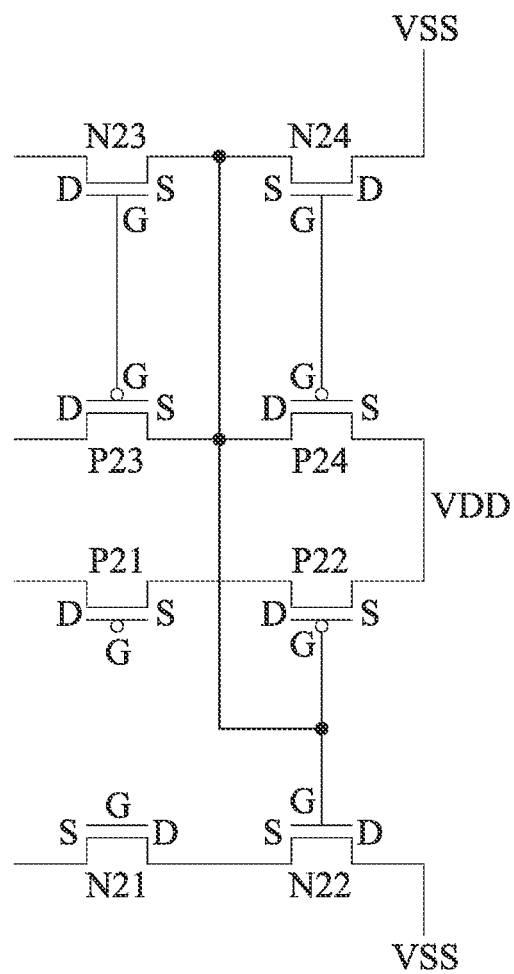
FIG. 20A is a circuit diagram of an integrated circuit, in accordance with some embodiments of the present disclosure.

FIG. 20A is a circuit diagram of an integrated circuit 900, in accordance with some embodiments of the present disclosure. The integrated circuit 900 is a portion of a Flip-flop circuit and includes NMOS transistors N21, N22, N23, and N24 and PMOS transistors P21, P22, P23, and P24. Each of the transistors N21-N24 and P21-P24 has a gate terminal G, a source terminal S, and a drain terminal D. In FIG. 20A, the transistor N21, P21, or P23 may correspond to the first transistor 110 in FIG. 1, the transistor N22, P22, or P24 may correspond to the second transistor 120 in FIG. 1, and the transistor N23 or N24 may correspond to the third transistor 130 in FIG. 1.

In FIG. 20A, the drain terminal D of the transistor N21 is coupled to the source terminal S of the transistor N22. The gate terminal G of the transistor N22 is coupled to the gate terminal G of the transistor P22, the drain terminal D of the transistor P24, and the source terminals S of the transistors P23, N23, and N24, and the drain terminal D of the transistor N22 is coupled to a VSS signal. The source terminal S of the transistor P21 is coupled to the drain terminal D of the transistor P22. The source terminal S of the transistor P22 is coupled to a VDD signal and the source terminal S of the transistor P24. The source terminal S of the transistor P23 is coupled to the drain terminal D of the transistor P24. The gate terminal G of the transistor P24 is coupled to the gate terminal G of the transistor N24. The drain terminal D of the transistor N24 is coupled to the VSS signal. In some embodiments, the integrated circuit 900 is a double height cell. To implement the integrated circuit 900 including the MDC and the isolation layer in the embodiments of the present disclosure, embodiments of layout designs and/or structures are provided as discussed in more detail below.

Figure 20B:
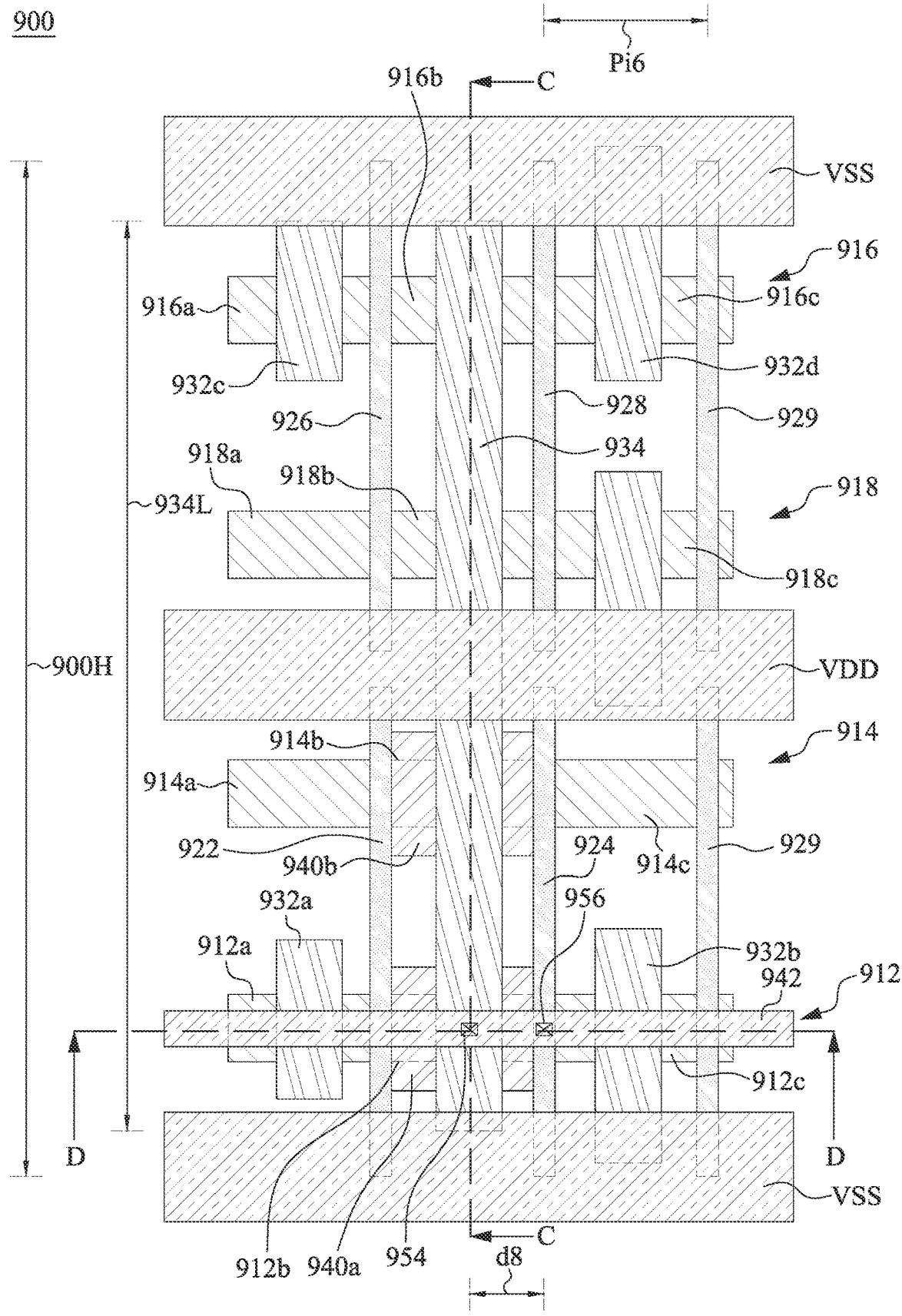
FIG. 20B is a layout diagram corresponding to the integrated circuit of FIG. 20A, in accordance with some embodiments of the present disclosure.

FIG. 20B is a layout diagram corresponding to the integrated circuit 900 of FIG. 20A, in accordance with some embodiments of the present disclosure. In FIG. 20B, the layout structure of the integrated circuit 900 includes semiconductor fins 912, 916, and 914, 918 and gates 922, 924, 926, 928, and 929. The semiconductor fins 912 and 916 may be n-type and the semiconductor fins 914 and 918 may be p-type and extend along a first direction. The gates 922, 924, 926, 928, and 929 crosses over the semiconductor fins 912, 916, 914, and 918 and extend along a second direction different from the first direction. In some embodiments, the first and second directions are substantially perpendicular to each other.

The semiconductor fin 912 includes conductive segments (e.g., fin portions or epitaxial structures) 912a, 912b, and 912c, the semiconductor fin 914 includes conductive segments (e.g., fin portions or epitaxial structures) 914a, 914b, and 914c, the semiconductor fin 916 includes conductive segments (e.g., fin portions or epitaxial structures) 916a, 916b, and 916c, and the semiconductor fin 918 includes conductive segments (e.g., fin portions or epitaxial structures) 918a, 918b, and 918c. The conductive segments 912a and 912b are on opposite sides of the gate 922, and the conductive segments 912a and 912b and the gate 922 together corresponds to the transistor N21. The conductive segments 912b and 912c are on opposite sides of the gate 924, and the conductive segments 912b and 912c and the gate 924 together corresponds to the transistor N22. The conductive segments 914a and 914b are on opposite sides of the gate 922, and the conductive segments 914a and 914b and the gate 922 together corresponds to the transistor P21. The conductive segments 914b and 914c are on opposite sides of the gate 924, and the conductive segments 914b and 914c and the gate 924 together corresponds to the transistor P22. The conductive segments 918a and 918b are on opposite sides of the gate 926, and the conductive segments 918a and 918b and the gate 926 together corresponds to the transistor P23. The conductive segments 918b and 918c are on opposite sides of the gate 928, and the conductive segments 918b and 918c and the gate 928 together corresponds to the transistor P24. The conductive segments 916a and 916b are on opposite sides of the gate 926, and the conductive segments 916a and 916b and the gate 926 together corresponds to the transistor N23. The conductive segments 916b and 916c are on opposite sides of the gate 928, and the conductive segments 916b and 916c and the gate 928 together corresponds to the transistor N24. In some embodiments, the gates 929 are dummy gates. In some other embodiments, the gates 929 are functional gates of another circuit cell adjacent the integrated circuit 900.

Figure 20C:
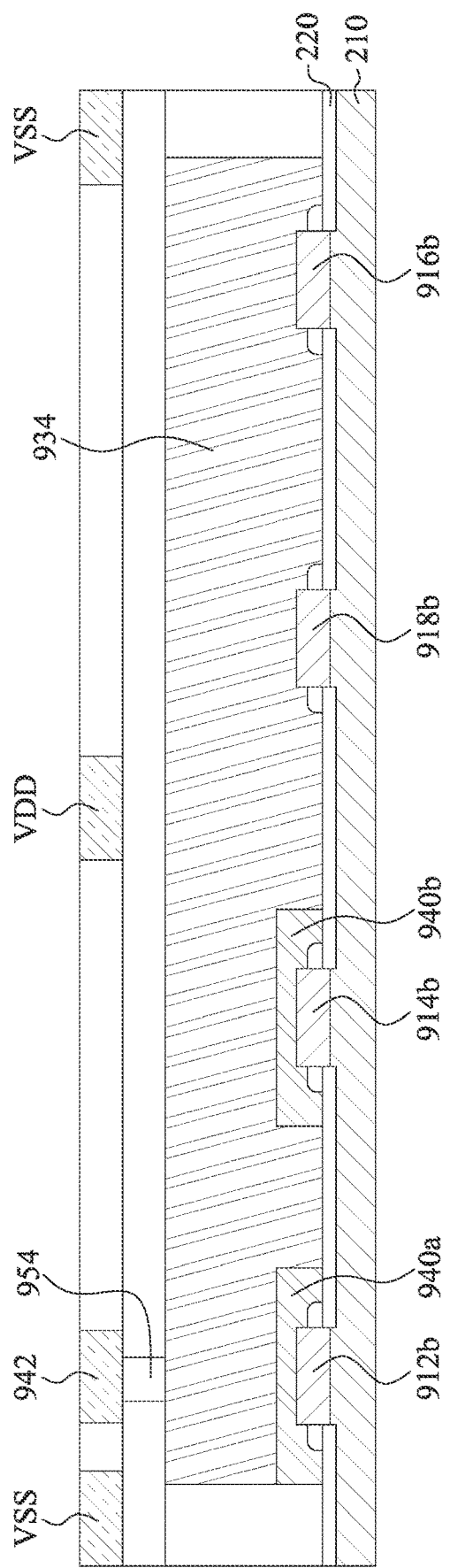
FIG. 20C is a cross-sectional view taking along line C-C in FIG. 20B.

FIG. 20C is a cross-sectional view taking along line C-C in FIG. 20B. Reference is made to FIGS. 20B and 20C. The layout structure of the integrated circuit 900 further includes a plurality of source/drain contacts 932a, 932b, 932c, and 932d, a plurality of isolation layers 940a and 940b, an MDC 934, and an MDLI 936. The source/drain contact 932a is on and in contact with the conductive segment 912a, the source/drain contact 932b is over and in contact with the conductive segment 912c, the source/drain contact 932c is over and in contact with the conductive segment 916a, and the source/drain contact 932d is over and in contact with the conductive segment 916c. The isolation layer 940a is on and in contact with the conductive segment 912b, and the isolation layer 940b is on and in contact with the conductive segment 914b. The MDC 934 is on and in contact with the isolation layers 940a, 940b and the conductive segments 916b and 918b. The structural details of the isolation layer 940a, 940b and the MDC 934 are similar to the isolation layer 320 and the MDC 350 in FIG. 12B, and therefore, a detailed description is not repeated hereinafter. The MDLI 936 is on and in contact with the conductive segments 914c and 918c.

Figure 20D:
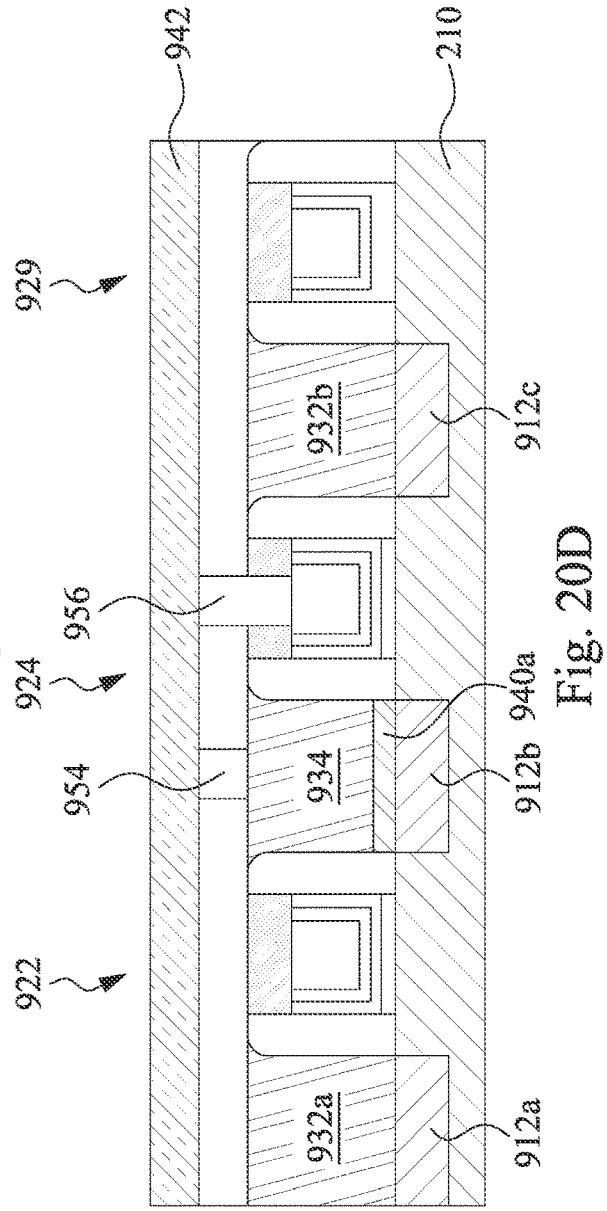
FIG. 20D is a cross-sectional view taking along line D-D in FIG. 20B.

FIG. 20D is a cross-sectional view taking along line D-D in FIG. 20B. Reference is made to FIGS. 20B and 20D. The layout structure of the integrated circuit 900 further includes a plurality of conductive traces VSS, VDD, and 942 and a plurality of vias 952, 954, 956, 958, and 962. The conductive traces VSS, VDD, and 942 are in a metal zero (M0) layer in some embodiments, and accordingly, the conductive traces VSS, VDD, and 942 are also referred to as M0 portions in some embodiments. The conductive traces VSS, VDD, and 942 extend along the first direction, i.e., substantially parallel to the semiconductor fins 912, 914, 916, and 918 and/or substantially perpendicular to the gates 922, 924, 926, 928, and 929.

The conductive trace VSS is coupled to the source/drain contact 932b through the via 952 and coupled to the source/drain contact 932d through the via 962. The conductive trace 942 is coupled to the MDC 934 through the via 954 and coupled to the gate 924 through the via 956. The conductive trace VDD is coupled to the MDLI 936 through the via 958. The layout structure of the integrated circuit 900 may further includes more conductive traces to interconnect the source/drain and/or gates of the transistors in the integrated circuit 900.

In FIG. 20B, the integrated circuit 900 has a cell height 900H, which may be defined by a distance between (centers of) the conductive traces VSS and VDD. The MDC 934 has a length 934L. In some embodiments, the length 934L is in a range of about 1 time of the height 900H to about 1.75 times of the height 900H. If the length 934L is shorter than about 1 time of the height 900H, the MDC 934 may not successfully interconnects the conductive segment 916b and the conductive trace 942, and if the length 934L is greater than about 1.75 times of the height 900H, the MDC 934 and adjacent MD segment(s) may have short problems. Further, a distance d8 is formed between the vias 954 and 956, and adjacent gates 922, 924, and 929 have a pitch Pi6. In some embodiments, the distance d8 between the vias 954 and 956 is about n*0.5*Pi6, where n is integer. In the case of FIG. 20B, n is equal to 1. In some embodiments, the conductive segments 912c and 916c are connected to the same conductive trace, such that they have the same potential. For example, the conductive segments 912c and 916c are connected to the conductive trace VSS in the case of FIG. 20B. Further, the conductive segment(s) 916b (and 918b) are connected to the gate 924, such that the conductive segments 916b (and 918b) and the gate 924 have the same potential VDD.

In FIG. 20B, the integrated circuit 900 includes MDC, which is configured to reduce the number of M1 conductive trace. This configuration is benefit for the reducing of the layout area. Furthermore, since the number of M1 conductive trace used in the integrated circuit 900 is reduced, the interconnection usage on the M1 and higher layers can be increased and more flexible.

Figure 20E:
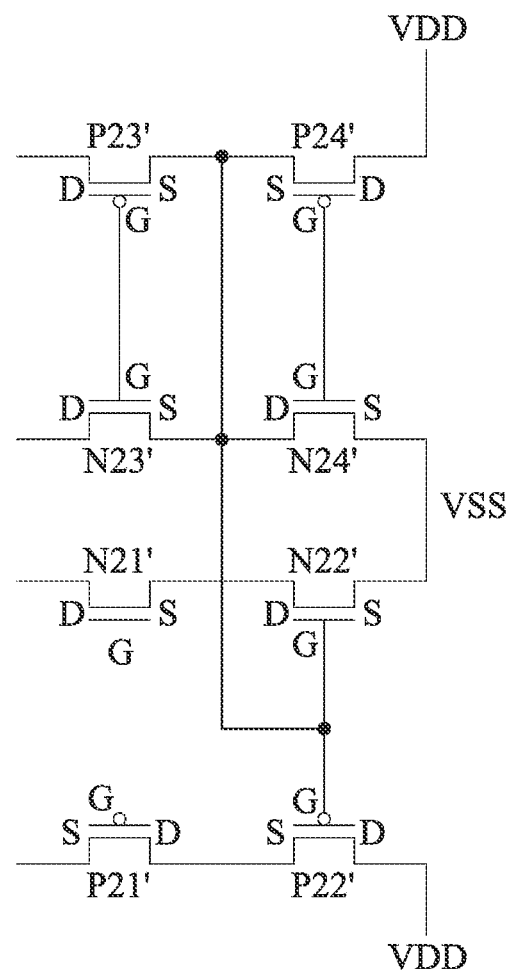
FIG. 20E is a circuit diagram of an integrated circuit, in accordance with some embodiments of the present disclosure.

FIG. 20E is a circuit diagram of an integrated circuit 900', in accordance with some embodiments of the present disclosure. The difference between the circuits 900' and 900 in FIG. 20A pertains to the conductivity types of the transistors. In FIG. 20E, the integrated circuit 900' includes NMOS transistors N21', N22', N23', and N24' and PMOS transistors P21', P22', P23', and P24'. Each of the transistors N21'-N24' and P21'-P24' has a gate terminal G, a source terminal S, and a drain terminal D. In FIG. 20E, the transistor P21', N21', or N23' may correspond to the first transistor 110 in FIG. 1, the transistor P22', N22', or N24' may correspond to the second transistor 120 in FIG. 1, and the transistor P23' or P24' may correspond to the third transistor 130 in FIG. 1.

The drain terminal D of the transistor P24' and the drain terminal D of the transistor P22' are coupled to a VDD signal, and the source terminals S of the transistors N22' and N24' are coupled to a VSS signal. Other relevant structural details of the integrated circuit 900' are similar to or substantially the same as the integrated circuit 900 in FIG. 20A, and, therefore, a description in this regard will not be repeated hereinafter.

Figure 21:
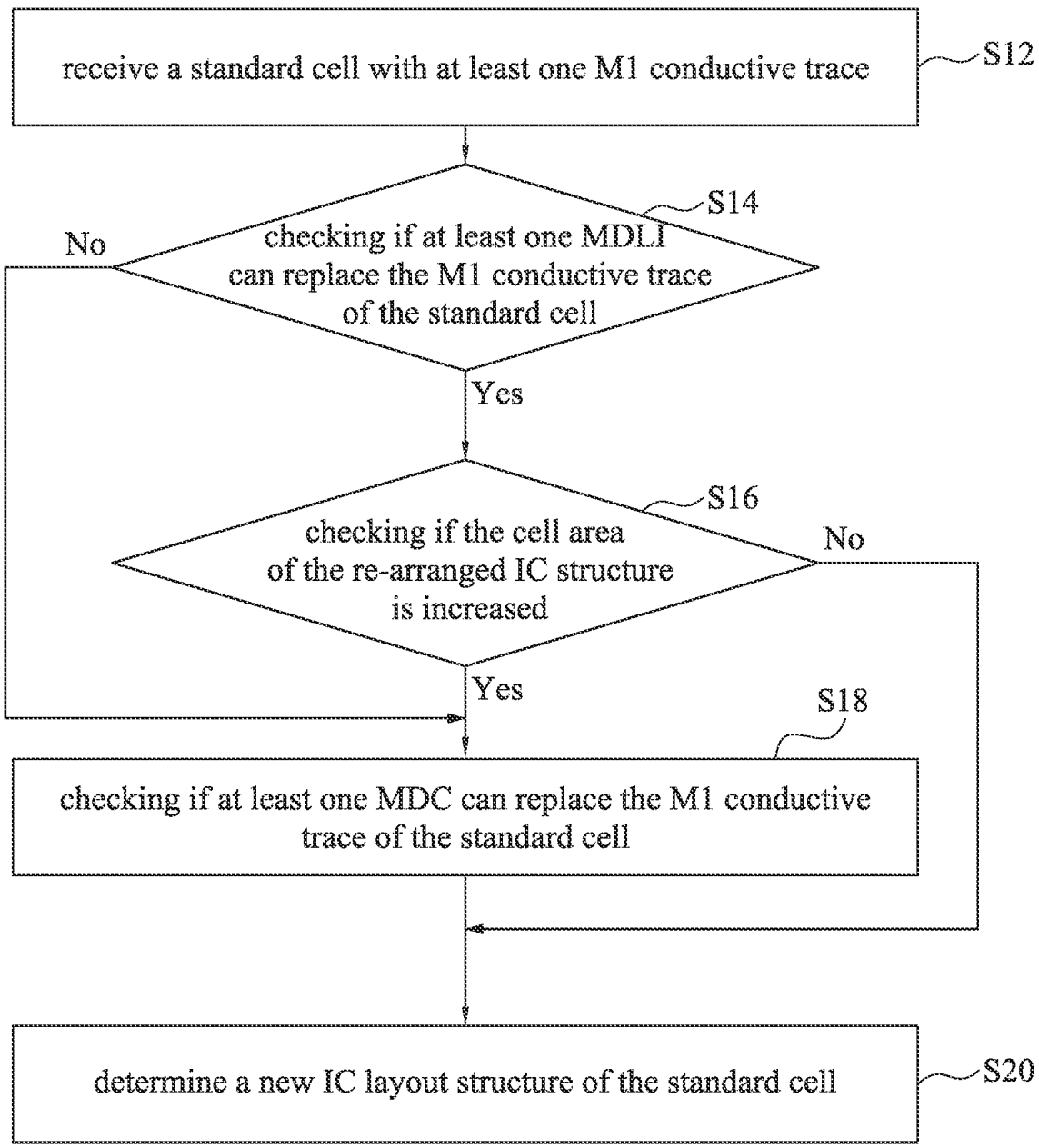
FIG. 21 is a flowchart of a method of designing an IC layout structure, in accordance with some embodiments of the present disclosure.

FIG. 21 is a flowchart of a method M10 of designing an IC layout structure, in accordance with some embodiments of the present disclosure. In some embodiments, the IC layout structure is based on the layout diagram 400, 500, 600, 700, 800, or 900 respectively in FIGS. 15A, 16A, 17A, 18A, 19A, and 20A. In some embodiments, designing the IC layout diagram is part of operating an IC manufacturing system as part of manufacturing an IC device, e.g., a memory circuit, logic device, processing device, signal processing circuit, or the like.

In some embodiments, some or all of method M10 is executed by a processor of a computer. In some embodiments, some or all of method M10 is executed by a processor 2302 of an IC device design system 2300, discussed below with respect to FIG. 23. Some or all of the operations of method M10 are capable of being performed as part of a design procedure performed in a design house.

In some embodiments, the operations of method M10 are performed in the order depicted in FIG. 21. In some embodiments, the operations of method M10 are performed simultaneously and/or in an order other than the order depicted in FIG. 21. In some embodiments, one or more operations are performed before, between, during, and/or after performing one or more operations of method M10.

At operation S12, receiving a standard cell with at least one M1 conductive trace (M1 pin). In some embodiments, the standard cell may be a single height standard cell as shown in FIGS. 15B, 16B, 17B, 18B, and 19B. In some other embodiments, the standard cell may be a double (or quad- or more) height standard cell as shown in FIG. 20B. FIGS. 22A-22E illustrate top views of different IC layout structures of the standard cell mentioned in method M10. It is noted that FIGS. 22A-22E illustrate simplified version of the IC layout structures for the purpose of illustrating the general spatial relationships between the various features. The standard cell in operation S12 may be a cell 1000A including a plurality of gates 1010, source/drain contacts 1020, and at least one M1 conductive trace 1030 over the gates 1010 and source/drain contacts 1020. The M1 conductive trace 1030 interconnects different semiconductor fins (or interconnects p-type and n-type source/drain segments). In some embodiments, the M1 conductive trace 1030 further crosses over at least one gate 1010, such that the M1 conductive trace 1030 may be referred to be a diagonal connector.

At operation S14, checking if at least one MDLI can replace the M1 conductive trace of the standard cell. For example, the source/drain segments of transistors in the standard cell may be re-arranged and using the MDLI(s) to interconnect the desired source/drain segments. If the MDLI(s) can not replace all of the M1 conductive trace(s), i.e., there is still at least one M1 conductive trace used in the standard cell, then checking if at least one MD contact (MDC) can replace the M1 conductive trace of the standard cell, as shown in operation S18. For example, in FIG. 22B, although the source/drain segments are re-arranged, the standard cell 1000B still includes an M0 conductive trace 1040 and a M1 conductive trace 1035 together functioning as the M1 conductive trace 1030 shown in FIG. 22A.

In operation S14, if the MDLI(s) can replace all of the M1 conductive trace(s), i.e., there is no M1 conductive trace used in the standard cell, then further checking if the cell area of the re-arranged IC structure is increased, as shown in operation S16. If the cell area is not increased as shown in FIG. 22C, then a new IC layout structure of the standard cell 1000C with the at least one MDLI 1050 is designed as shown in operation S20. However, if the cell area is increased as shown in the standard cell 1000D of FIG. 22D, then checking if at least one MDC can replace the M1 conductive trace of the standard cell as shown in operation S18.

In some embodiments, the operation S18 includes checking if the standard cell has at least one stacking transistors with an internal common source/drain. If yes, an isolation layer 1070 and an MDC 1080 can be formed above the shared source/drain of stacking transistors as shown in FIG. 22E. In some embodiments, the MDC 1080 can be applied to a two-stage cell, i.e., a cell including two circuits, and/or replace the diagonal connector 1030 shown in FIG. 22A. After the re-arranging, a new IC layout structure of the single height standard cell with the at least one MDC is determined as shown in operation S20.

Figure 23:
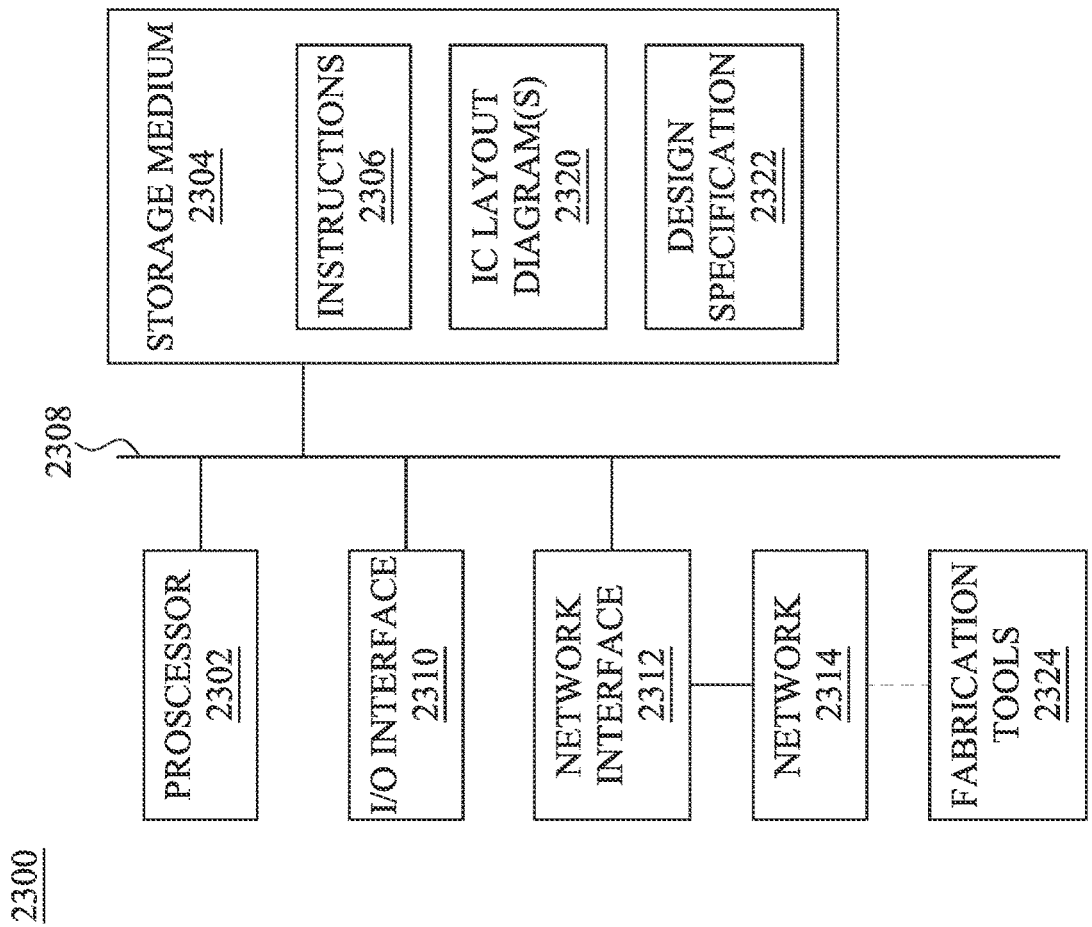
FIG. 23 is a block diagram of an IC device design system, in accordance with some embodiments of the present disclosure.

FIG. 23 is a block diagram of an IC device design system 2300, in accordance with some embodiments of the present disclosure. One or more operations of method M10 as discussed above with respect to FIG. 21, are implementable using the IC device design system 2300, in accordance with some embodiments.

In some embodiments, IC device design system 2300 is a computing device including a processor 2302 and a non-transitory computer-readable storage medium 2304. The non-transitory computer-readable storage medium 2304, amongst other things, is encoded with, i.e., stores, computer program codes, i.e., a set of executable instructions 2306. Execution of the instructions 2306 by the hardware processor 2302 represents (at least in part) an IC device design system which implements a portion or all of, e.g., method M10 discussed above with respect to FIG. 21 (hereinafter, the noted processes and/or methods).

The processor 2302 is electrically coupled to the non-transitory computer-readable storage medium 2304 via a bus 2308. The processor 2302 is also electrically coupled to an I/O interface 2310 by the bus 2308. A network interface 2312 is also electrically connected to the processor 2302 via bus 2308. The network interface 2312 is connected to a network 2314, so that the processor 2302 and the non-transitory, computer-readable storage medium 2304 are capable of being connected to external elements via network 2314. The processor 2302 is configured to execute the instructions 2306 encoded in the non-transitory computer-readable storage medium 2304 in order to cause the IC device design system 2300 to be usable for performing a portion or all of the noted processes and/or methods. In one or more embodiments, the processor 2302 is a central processing unit (CPU), a multi-processor, a distributed processing system, an application specific IC (ASIC), and/or a suitable processing unit.

In one or more embodiments, the non-transitory computer-readable storage medium 2304 is an electronic, magnetic, optical, electromagnetic, infrared, and/or a semiconductor system (or apparatus or device). For example, the non-transitory computer-readable storage medium 2304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 2304 includes a compact disk-read only memory (CD-ROM), a compact disk-read/write (CD-R/W), and/or a digital video disc (DVD).

In one or more embodiments, the non-transitory computer-readable storage medium 2304 stores the instructions 2306 configured to cause the IC device design system 2300 to be usable for performing a portion or all of the noted processes and/or methods. In one or more embodiments, the non-transitory computer-readable storage medium 2304 also stores information which facilitates performing a portion or all of the noted processes and/or methods. In various embodiments, the non-transitory computer-readable storage medium 2304 stores one or a combination of at least one IC layout design diagram 2320 or at least one design specification 2322, each discussed above with respect to FIG. 21.

The IC device design system 2300 includes I/O interface 2310. The I/O interface 2310 is coupled to external circuitry. In various embodiments, the I/O interface 2310 includes one or a combination of a keyboard, keypad, mouse, trackball, trackpad, display, touchscreen, and/or cursor direction keys for communicating information and commands to and/or from the processor 2302.

The IC device design system 2300 also includes network interface 2312 coupled to the processor 2302. The network interface 2312 allows IC device design system 2300 to communicate with network 2314, to which one or more other computer systems are connected. The network interface 2312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 2300.

The IC device design system 2300 is configured to receive information through the I/O interface 2310. The information received through the I/O interface 2310 includes one or a combination of at least one design rule instructions, at least one set of criteria, at least one design rule, at least one DRM, and/or other parameters for processing by processor 2302. The information is transferred to the processor 2302 via the bus 2308. The IC device design system 2300 is configured to transmit and/or receive information related to a user interface through the I/O interface 2310.

The IC device design system 2300 also includes one or more fabrication tools 2324 coupled to the network 2314. The fabrication tools 2324 are configured to fabricate the IC layout designed by the IC device design system 2300. The fabrication tools 2324 includes deposition tools (e.g., chemical vapor deposition (CVD) apparatuses, physical vapor deposition (PVD) apparatuses), etching tools (e.g., dry etching apparatuses, wet etching apparatuses), planarization tools (e.g., CMP apparatuses), or other tools used in fabricating IC devices including the IC layout designed by the IC device design system 2300.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method M10 of FIG. 21, the IC device design system 2300 and a non-transitory computer-readable storage medium, e.g., non-transitory computer-readable storage medium 2304, enable the benefits discussed above with respect to method M10 of FIG. 21.

Figure 24:
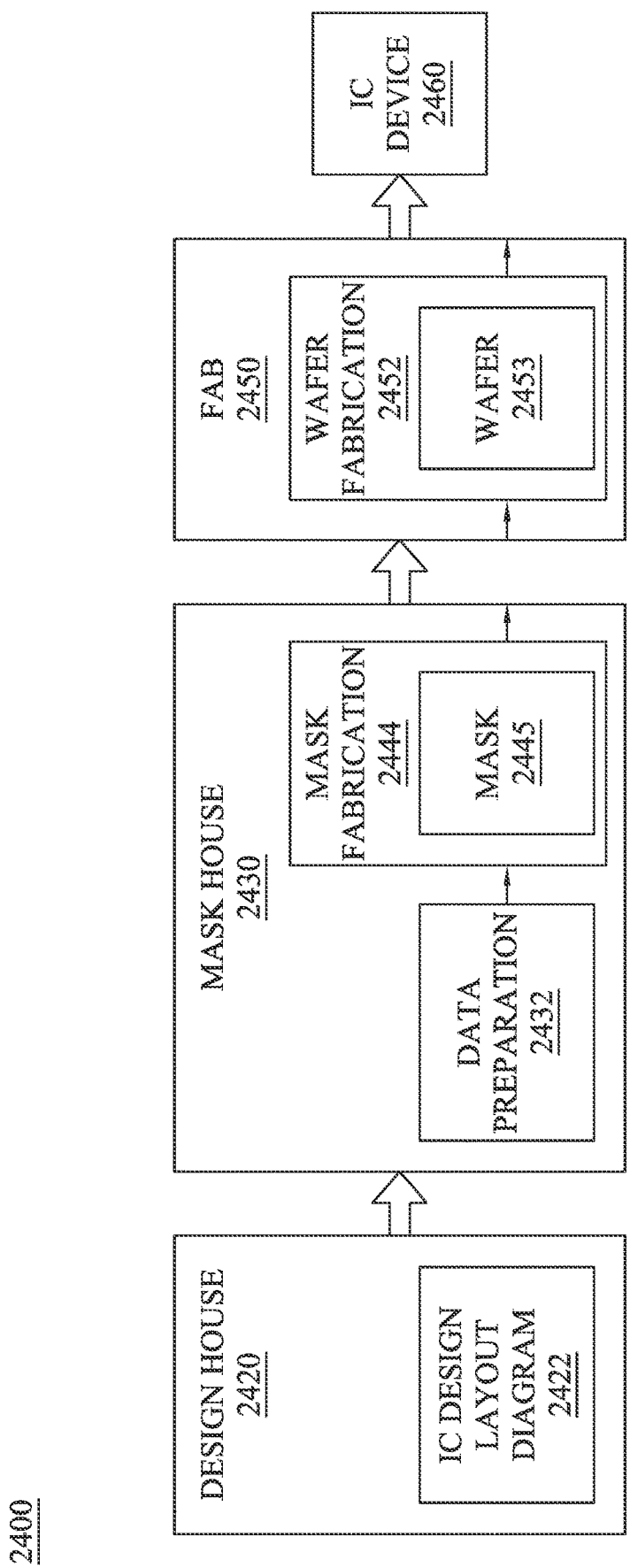
FIG. 24 is a block diagram of an IC manufacturing system, and an IC manufacturing flow associated therewith, in accordance with some embodiments of the present disclosure.

FIG. 24 is a block diagram of IC manufacturing system 2400, and an IC manufacturing flow associated therewith, in accordance with some embodiments of the present disclosure. In some embodiments, based on a layout design, at least one of (A) one or more semiconductor masks or (B) at least one component in a layer of a semiconductor IC is fabricated using the IC manufacturing system 2400.

In FIG. 24, the IC manufacturing system 2400 includes entities, such as a design house 2420, a mask house 2430, and an IC manufacturer/fabricator ("fab") 2450, that interact with one another in the design, development, and manufacturing cycles and/or services related to manufacturing an IC device 2460. The entities in system 2400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2420, mask house 2430, and IC fab 2450 is owned by a single larger company. In some embodiments, two or more of design house 2420, mask house 2430, and IC fab 2450 coexist in a common facility and use common resources.

Design house (or design team) 2420 generates an IC design layout diagram (or design) 2422 based on method M10 of FIG. 21 and discussed above with respect to FIGS. 1-20D. IC design layout diagram 2422 includes various geometrical patterns that correspond to patterns of metal, oxide, or semiconductor layers that make up the various components of IC device 2460 to be fabricated. The various layers combine to form various IC features. For example, a portion of IC design layout diagram 2422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 2420 implements a proper design procedure including method M10 of FIG. 21 and discussed above with respect to FIGS. 1-20D, to form IC design layout diagram 2422. The design procedure includes one or more of logic design, physical design or place and route. IC design layout diagram 2422 is presented in one or more data files having information of the geometrical patterns. For example, IC design layout diagram 2422 can be expressed in a GDSII file format or DFII file format.

Mask house 2430 includes data preparation 2432 and mask fabrication 2444. Mask house 2430 uses IC design layout diagram 2422 to manufacture one or more masks 2445 to be used for fabricating the various layers of IC device 2460 according to IC design layout diagram 2422. Mask house 2430 performs mask data preparation 2432, where IC design layout diagram 2422 is translated into a representative data file ("RDF"). Mask data preparation 2432 provides the RDF to mask fabrication 2444. Mask fabrication 2444 includes a mask writer. A mask writer converts the RDF to an image on a substrate, such as a mask (reticle) 2445 or a semiconductor wafer 2453. The design layout diagram 2422 is manipulated by mask data preparation 2432 to comply with particular characteristics of the mask writer and/or requirements of IC fab 2450. In FIG. 24, mask data preparation 2432 and mask fabrication 2444 are illustrated as separate elements. In some embodiments, mask data preparation 2432 and mask fabrication 2444 are collectively referred to as mask data preparation.

In some embodiments, mask data preparation 2432 includes optical proximity correction (OPC) which uses lithography enhancement techniques to compensate for image errors, such as those that can arise from diffraction, interference, other process effects and the like. OPC adjusts IC design layout diagram 2422. In some embodiments, mask data preparation 2432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2432 includes a mask rule checker (MRC) that checks the IC design layout diagram 2422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2422 to compensate for limitations during mask fabrication 2444, which may undo part of the modifications performed by OPC in order to meet mask creation rules.

In some embodiments, mask data preparation 2432 includes lithography process checking (LPC) that simulates processing that will be implemented by IC fab 2450 to fabricate IC device 2460. LPC simulates this processing based on IC design layout diagram 2422 to create a simulated manufactured device, such as IC device 2460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2422.

It should be understood that the above description of mask data preparation 2432 has been simplified for the purposes of clarity. In some embodiments, data preparation 2432 includes additional features such as a logic operation (LOP) to modify the IC design layout diagram 2422 according to manufacturing rules. Additionally, the processes applied to IC design layout diagram 2422 during data preparation 2432 may be executed in a variety of different orders.

After mask data preparation 2432 and during mask fabrication 2444, a mask 2445 or a group of masks 2445 are fabricated based on the modified IC design layout diagram 2422. In some embodiments, mask fabrication 2444 includes performing one or more lithographic exposures based on IC design layout diagram 2422. In some embodiments, an electron-beam (e-beam) or a mechanism of multiple e-beams is used to form a pattern on a mask (photomask or reticle) 2445 based on the modified IC design layout diagram 2422. Mask 2445 can be formed in various technologies. In some embodiments, mask 2445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2445 includes a transparent substrate (e.g., fused quartz) and an opaque material (e.g., chromium) coated in the opaque regions of the binary mask. In another example, mask 2445 is formed using a phase shift technology. In a phase shift mask (PSM) version of mask 2445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2444 is used in a variety of processes. For example, such a mask(s) is used in an ion implantation process to form various doped regions in semiconductor wafer 2453, in an etching process to form various etching regions in semiconductor wafer 2453, and/or in other suitable processes.

IC fab 2450 includes wafer fabrication 2452. IC fab 2450 is an IC fabrication business that includes one or more manufacturing facilities for the fabrication of a variety of different IC products. In some embodiments, IC Fab 2450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2450 uses mask(s) 2445 fabricated by mask house 2430 to fabricate IC device 2460. Thus, IC fab 2450 at least indirectly uses IC design layout diagram 2422 to fabricate IC device 2460. In some embodiments, semiconductor wafer 2453 is fabricated by IC fab 2450 using mask(s) 2445 to form IC device 2460. In some embodiments, the IC fabrication includes performing one or more lithographic exposures based at least indirectly on IC design layout diagram 2422. Semiconductor wafer 2453 includes a silicon substrate or other proper substrate having material layers formed thereon. Semiconductor wafer 2453 further includes one or more of various doped regions, dielectric features, multi-level interconnects, and the like (formed at subsequent manufacturing steps).

According to some embodiments, a device includes a first transistor, a second transistor, and a contact. The first transistor includes a first source/drain, a second source/drain, and a first gate between the first and second source/drains. The second transistor includes a third source/drain, a fourth source/drain, and a second gate between the third and fourth source/drains. The contact covers the first source/drain of the first transistor and the third source/drain of the second transistor. The contact is electrically connected to the first source/drain of the first transistor and electrically isolated from the third source/drain of the second transistor.

According to some embodiments, a device includes a first transistor, a second transistor, a third transistor, an isolation layer, and a contact. The first transistor includes a first source/drain, a second source/drain, and a first gate between the first and second source/drains. The second transistor includes the second source/drain, a third source/drain, and a second gate between the second and third source/drains. The third transistor includes a fourth source/drain, a fifth source/drain, and a third gate between the fourth and fifth source/drains. The isolation layer covers the second source/drain of the first and second transistors. The contact is over and in contact with the fifth source/drain of the third transistor and the isolation layer.

According to some embodiments, a method for manufacturing a device includes forming a first transistor and a second transistor over a substrate. The first transistor comprises a first source/drain, a second source/drain, and a first gate between the first and second source/drains, and the second transistor comprises a third source/drain, a fourth source/drain, and a second gate between the third and fourth source/drains. An isolation layer is formed to cover the second source/drain of the first transistor. A contact is formed on and in contact the fourth source/drain of the second transistor and the isolation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first transistor and a second transistor over a substrate, wherein the first transistor comprises a first source/drain, a second source/drain, a first gate between the first and second source/drains, and a gate spacer surrounding the first gate, and the second transistor comprises a third source/drain, a fourth source/drain, and a second gate between the third and fourth source/drains;
forming an isolation layer to cover the second source/drain of the first transistor, wherein the isolation layer is spaced apart from the first gate; and
forming a first source/drain contact on and in contact with the fourth source/drain of the second transistor and the isolation layer, wherein the first source/drain contact has a top surface substantially coplanar with a top surface of the gate spacer.

2. The method of claim 1, further comprising:
forming a second source/drain contact over the first source/drain of the first transistor when forming the first source/drain contact on and in contact with the fourth source/drain of the second transistor and the isolation layer.

3. The method of claim 2, further comprising:
forming a conductive trace interconnecting the first source/drain contact and the second source/drain contact.

4. The method of claim 1, further comprising:
forming a conductive trace interconnecting the first source/drain contact and the first gate of the first transistor, wherein the conductive trace and the first gate extend in different directions.

5. The method of claim 1, wherein forming the isolation layer is such that the isolation layer is in contact with a sidewall of the gate spacer.

6. A method, comprising:
forming a first transistor and a second transistor over a substrate, wherein the first transistor comprises a gate and a gate spacer on a sidewall of the gate;
forming an isolation layer over a source/drain epitaxial layer of the first transistor and spaced apart from a source/drain epitaxial layer of the second transistor, the isolation layer non-overlapping with the gate of the first transistor; and
depositing a source/drain contact over the isolation layer and the source/drain epitaxial layer of the second transistor, wherein a first portion of the source/drain contact directly above the source/drain epitaxial layer of the second transistor has a thickness greater than a second portion of the source/drain contact directly above the isolation layer in a cross-sectional view, and the source/drain contact extends in a direction substantially the same as an extension direction of the gate of the first transistor in a top view, wherein the source/drain contact has a top surface substantially level with a top surface of the gate spacer.

7. The method of claim 6, wherein the first transistor further comprises a capping layer over the gate of the first transistor, and the top surface of the source/drain contact is substantially coplanar with a top surface of the capping layer.

8. The method of claim 6, further comprising:
forming an interlayer dielectric layer over the isolation layer after forming the isolation layer; and
removing the interlayer dielectric layer prior to depositing the source/drain contact.

9. The method of claim 6, further comprising depositing an interlayer dielectric layer over the source/drain contact such that the interlayer dielectric layer is in contact with the source/drain contact and the gate spacer of the first transistor.

10. The method of claim 9, further comprising:
forming a first via in the interlayer dielectric layer and electrically connected to the source/drain contact; and
forming a second via in the interlayer dielectric layer and electrically connected to the gate of the first transistor.

11. The method of claim 10, further comprising:
forming a conductive line over the interlayer dielectric layer and that interconnects the first via and the second via.

12. The method of claim 10, wherein the first via is formed directly above the isolation layer.

13. A method, comprising:
forming a first fin and a second fin over a substrate;
forming an isolation structure to surround a bottom portion of the first fin and a bottom portion of the second fin;
forming a gate structure over the first fin, the second fin, and the isolation structure;
epitaxially growing a first source/drain epitaxial structure over the first fin;
epitaxially growing a second source/drain epitaxial structure over the second fin;
depositing a first interlayer dielectric layer over the substrate to surround the gate structure;
forming an isolation layer to cover the first source/drain epitaxial structure, wherein forming the isolation layer comprises:
forming an opening in the first interlayer dielectric layer to expose the first source/drain epitaxial structure while the first interlayer dielectric layer covers the second source/drain epitaxial structure;
depositing an isolation material in the opening; and
etching back the isolation material to form the isolation layer; and
depositing a contact on the second source/drain epitaxial structure and the isolation layer, wherein the contact is in contact with the isolation structure.

14. The method of claim 13, further comprising forming a fin sidewall spacer on a sidewall of the first fin prior to epitaxially growing the first source/drain epitaxial structure over the first fin.

15. The method of claim 14, wherein forming the isolation layer is such that the isolation layer is in contact with the fin sidewall spacer.

16. The method of claim 13, further comprising:
filling the opening of the first interlayer dielectric layer with a second interlayer dielectric layer after etching back the isolation material.

17. The method of claim 1, wherein the isolation layer is in contact with the second source/drain of the first transistor.

18. The method of claim 1, wherein the first source/drain contact is in contact with an entirety of a top surface of the isolation layer.

19. The method of claim 1, wherein the isolation layer has a bottommost surface lower than a topmost surface of the second source/drain of the first transistor.

20. The method of claim 6, wherein the isolation layer has a top surface entirely in contact with the source/drain contact.

\* \* \* \* \*